United States Patent
King et al.

(10) Patent No.: US 7,065,599 B2
(45) Date of Patent: Jun. 20, 2006

(54) MULTIPROCESSOR SYSTEMS

(75) Inventors: James E. King, Wokingham (GB); Martin P. Mayhead, Hindhead (GB); Paul J. Garnett, Camberley (GB)

(73) Assignee: Sun Microsystems, Inc., Santa Clara, CA (US)

(*) Notice: Subject to any disclaimer, the term of this patent is extended or adjusted under 35 U.S.C. 154(b) by 526 days.

(21) Appl. No.: 10/215,665

(22) Filed: Aug. 9, 2002

(65) Prior Publication Data

US 2003/0101304 A1 May 29, 2003

Related U.S. Application Data

(63) Continuation-in-part of application No. 10/171,822, filed on Jun. 14, 2002.

(60) Provisional application No. 60/366,430, filed on Mar. 21, 2002, provisional application No. 60/311,505, filed on Aug. 10, 2001.

(51) Int. Cl.
*G06F 13/00* (2006.01)

(52) U.S. Cl. ............... 710/301; 710/302; 710/305; 709/220

(58) Field of Classification Search ............ 710/100, 710/301, 302
See application file for complete search history.

(56) References Cited

U.S. PATENT DOCUMENTS

| 5,931,938 | A | * | 8/1999 | Drogichen et al. ........... 712/15 |
| 5,940,266 | A | * | 8/1999 | Hamilton et al. ........... 361/695 |
| 6,583,989 | B1 | * | 6/2003 | Guyer et al. ................ 361/724 |
| 6,647,453 | B1 | * | 11/2003 | Duncan et al. ............. 710/306 |
| 6,665,179 | B1 | | 12/2003 | Chou |
| 6,725,317 | B1 | * | 4/2004 | Bouchier et al. ........... 710/312 |
| 2002/0198608 | A1 | * | 12/2002 | Smith ......................... 700/24 |
| 2003/0097428 | A1 | * | 5/2003 | Afkhami et al. ............ 709/220 |
| 2003/0112582 | A1 | * | 6/2003 | Sanders et al. ............. 361/600 |
| 2003/0140285 | A1 | * | 7/2003 | Wilkie ........................ 714/48 |
| 2004/0093455 | A1 | * | 5/2004 | Duncan et al. ............. 710/310 |

* cited by examiner

*Primary Examiner*—Rehana Perveen
*Assistant Examiner*—Nimesh G. Patel
(74) *Attorney, Agent, or Firm*—Meyertons Hood Kivlin Kowert & Goetzel, P.C.; B. Noël Kivlin

(57) ABSTRACT

A server blade is provided with an enclosure. The server blade can be provided with a plurality of processors in the enclosure. The server blade can be configured as a field replaceable unit removably receivable in a carrier of a modular computer system, for example a high density blade server system. The enclosure for such a multiprocessor server blade can be larger that a standard enclosure for a single processor server blade. The carrier can be configured to receive such an oversized server blade enclosure as well as a standard enclosure.

36 Claims, 28 Drawing Sheets

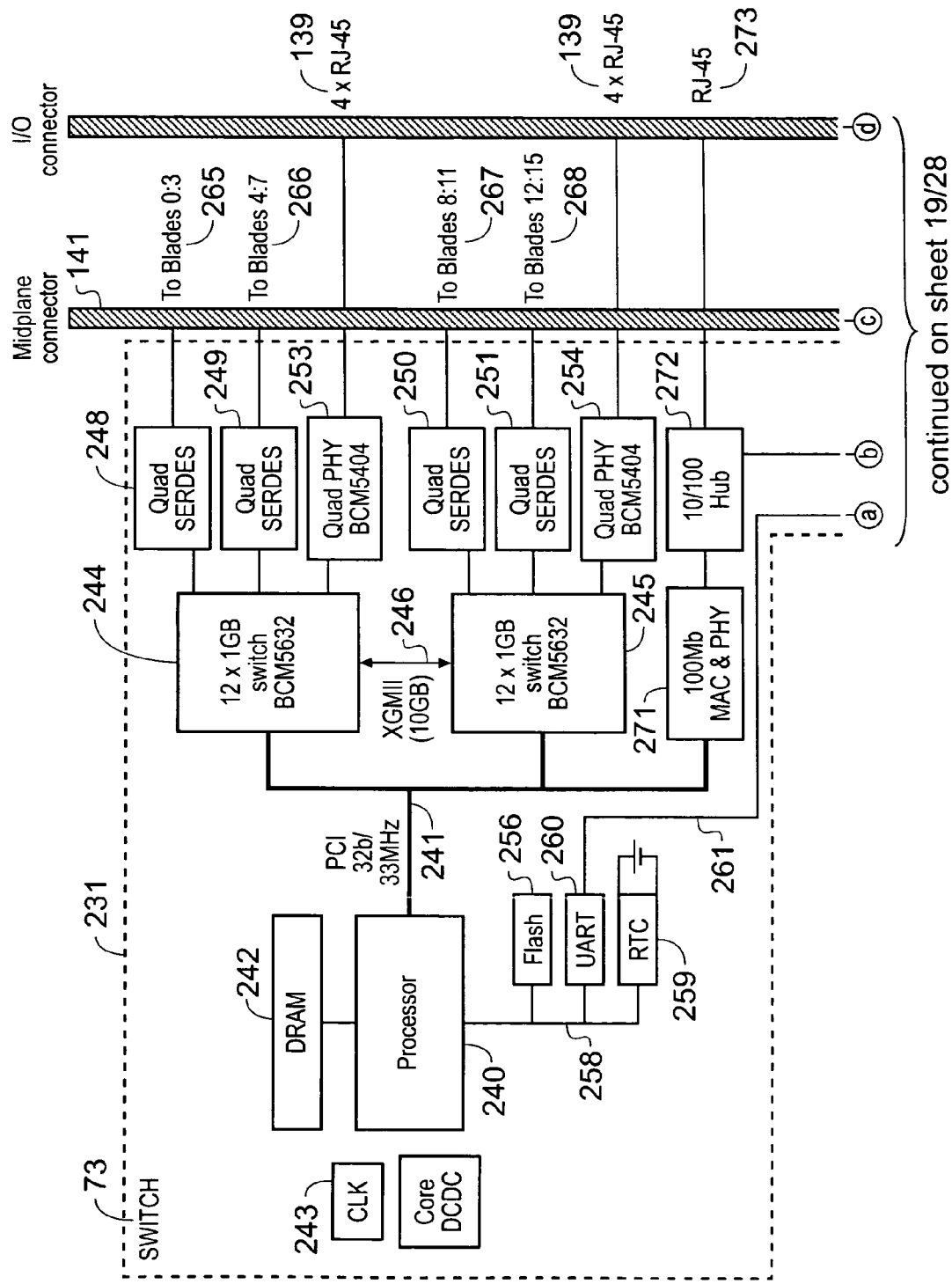

MULTIPROCESSOR SYSTEMS

This application is a continuation-in-part of U.S. patent application Ser. No. 10/171,822, filed on Jun. 14, 2002, which claims the benefit of provisional application No. 60/311,505, filed on Aug. 10, 2001, and provisional application No. 60/366,430, filed on Mar. 21, 2002, claimed under 35 U.S.C. §§ 119(a)–(e).

BACKGROUND OF THE INVENTION

The present invention relates to computer systems, in particular to computing system modules for multi-processor systems, for example multi-processor server systems.

One application for the present invention relates to high density computer systems, for example, computer server systems for telecommunications applications. In telecommunications applications, it is important to provide high reliability and high capacity of operation. Various approaches have bee n taken to providing such high-performance, high reliability systems. Typically such systems are designed around providing redundant resources so that if one component of the system develops a fault, the system remains operational using the redundant resources. Fault tolerance can also be achieved, for example, with multiprocessor systems that provide redundancy through dynamic, e.g., software-controlled, task distribution. High density systems are typically rack mountable, with one or more processor systems occupying a shelf in the rack. The trend in recent times is to make the computers with smaller form factors. This means that more computers can be located in a rack. This has the advantage of increasing the processing density within the racks, and also the advantage of reducing the distance between the computer systems.

The present invention relates to the provision of volume efficient server space in a higher density computer system.

SUMMARY OF THE INVENTION

An aspect of the present invention provides a server blade having an enclosure. Within the enclosure, a plurality of processors are provided, the processors being operable to provide information processing in the server bade. The server blade can be configured as a field replaceable unit removably receivable in a carrier of a modular computer system.

Providing an enclosed multiprocessor server blade means that high processing capacity can be provided in a server blade that is robust and easy to handle. The enclosure protects the inner workings of the server blade from the outside environment and vice versa. The enclosure further enables a user to remove and/or to insert the server blade in a safe and reliable manner without requiring the services of a skilled technician.

Information signal interfaces can be provided that are accessible externally to the enclosure to enable the passage of information signals to and from the processors in the server blade. A service controller can be provided in the controller to provide system management functions for the server blade, the service processor being connected to at least one management signal connection accessible externally to the processor.

Another aspect of the invention provides a carrier providing a plurality of information processing cartridge receiving locations, and at least one server blade removably receivable therein as a field replaceable unit, the server blade including an enclosure and, in the enclosure, a plurality of processors.

A further aspect of the invention provides a server blade having an enclosure that encloses a processor subsystem. The processor can include a plurality of processor sockets. The server blade can be operable to perform information processing when at least one processor is received in a socket and can be configured as a field replaceable unit removably receivable a carrier of a blade server system.

A further aspect of the invention provides a blade server system that includes such a carrier.

Another aspect of the present invention provides a server blade configured as a field replaceable unit removably receivable in a carrier of a modular computer system, for example a shelf of a blade server system. The server blade includes a plurality of processors (e.g, two or more processors) operable to perform information processing in the server blade, the processors being provided with an inter-processor interconnect.

The provision of the inter-processor interconnect to directly interconnect the processors enables the processors to be operable as a cluster in the server blade, which in turn enables a high reliability server blade with high availability and fast failover to be provided in a flexible and cost effective manner.

Each processor can be configured as a separate domain, the interconnect interconnecting the respective domains. Each processor can be provided with its own local memory. Each processor can be provided with its own respective IO. For example, each processor can be connected to a respective bus bridge. Each bus bridge can be connected via a respective bus to a respective information signal interface to provide an interface to an information signal connection accessible externally to the enclosure. Each bus bridge can be connected via a respective bus to a respective further bus bridge, the further bus bridge being connected to a respective storage device. The further bus bridge can be connected to a service controller to provide system management functions for the server blade. A common service controller can be connected in parallel to each of the further bus bridges. The service controller can be connected to at least one management signal connection accessible externally to the processor and can provide console routing for console packets to respective processor domains.

Another aspect of the invention provides an information processing module configured as a field replaceable unit removably receivable in a carrier of a modular computer system. The information processing module can include a plurality of processors operable to perform information processing in the module. The processors can be configured as a processor cluster within the information processing module.

A further aspect of the invention provides a carrier providing a plurality of information processing module receiving locations, and at least one information processing module as set out above removably receivable therein as a field replaceable unit.

Another aspect of the invention provides a blade server system comprising a carrier providing a plurality of blade receiving locations, and at least one server blade removably receivable therein as a field replaceable unit.

Another aspect of the present invention provides a server blade configured as a field replaceable unit removably receivable in a carrier of a modular computer system. The server blade can be selectively configurable to provide a number of information processing domains selected to provide one, two or more information processing domains.

By enabling selectable configuration of a number of domains in a server blade, a generic server blade can be configured to provide varied processing tasks within a modular system. This enhances the flexibility and effectiveness of a modular blade system. For example, economies of scale can be achieved by providing a generic server blade. Also, the configuration of a server blade can be modified to accommodate a customer's changing demands and requirements.

Each information processing domain can include a processor subsystem including at least one processor and memory. Each information processing domain can further include an IO subsystem. Each IO subsystem can include at least one bus bridge and at least one storage device. Each IO subsystem can include a respective information signal interface to provides an interface to an information signal connection accessible externally to the server blade.

The server blade can be provided with a plurality of processor sockets that can selectively be populated to configure one, two or more domains. Alternatively, or in addition, sockets can be provided on a motherboard for one, two or more daughter cards, where each daughter card carries at least a processor subsystem including at least one processor and memory. The processors can thus be configured as multiple symmetric processors.

The server blade can include one or more service controllers to provide system management functions for the server blade. The service controller(s) can be operable to provide console routing for console packets to respective processor domains. The service processors can also be responsible for configuring the number of processor domains and for reporting this to other components of the modular computer system.

Another aspect of the invention provides an information processing module configured as a field replaceable unit removably receivable in a carrier of a modular computer system. The information processing module can be selectively configurable to provide a number of one, two, or possibly more information processing domains.

A further aspect of the invention provides a carrier providing a plurality of information processing module receiving locations, and at least one information processing module as set out above removably receivable therein as a field replaceable unit.

Another aspect of the invention provides blade server system comprising a carrier providing a plurality of blade receiving locations, and at least one server blade as set out above removably receivable therein as a field replaceable unit.

Further aspects and advantages of the invention will become apparent from the following description of particular embodiments.

BRIEF DESCRIPTION OF THE DRAWINGS

Embodiments of the present invention will be described hereinafter, by way of example only, with reference to the accompanying drawings in which like reference signs relate to like elements and in which.

Figure 1:
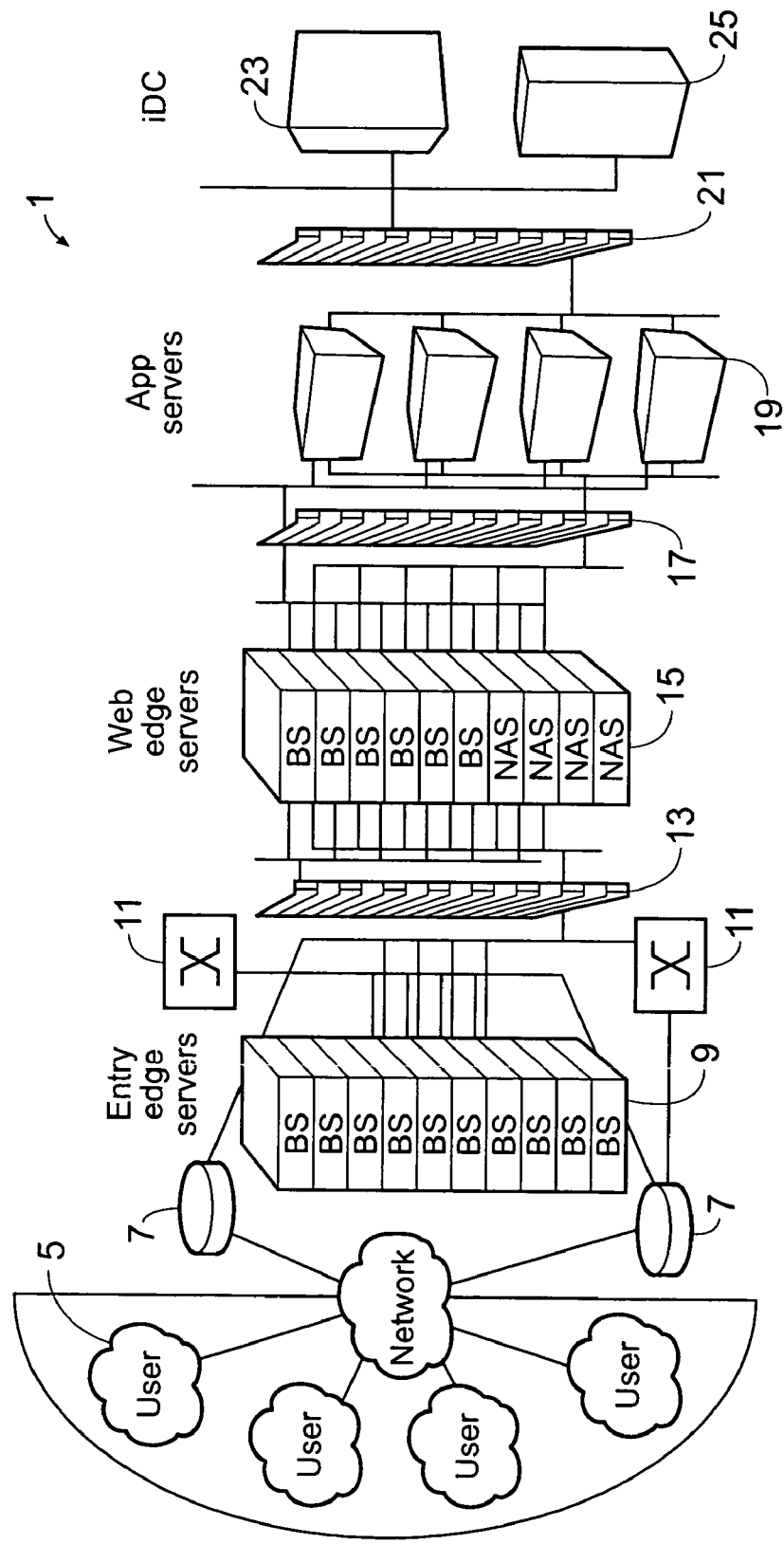
FIG. 1 is a schematic representation of an architecture of a multiprocessor system for supporting a web site.

While the invention is susceptible to various modifications and alterative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DESCRIPTION OF PARTICULAR EMBODIMENTS

Embodiments and examples are described hereafter by way of example only in the following with reference to the accompanying drawings.

Shown in FIG. 1 is an example of an application of a high capacity multiserver system 1 for implementing a network-connected web site such as, for example, an airline reservation system on the World Wide Web.

As shown in FIG. 1, an external network 3 (e.g., the Internet) for communicating with a user 5 can be connected to gateways 7 which can be connected to an entry edge server group 9 implemented by a web farm. The entry edge server group 9 forms an interface to the external network 3. The entry edge server group 9 can then be connected by switches 11 and a firewall 13 to a web edge server group 15 that can also be implemented as a web farm as shown in FIG. 1. The web edge server group 15 can serve to cache web pages that are readily accessible to users 5 accessing the system 1 from the external network 3, for example for checking flight times, etc. The web edge server group can comprise a number of blade server (BS) shelves and a number of network addressable storage (NAS) shelves for storing critical data. The web edge server group 15 can be further connected by a further firewall 17 to a plurality of application servers 19, which can be responsible for, for example, processing flight reservations. The application servers 19 can then be connected via a further firewall 21 to computer systems 23. 25, for example e-commerce services including financial services for receiving and processing payment for airline reservations.

As will be appreciated, the server system described above with reference to FIG. 1 is only an example of a possible application for a multiprocessor server system. Multiprocessor server systems have many different applications and the present system is not limited to being applicable for use in only one or a limited number of such applications, rather multiprocessor server systems as described herein are operable for use in many different applications. A non-exhaustive list of such alternative applications includes: e-commerce web server systems; telecommunications network server systems; LAN application and file server systems and remote vehicle control systems.

Figure 2:
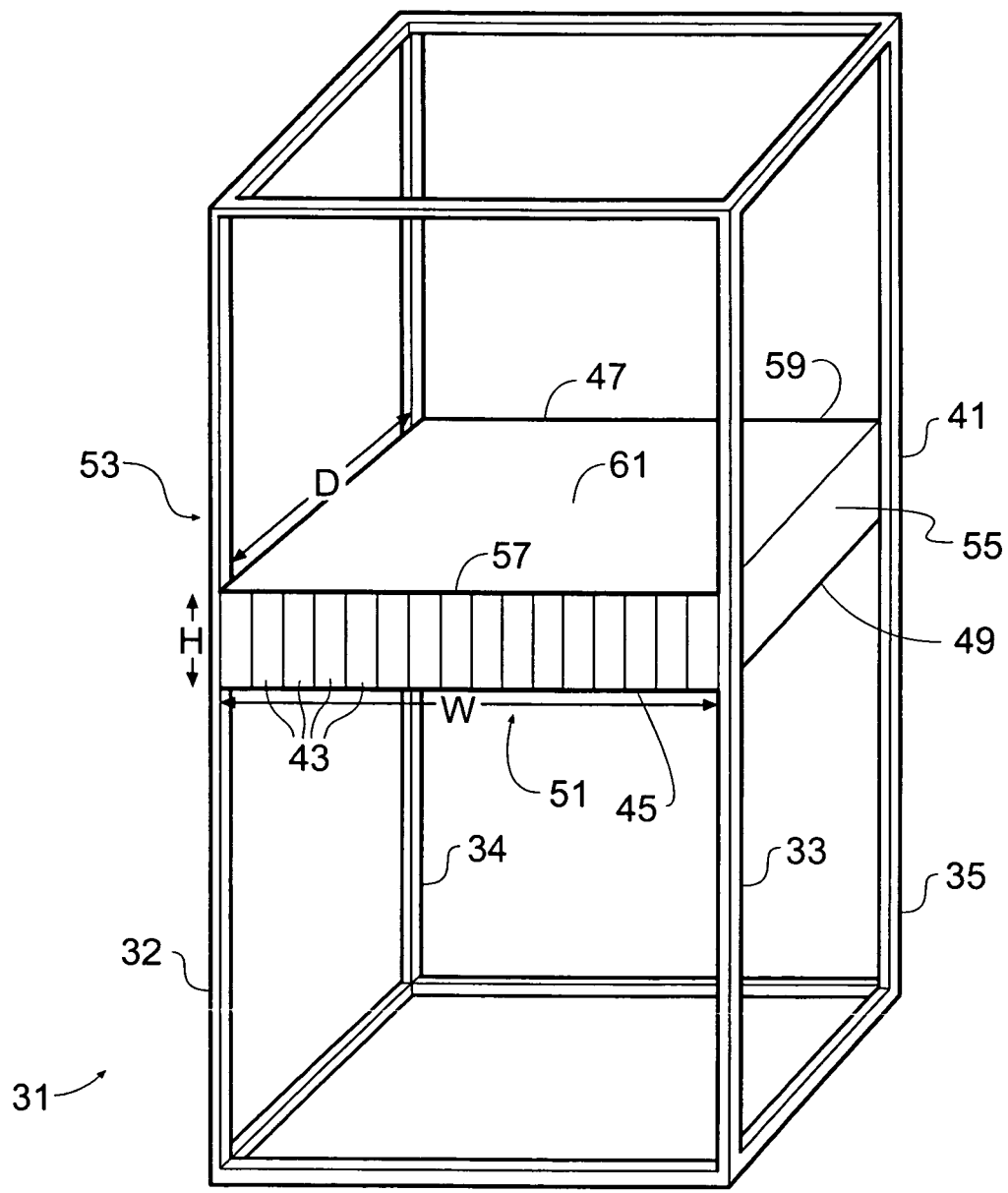
FIG. 2 is a schematic representation of a racking system incorporating an example of a carrier in the form of a rack-mountable shelf according to a first example.

With reference to FIG. 2, there is shown a schematic perspective representation of a rack system 31 as viewed from the front including left and right front uprights 32 and 33 and left and right rear uprights 34 and 35. The uprights can be formed with apertures for receiving shelf fixings (e.g., screws, bolts, clips, etc., for mounting brackets, slides, rails, etc.).

Also shown in FIG. 2 is an example of a blade server shelf 41 mounted in the rack system 31. The shelf 41 forms a carrier configured to carry a plurality of information processing cartridges 43 located side by side along the shelf.

The term "shelf" is used herein in a conventional way to describe a structure that is mountable in rack system 31 and is configured to carry one or more components to form at least a part of a rack-mountable system. In the present example, the shelf 41 is three-dimensional, having a height (H), width (W) and depth (D). In the present example, one dimension (hereinafter described as the height, H) is smaller than the other dimensions (hereinafter described as the depth, D, and the width, W) to facilitate mounting of the shelf within the rack system 31. It will be appreciated that although the width and depth are typically constrained by the dimensions of the racking system for which the shelf is designed, there is more freedom as regard the height, subject to taking account of any appropriate standards and packaging considerations.

Each of the information processing cartridges contains at least one processor. Each information processing cartridge in the present example is operable as a server. In the described examples, the information processing cartridges are configured as robust enclosed modules.

In the example to be described in more detail presently, the information processing cartridges, when aligned in the carrier shelf, look like rectangular slabs, or blades. Accordingly, an information processing cartridge can be described as a blade. The information processing cartridges 43 comprise information processing modules enclosed in an enclosure, or housing, so that the information processing modules have the form of cartridges. Also, as the information processing cartridges are to operate as computer servers in the example described in more detail presently, an information processing cartridge 43 can also be described as a server blade. Accordingly, in the context of this example, the terms module, cartridge and blade are used interchangeably.

The illustrated example of a shelf 41 is configured to carry sixteen information processing cartridges 43, each of which is removably mountable in a respective opening 45 in the front of the shelf, whereby the information processing cartridges can be inserted into and removed from the front of the shelf 41 without removing the shelf 41 from the rack system 31.

In the present example, the shelf 41 comprises a three-dimensional, generally rectangular, enclosure, or housing, 47 that is suitable for mounting in generic racking system including both 4-post and 2-post systems. It can be mounted on fixed rigid rack mounting ears and/or a simple slide/support system. The present example is designed for standard 19"-wide racking (1"=25.4 mm) as defined, for example, in the well-known IEC297 and EIA 310 specification standards with height corresponding to the so-called 3U (3 standard unit) height. For mounting such a 3U unit in such a 19"-wide racking system, with a depth of, say 25" or 30", the enclosure can be arranged with a height of up to about 130.5 mm, a width of up to about 445 mm and a depth, including all hardware and fascias, but excluding cable management, of up to about 635 mm, with the depth from the front-most point of a fascia to a rear I/O connector panel of a rear mounted Field Replaceable Unit (FRU) of about 610 mm. Of course, other examples designed for other racking systems could have different dimensions.

This example of a shelf 41 has a single enclosure, or housing, 47 that houses a number of modular units or subsystems, the majority of which are replaceable in the field and are therefore known as Field Replaceable Units (FRUs). These modular units include the information processing cartridges 43.

The shelf enclosure 47 can be fabricated from sheet material (e.g., from steel sheet) to form a chassis portion 49 that includes a base 51, two sides 53 and 55, a front 57 and a rear 59. The word "front" as used here is merely used as a label herein to refer to the face, or wall 57 of the enclosure that is located at the main access side of the rack system 31 in use when the shelf is mounted therein. Similarly, the words "rear" and "side" are merely used as labels herein to refer to the faces, or walls 59, 53 and 55 that, in use, are located at those respective positions when the shelf is mounted in the rack system 31.

The openings 45 can be formed in the front face 57 for receiving the information processing cartridges 43 and, as will be explained later, apertures can also be formed in the rear face 59 for receiving further FRUs. The enclosure can further include a removable top cover 61 that can be secured to the chassis portion 49 by suitable fastening (e.g., screws). The apertures in the front and rear faces 57 and 59 allow at least some of the FRUs to be inserted into and/or removed from the shelf enclosure 47 via the front or the rear thereof, as appropriate, without removing the shelf from the racking. Access to components mounted in the shelf that are not accessible via one of the apertures in the front 47 and rear 59 faces can be achieved by removing the shelf enclosure 47 from the racking system 31 and then removing the top cover 61 of the shelf enclosure 47.

Figure 3:
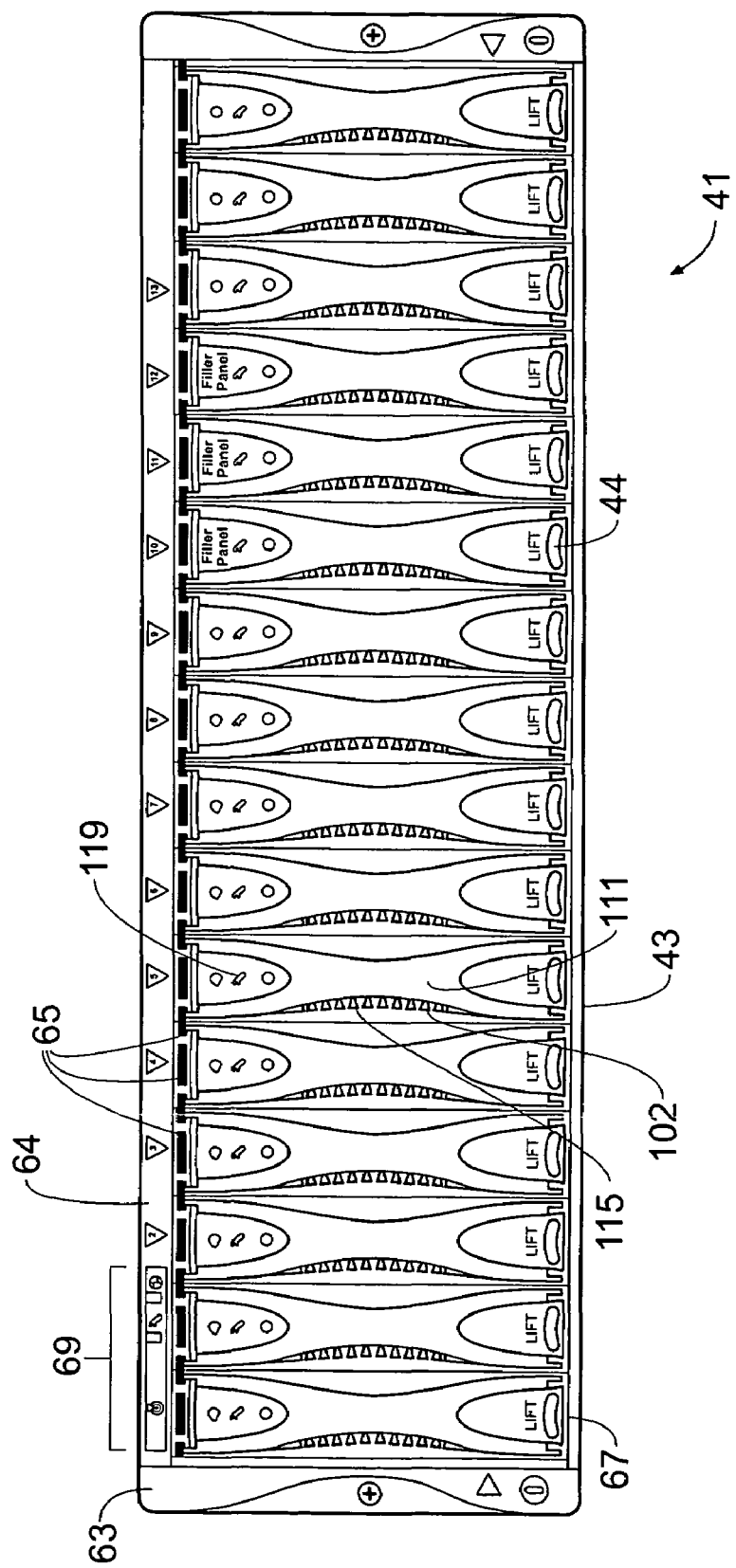
FIG. 3 is a front view of an example of a carrier in the form of a shelf of FIG. 2.

FIG. 3 is a front view of an example of a shelf 41 for a first example. A plastic front bezel 63 can be provided that fits on the front face 57 (shown in FIG. 2) of the chassis 49 of the shelf enclosure 47. The front bezel 63 can be formed as a unitary removable part that spans the whole width and height of the front of the shelf enclosure 47. The front bezel 63 could alternatively include a number of separate components, or mouldings. The front bezel can include a peripheral portion 64 that can provide areas for corporate and product branding marks, for identification and numbering for the information processing cartridge and for a bar code label (all not shown). One or more apertures 65 can be formed in the peripheral portion 64 of the bezel 63. The apertures 65 in the bezel can be arranged to align with one or more apertures (e.g. a slot (not shown in FIG. 3) in the front face of the chassis. In use, air can pass through the apertures 65 to flow into the shelf enclosure 47 to reach FRUs that are mounted in the shelf enclosure 47 through the rear face 59 thereof. Air flowing through the aperture 65 flows into a plenum chamber 66 (not shown in FIG. 3) to flow past the processing cartridges 43 to reach rear mounted FRUs. A central area 67 of the front bezel 63 can be open allowing access to the openings 45 in the front face 57 of the shelf enclosure 47 for insertion and removal of the information processing cartridges 43. Where no active module is mounted in a location for an information processing module, a blanking panel, or filler panel, such as the blanking panel 44, can be located in that location. LED indicators 69 can be mounted on a system indicator printed circuit board (not shown) behind a designated area of the bezel to provide an indication of system status via light guides incorporated into the bezel. A further system indicator board (also not shown) carrying LED indicators can be provided inside the shelf enclosure to be visible from the rear thereof.

As mentioned above, in the present example of a shelf, up to sixteen information processing cartridges 43 can be installed in respective openings 45 in the front face 57 thereof. The number of information processing cartridges 43 actually installed in any installation is dependent upon the system configuration required. Various features relating to the information processing cartridges 43 that are shown in FIG. 3 will be described later.

Figure 4:
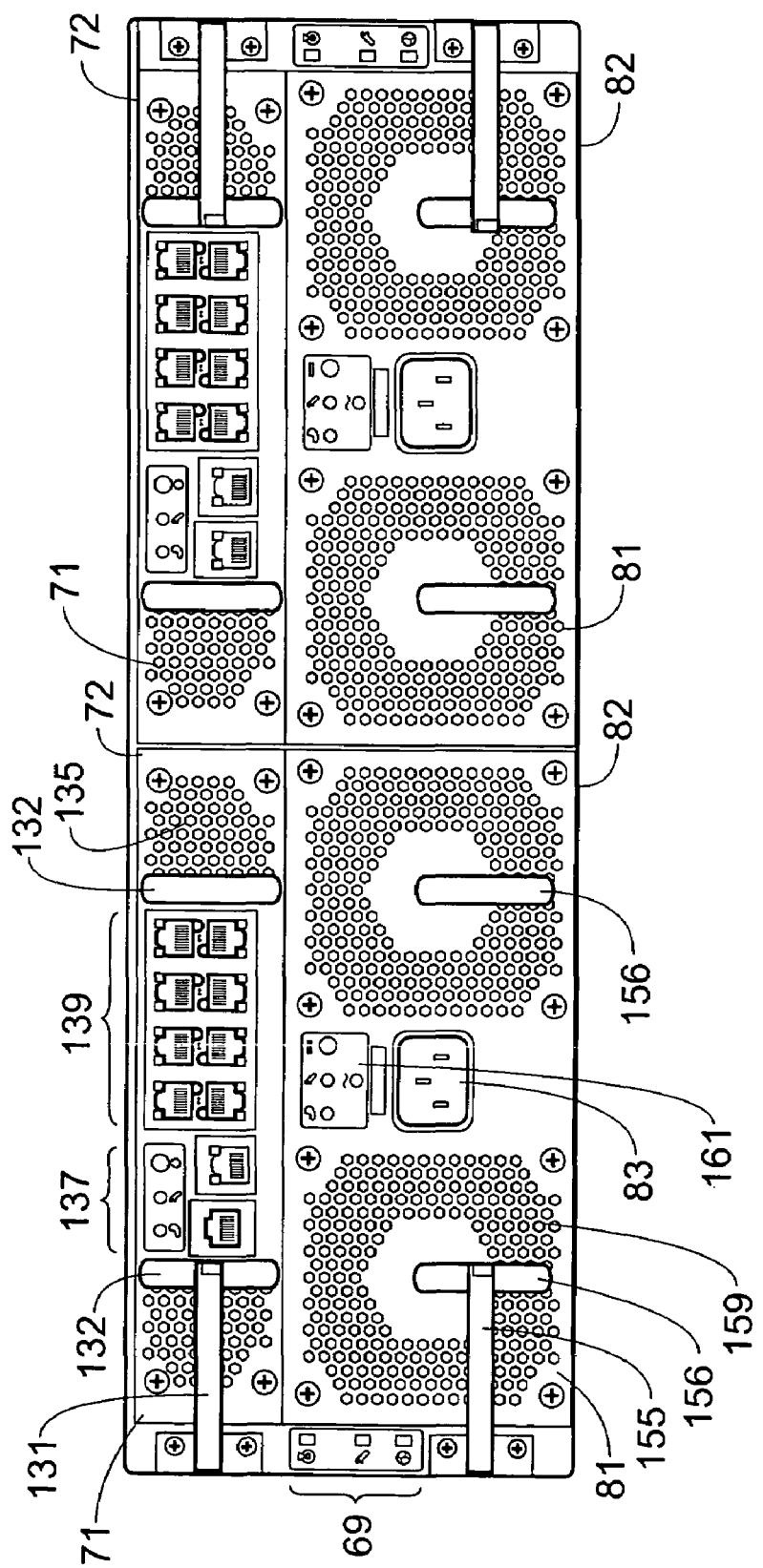
FIG. 4 is a rear view of an example of the shelf of FIG. 2.

FIG. 4 illustrates the rear of the shelf unit of FIGS. 2 and 3. This shows two different types of FRU 71 and 81 (4 units in total) that have been inserted into respective apertures 72 and 82 in the rear of the shelf enclosure 47. The FRUs shown in FIG. 4 include two Combined Switch and Service Processors (CSSPs) 71 and two Power Supply Units (PSUs) 81. Various features shown in FIG. 4 will be described later.

Before proceeding with a more detailed description of each of the FRUs 43, 71 and 81 introduced so far and of the construction of the shelf 41, there follows a brief description of an information processing cartridge 43, a CSSP 71 and a PSU 81 with reference to FIGS. 3, 4, 5, 6 and 7.

Figure 5A:
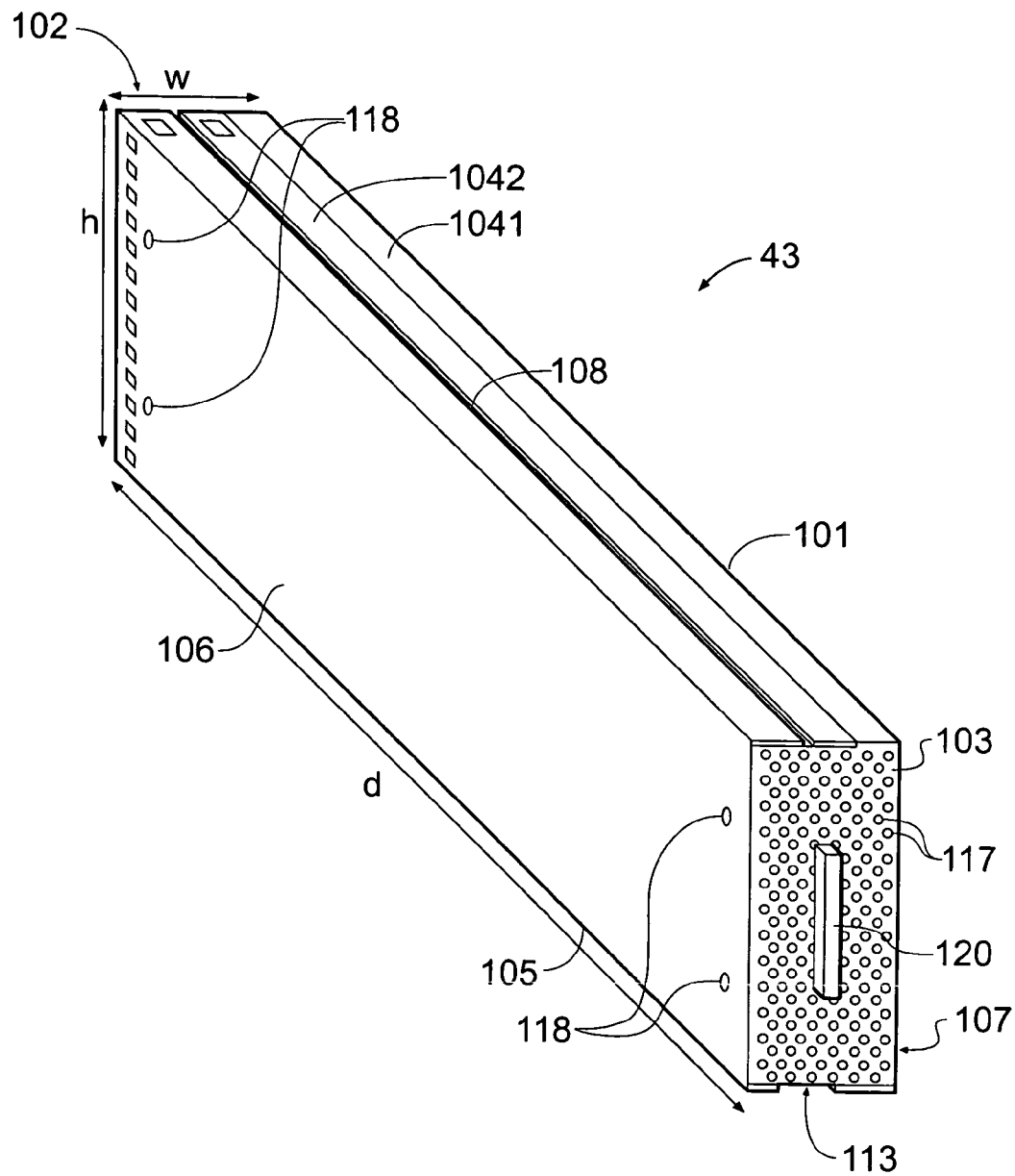
FIGS. 5A, 5B and 5C are schematic perspective views and a schematic exploded view respectively of an example of an information processing cartridge for mounting in the shelf of FIG. 2.
Figure 5B:
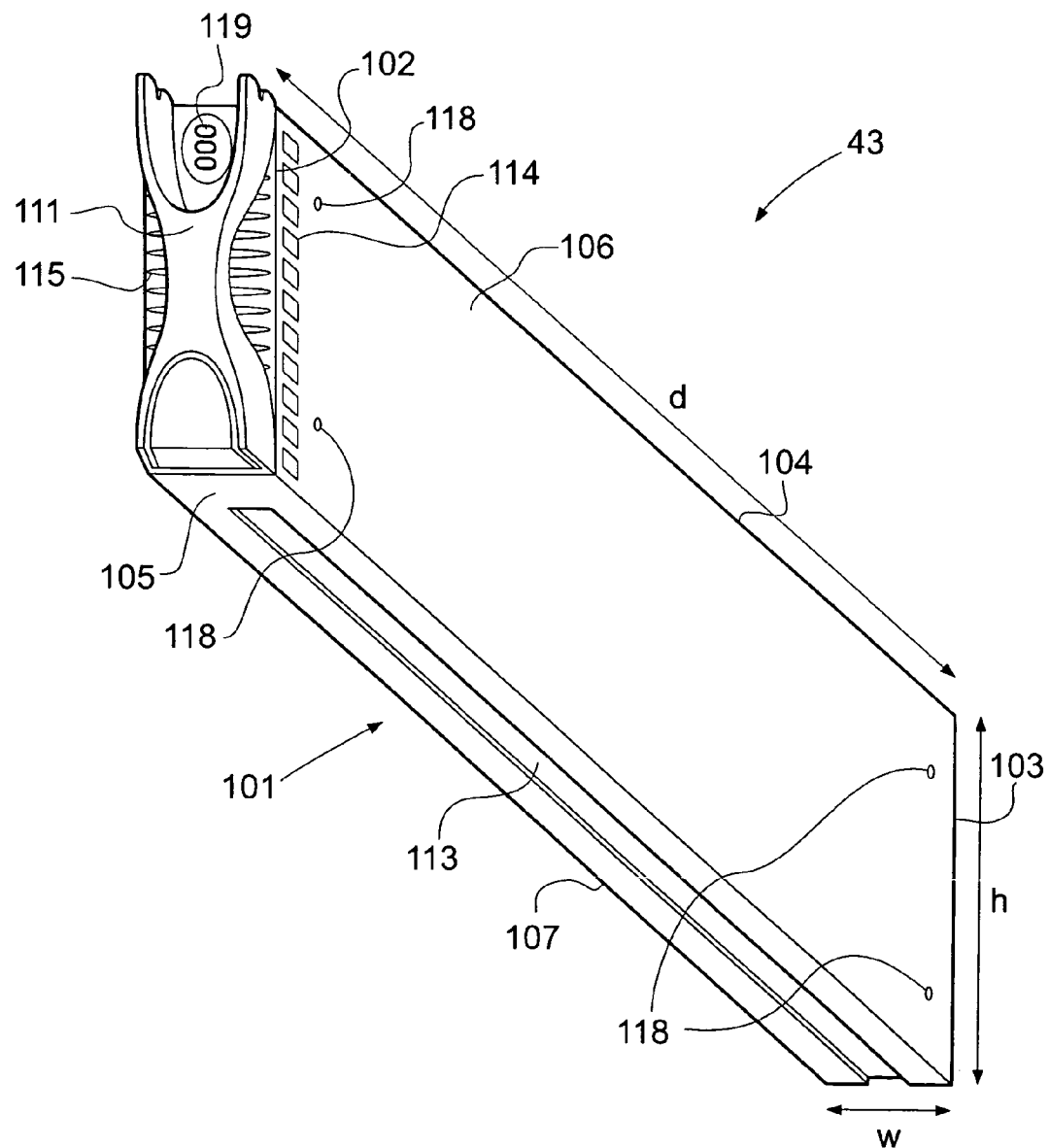
Figure 5C:
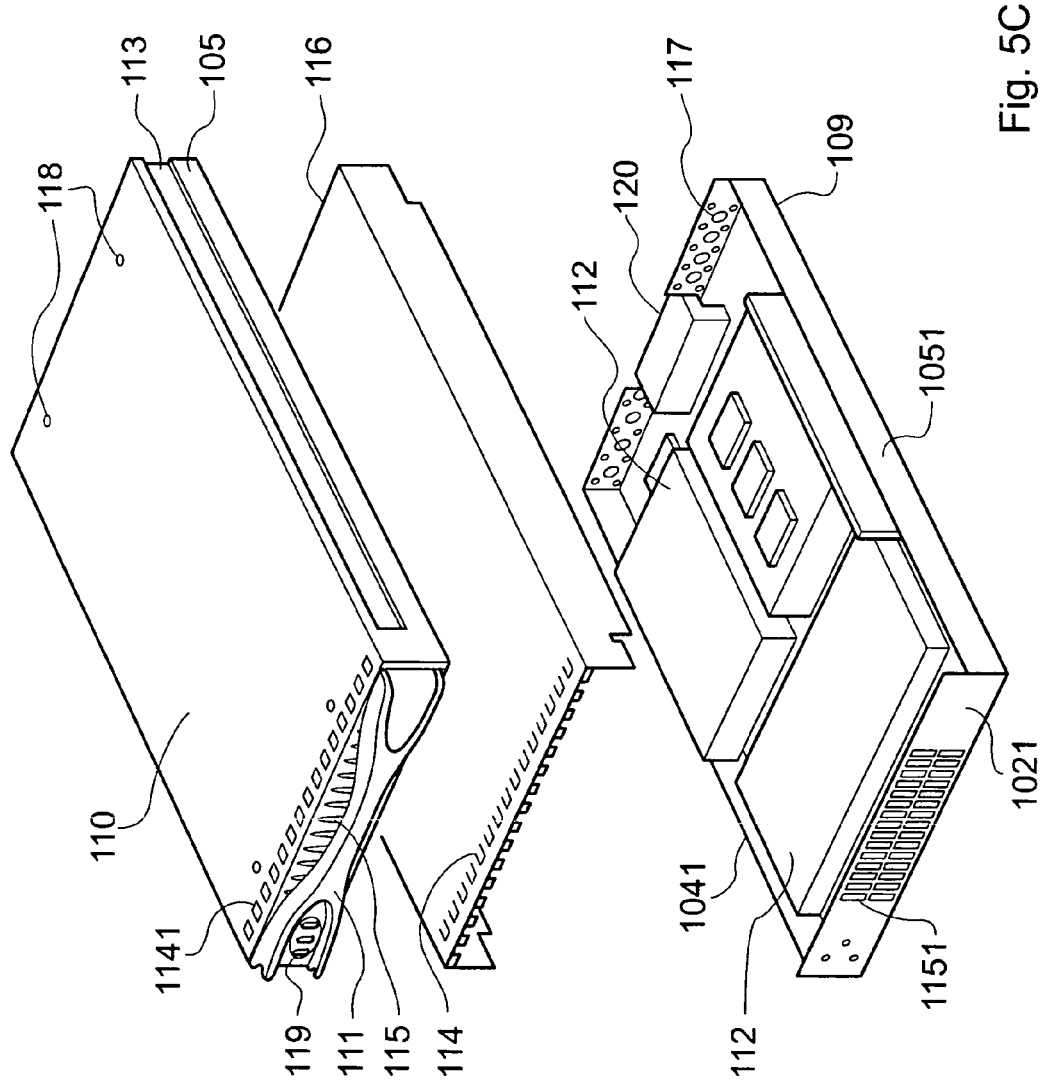

FIG. 5A provides a perspective view, partly from the rear, of an information processing cartridge 43. FIG. 5B provides a perspective view, partly from the front of the same information processing cartridge 43. FIG. 5C provides an exploded perspective view of the construction of the information processing cartridge 43. Here is it to be noted that the term "rear" is applied in the context of the position, when installed, of the information processing cartridge, with respect to the shelf 41 (i.e. in this case the "rear" of the information processing cartridge 43 is the innermost part of the information processing cartridge when it is inserted in the shelf 41). Likewise, "front" refers in the present context to the outermost part of the information processing cartridge when it is inserted in the shelf 41.

With reference to FIGS. 3, 5A and 5B, it will be noted that information processing cartridges are three-dimensional, having a height (h), width (w) and depth (d). If, as in the present example, the information processing cartridges are to be arranged in a one-dimensional array (a row) across the shelf, then efficient packing for the information processing cartridges is achieved where one dimension (here the width, w) is smaller than the other dimensions (here the depth, d, and the height, h). In a particular example, the enclosure of a processing cartridge 43 has a height h, width w and depth d of 115 mm, 26 mm and 315 mm, respectively, although of course, other examples may have different dimensions.

It will be noted that an enclosure 101 of the present example of an information processing cartridge 43 has six, generally rectangular, faces. For convenience only, the face that is visible from the front of the racking when an information processing cartridge 43 is mounted in the shelf 41 is known as the front face 102. The opposite face is known as the rear face 103. In the present example these two faces, as well as top and bottom faces 104 and 105, and the side faces 106 and 107 have the shape of elongate rectangles.

Although in the present example the information processing cartridges have six generally rectangular faces, it will be appreciated that other examples could have other configurations. For example, rather than having a generally rectangular shape, the side faces of another example of an information processing cartridge could have the general shape of a triangle (whereby the information processing cartridge may then only have five faces), a pentagon (whereby the information processing cartridge may then have seven faces), and so on. Indeed, one or more or all of the edges could be curved. However, it will be appreciated that the present configuration provides advantages for example, in terms of manufacturing, engineering and packing density within a shelf 41.

In this example, the information processing cartridge enclosure 101 is fabricated from two housing portions. The first housing portion 109 can be fabricated from, for example, a metal (e.g., pressed steel) and can include one side face 106, the rear face 103 and part of the top face 104. The part of the top face formed by the metal portion 109 is given the reference 1041 in FIG. 5A. The second housing portion 110 can be fabricated from, for example, a plastics material and can include the other side face 107 and the front faces 102 and bottom face 105 and the remaining part 1042 of the top face 104. In the present example, a plastics material used is PolyCarbonate Acrylonitrile Butadiene Styrene (PCABS), however many other plastics materials such as other ABSs and nylons may be used. The metal portion 109 also includes a part 1021 corresponding to the front face 102 and a part 1051 corresponding to a part of the bottom face 105. The parts are covered by the plastics portion 110 when enclosure 101 is fully assembled. These parts are visible in the exploded view of FIG. 5C. The two housing portions 109 and 110 are secured to one another by fixings such as screws 118.

As shown in FIG. 5A, a groove 108 runs along the length of the plastic top face portion 1042. This groove 108 is provided for interfacing with a guide member of the shelf chassis (not shown in FIG. 5A, but see FIGS. 8B and 8C). A similar groove 113 is formed in the bottom face 105 of the plastics portion 110 as shown in FIGS. 5B and 5C. This groove 113 is provided for interfacing with a guide member of the shelf chassis (not shown in FIGS. 5B and 5C, but see FIG. 8D).

The provision of the enclosure 101 means that the information processing cartridge 43 can safely be handled by an operator who is not a skilled technician. Also, through the use of the enclosure 101, the information processing cartridge is a robust unit that protects its inner workings from the outside environment and vice versa. The use of a conductive enclosure, e.g., a metal enclosure, can result in the information processing cartridge including its own electromagnetic shielding. To this end, the enclosure 101 can also be provided with an internal electromagnetic interference (EMI) shielding member 116 as shown in FIG. 5C. The EMI shielding member can be located between the internal components 112 of the information processing cartridge 43 (not described in detail with reference to FIGS. 5A to 5C, but see FIGS. 11 and 18 below) and the plastics portion 110. The EMI shielding member can be secured to the plastics portion 110, for example by heat bonding or an adhesive. In other examples, the plastics portion could have a conductive layer deposited thereon, or conductive plastics material could be used. In this example, the EMI shielding member 116 is provided with electromagnetic interference (EMI) fingers 114 to ensure good contact with the shelf chassis and the adjacent components. These fingers 114 extend through EMI finger apertures 1141 in the plastics portion 110.

As shown in FIGS. 3, 5B and 5C, the information processing cartridge 43 incorporates an injector/ejector handle 111 on the front face 102 for facilitating insertion and latching of the information processing cartridge 43 within an aperture in the shelf 41.

As shown in those Figures, the handle 111 of the injector/ejector lever extends substantially the whole height of the front face of the information processing cartridge 43, thereby increasing the mechanical advantage and facilitating injection and ejection of the information processing cartridge 43. As is further shown in those Figures, the front face 102 of the information processing cartridge 43 has perforations 115, in the present example slits, to allow for airflow into the information processing cartridge 43. The front face part 1021 of the metal portion 109 has perforations corresponding to those in the front face 102 such that airflow into the information processing cartridge 43 is not impeded. It will be noted in FIGS. 3, 5B and 5C that the handle 111 is narrower in its middle than at its ends. This reduces any masking effect of the handle 111 on the airflow to the perforations 115 in the front face of the information processing cartridge 43 and facilitates grasping of handle 111. The handle 111 can be bowed out from the front face of the information processing cartridge to further facilitate grasping thereof and to reduce any masking effect with regard to the perforations. In other examples, the handle 111 could have an open frame-like structure to further facilitate airflow.

As shown in FIG. 5A, the rear face 103 of the information processing cartridge 43 also has perforations 117 to allow for air to be exhausted from the rear of the information processing cartridge 43. A fan can be located within the enclosure 101 of an information processing cartridge 43. In the present example the fan is a combined radial fan (blower) and heat sink to direct cooling air onto a processor of the information processing cartridge, which fan also encourages air movement within the enclosure 101. LED indicators 119 (see FIGS. 3 and 5B) can be provided on the front face 102 of an information processing cartridge to indicate whether power is on, whether service intervention is required and whether the information processing cartridge 43 can be removed. A connector 120, for example a 40 way single connector attachment (SCA-2) connector (a small computer systems interface (SCSI) connector), can be provided at the rear of the information processing cartridge 43 for electrical connection of the information processing cartridge 43 within the shelf 41. The connector 120 is advantageously able to withstand repeated removals and insertions of the enclosure 101 from and into a shelf 41. The connector arrangement can include a guide pin arrangement to prevent module misalignment during insertion of the information processing cartridge into the receiving location.

Thus an example of features and the construction of an information processing cartridge enclosure has been described. Although particular materials and constructions have been described, it will be appreciated that other examples could be employed. Indeed, it will be appreciated that this particular example relates to only a possible form for the processing cartridge 43. An example of an alternative construction will now be described with reference to FIG. 5D.

Figure 5D:
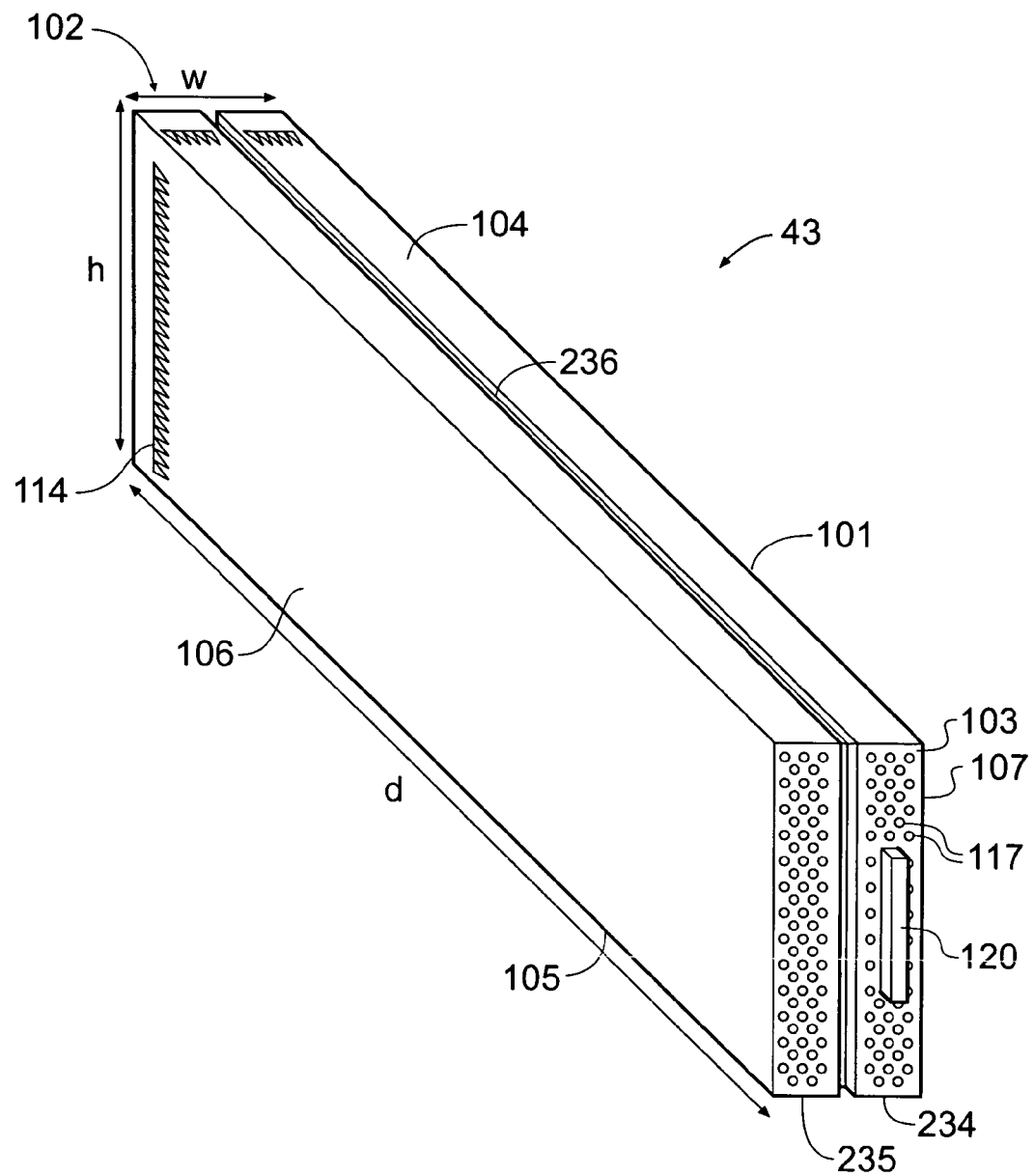
FIG. 5D is a schematic perspective view of an example of an information processing cartridge for mounting in the shelf of FIG. 2.

FIG. 5D provides a perspective view, partly from the rear, of an alternative information processing cartridge 43. Here is it to be noted that the term "rear" is applied in the context of the position, when installed, of the information processing cartridge, with respect to the shelf 41 (i.e. in this case the "rear" of the information processing cartridge 43 is the innermost part of the information processing cartridge when it is inserted in the shelf 41).

In this example, the information processing cartridge enclosure 101 is fabricated from pressed steel to form two chassis portions. The first portion 234 includes one side face 107, and part of each of the front and rear faces 102 and 103 and the top and bottom faces 104 and 105. The second portion 235 includes the other side face 108 and the remaining part of each of the front and rear faces 102 and 103 and the top and bottom faces 104 and 105. The two chassis portions 234 and 235 meet at a groove 236 and are secured to one another by fixings (e.g., one or more screws, not shown). Grooves 236 run along the top and bottom faces 104 and 105 of the enclosure 101 and are provided for interfacing with guide rails of the shelf chassis 49 (not shown in FIG. 5, but see FIG. 8C). A cover portion that is secured to the chassis portion forms the other side face 106. It will be appreciated however, that in another example, the chassis portions could be joined at a position other than the groove 108, with the groove 108 being formed entirely in one of the chassis portions. Alternatively, the enclosure 101 may be constructed from a number of sheets of steel, with each sheet forming one of the faces.

Figure 6:
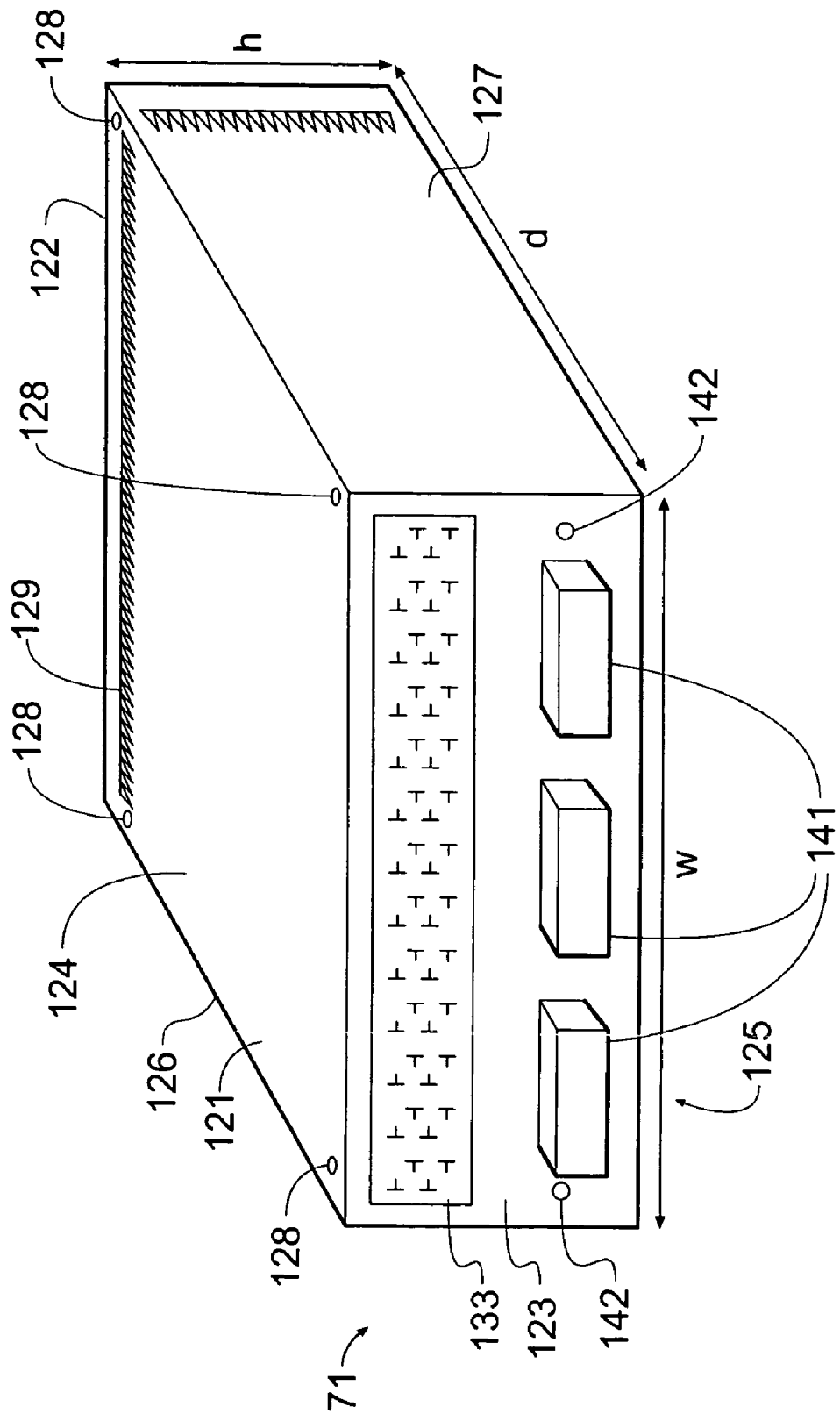
FIG. 6 is a schematic perspective view of an example of a combined switch and service processor module for mounting in the shelf of FIG. 2.

FIG. 6 provides a perspective view, partly from the front, of a Combined Switch and Service Processor (CSSP) cartridge (or CSSP) 71. Here is it to be noted that the term "front" is applied in the context of the position, when installed, of the CSSP cartridge 71, with respect to the shelf 41 (i.e. in this case the "front" of the CSSP cartridge 71 is the innermost part of the CSSP cartridge 71 when it is inserted in the shelf 41).

With reference to FIGS. 4 and 6, it will be noted that a CSSP cartridge 71 is three-dimensional, having a height (h), width (w) and depth (d). In a particular example, the enclosure of a CSSP 71 has a height h, width w and depth d of 43 mm, 202 mm and 278 mm, respectively, although of course, other examples may have different dimensions.

An enclosure 121 of present example of a CSSP cartridge 71 has six, generally rectangular, faces. For convenience only, the face that is visible from the rear of the racking when a CSSP cartridge 71 is mounted in the shelf 41 is known as the rear face 122. The opposite face is known as the front face 123. In the present example these two faces, as well as side faces 126 and 127 have the shape of elongate rectangles. The top and bottom faces 124 and 125 are also rectangular, but not elongate in the manner of the front, rear, top and bottom faces. Although in the present example the CSSP cartridges have six generally rectangular faces, as for the information processing cartridges 43 it will be appreciated that other examples could have other configurations.

In this example, the CSSP enclosure 121 is fabricated from steel sheet to form a chassis portion that includes the bottom face 125, the front and rear faces 122 and 123 and the side faces 126 and 127. A cover portion that is secured to the chassis portion forms the other top face 124. The cover portion is secured to the chassis portion by suitable fixings, for example one or more screws 128. It will be appreciated however, that in another example, other faces, or portions, of the enclosure could form the chassis and the cover portions. The provision of the enclosure 121 means that the CSSP cartridge 71 can safely be handled by an operator who is not a skilled technician. Also, through the use of the enclosure 121, the switch cartridge is a robust unit that protects its inner workings from the outside environment and vice versa. The use of a conductive enclosure, e.g., a metal enclosure, means that the CSSP cartridge includes its own electromagnetic shielding. To this end the CSSP enclosure 121 is provided with EMI fingers 129 to ensure good contact with the shelf chassis and the adjacent components.

As shown in FIG. 4, the CSSP cartridge 71 incorporates two D-shaped handles 132 to facilitate insertion and removal of the CSSP cartridge 71 with respect to an aperture 72 in the rear face of the shelf enclosure. A latch member 131 can be pivotably mounted on a plate that can be secured (e.g., using screws) to the rear face of the shelf enclosure. The latch member 131 is configured to engage one of the handles 132 and to secure the CSSP cartridge 71 in place. In other examples, the CSSP cartridge 71 could be provided with an injector/ejector handle in a manner similar to the information processing cartridge. As shown in FIG. 6, the front face 123 of the CSSP cartridge 71 has perforations 133 to allow for airflow into the CSSP cartridge 71. As shown in FIG. 4, the rear face 122 of the CSSP cartridge 71 has perforations 135 to allow for air to be exhausted from the rear of the CSSP cartridge 71.

At least one fan can be located, for example behind the perforated portion 135 of the rear face, in a CSSP cartridge 71 to channel cooling air through the CSSP cartridge 71 from the front to the rear. In this particular example shown, two fans are provided, one behind each set of perforations 135. LED indicators 137, as shown in FIG. 4, can be provided on the rear face 122 of the CSSP enclosure 121 to indicate whether power is on, whether service intervention is required and whether the switch can be removed. Additional link status indicators can be provided integral to 2×4 stacked RJ-45 connectors 139, also shown in FIG. 4. As shown in FIG. 4, electrical connections 141 can be provided at the front face of the CSSP (i.e. on the face that in use is inside the shelf enclosure 47). Suitable connections for use in the present example include a connector for power connections, a connector for serial management data connections and a connector for information connections. In the present example, information connections are implemented using an Ethernet information communication protocol, e.g. at 1 Gigabit (Gb). However other protocols could equally be used, for example the Infiniband information communication protocol. The connector arrangement can include a guide pin arrangement to prevent module misalignment during insertion of the CSSP module into the receiving location. For this purpose, guide pin holes 142 can be provided on the front face 123 into which guide pins may pass to aid module alignment.

In the present example, up to two CSSPs 71 can be mounted at any one time at the rear of the shelf unit in corresponding apertures 72 in the rear face of the shelf enclosure 47. The number of CSSPs 71 provided in any particular implementation depends upon system configuration and the need, or otherwise, for redundancy.

It will be appreciated that one possible construction of the CSSP cartridge 71 has been described and that as for the information processing cartridge 43, other examples could employ other materials and/or constructions.

Figure 7:
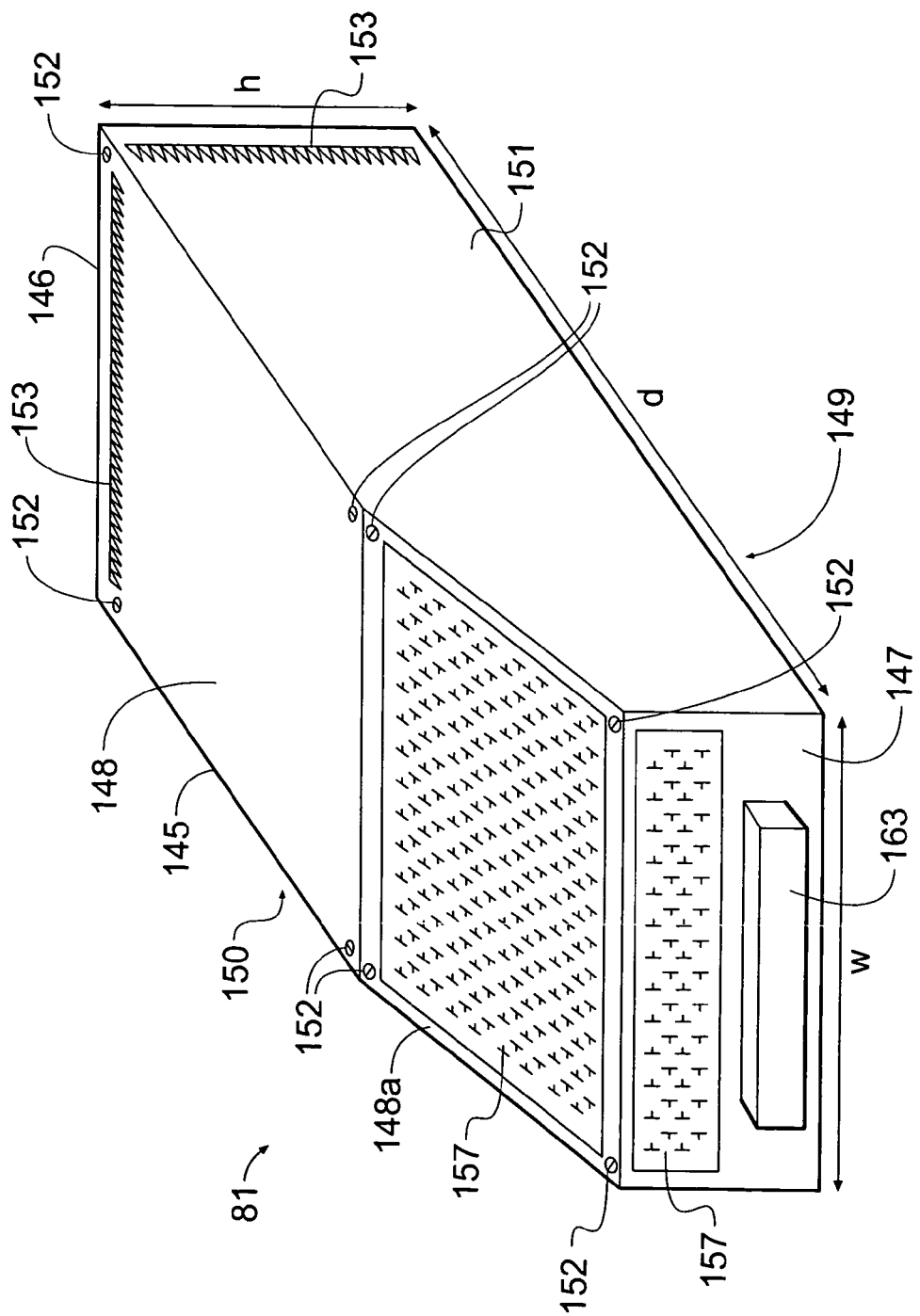
FIG. 7 is a schematic perspective view of an example of a power supply module for mounting in the shelf of FIG. 2.

FIG. 7 provides a perspective view, partly from the front, of a power supply unit (PSU) cartridge 81. Here is it to be noted that the term "front" is applied in the context of the position, when installed, of the PSU cartridge 81, with respect to the shelf 41 (i.e. in this case the "front" of the PSU cartridge 81 is the innermost part of the PSU cartridge 81 when it is inserted in the shelf 41).

With reference to FIGS. 4 and 7, it will be noted that PSU cartridge 81 is three-dimensional, having a height (h), width (w) and depth (d). In this particular example, the order to provide for a dense packing of the FRUs in the rear of the shelf 41, the PSU cartridge 81 has two dimensions (hereinafter described as the width, w, and the depth, d) that are generally similar. In a particular example, the enclosure of a PSU cartridge 81 has a height h, width w and depth d of 83 mm, 202 mm and 276 mm, respectively, although of course, other examples may have different dimensions.

An enclosure 145 of present example of a PSU cartridge 81 is of generally oblong shape, but has the "top" "front" edge cut away to form an additional "top" "front" sloping face. The enclosure 145 therefore has five, generally rectangular, faces and two faces of generally rectangular shape with one corner cut away. For convenience only, the face that is visible from the rear of the racking when the PSU cartridge 81 is mounted in the shelf 41 is known as the rear face 146. The opposite face is known as the front face 147. In the present example these two faces and the two side faces 150, 151 are of elongate, generally rectangular shape with one corner cut away, given that the width and depth of the PSU cartridge are similar, whereas the top and bottom faces 148, 149, although still rectangular, are not, in this example, notably elongate. A top front face 148a is present at the top front of the enclosure. Thus the front of the enclosure is sloped at the top edge. As for the information processing cartridges 43, however, it will be appreciated that other examples could have other configurations.

In this example, the PSU cartridge enclosure 145 is fabricated from steel sheet to form a housing portion that includes the bottom face 149, the side faces 150 and 151 and the front and rear faces 146 and 147. Cover portions that are secured to the housing portion form the top face 148 and top front face 148a. The cover portions are secured to the chassis portion by suitable fixings, for example one or more screws 152. It will be appreciated however, that in another example, other faces, or portions, of the enclosure could form the chassis and the cover portions. The provision of the enclosure 145 means that the PSU cartridge 81 can safely be handled by an operator who is not a skilled technician. Also, through the use of the enclosure 145, the PSU cartridge 81 is a robust unit that protects its inner workings from the outside environment and vice versa. The use of a conductive enclosure, e.g., a metal enclosure, means that the PSU cartridge includes its own electromagnetic shielding. To this end the PSU enclosure 145 is provided with EMI fingers 153 to ensure good contact with the shelf chassis and the adjacent components.

As shown in FIG. 4, the PSU cartridge 81 incorporates two D-shaped handles 156 to facilitate insertion and removal of the PSU cartridge 81 with respect to an aperture 82 in the rear face of the shelf enclosure. A latch member 155 can be pivotably mounted on a plate that can be secured (e.g., using screws) to the rear face of the shelf enclosure. The latch member 155 is configured to engage one of the handles 156 and to secure the PSU 81 in place. In other examples, the PSU 81 could be provided with an injector/ejector handle in a manner similar to the information processing cartridge. As shown in FIG. 7, the front face 147 of the PSU cartridge 81 has perforations 157 to allow for airflow into the PSU cartridge 81. As shown in FIG. 4, the rear face 146 of the PSU cartridge 81 also has perforations 159 to allow for air to be exhausted from the rear of the PSU cartridge 81.

A pair of fans can be located behind the perforated portions 159 of the rear face of a PSU cartridge 81 to channel cooling air through the PSU cartridge from the front to the rear. LED indicators 161 can be provided on the rear face 146 of the PSU enclosure 81 to indicate whether input power is good, whether output power is good, whether service intervention is required and whether the PSU can be removed. Electrical connectors 163 can be provided at the front face of the PSU (i.e. on the face that in use is inside the shelf enclosure 47) for connection to the shelf. The PSU 81 of the present example may suitably employ an SSI-MPS (Server Systems Interface—Midrange Power Supply) compliant right angle connector at the front face 147 of the PSU 81 to connect to the shelf 41. The power inlet 83 for each PSU 81 can incorporate a cable/connector retention mechanism (not shown) on the rear face 146 of the PSU to prevent accidental or malicious removal of the power input cord from the PSU 81.

In the present example, the shelf unit enclosure provides slots at the rear of the shelf unit for two hot-swappable, AC input PSUs 81. To provide redundant power supply, both PSU slots are populated. More generally, N+M power supplies can be provided, where N is the minimum number of power supply units needed to support the components mounted in the shelf, and M is a selectable number of 0, 1 or more power supplies to provide for redundancy. In the present example, N=M=1.

It will be appreciated that one possible construction of the CSSP cartridge 71 has been described and that as for the information processing cartridge 43, other examples could employ other materials and/or constructions.

If the full complement of information processing cartridges or switches are not fitted to the enclosure, then blanking panels/modules (e.g., the blanking panels 44 shown in FIG. 3) are fitted to all unpopulated positions to maintain the correct airflow and thermal characteristics of the shelf, a safe internal operating temperature for the shelf life expectancy of all shelf components, electromagnetic compliance (EMC) containment and electrostatic discharge (ESD) containment.

It will be noted that each of the FRUs, such as the information processing cartridges 43, is advantageously contained in its own robust enclosure to facilitate EMC containment, ESD containment, handling, storage and transportation. Each FRU can be configured as a 'sealed' unit in the sense that it can be configured not to have field or customer serviceable parts internally. The FRUs can be configured readily to plug into the shelf enclosure and to be hot swappable. The FRUs can be keyed to prevent incorrect positioning and insertion into the shelf enclosure and are arranged positively to be retained in the shelf by a latching/locking mechanism.

The examples of FRUs described above are not provided with removable media. In the present example, internal data storage is provided by 2.5" IDE 9.5 mm or 12.7 mm profile hard disk drive (HDD) devices mounted internally in each information processing cartridge 43 and in the CSSP cartridge 71. The drives are not considered as FRUs and are not hot-swappable disk drives in the present example, although they could be in other examples. In other examples, the information processing cartridges can be configured without internal hard disk drives.

The internal configuration of the shelf 41 and a midplane 171 contained therein is described in the following with reference to FIGS. 8A, 8B 8C and 8D, and FIGS. 9A, 9B and 9C.

Figure 8A:
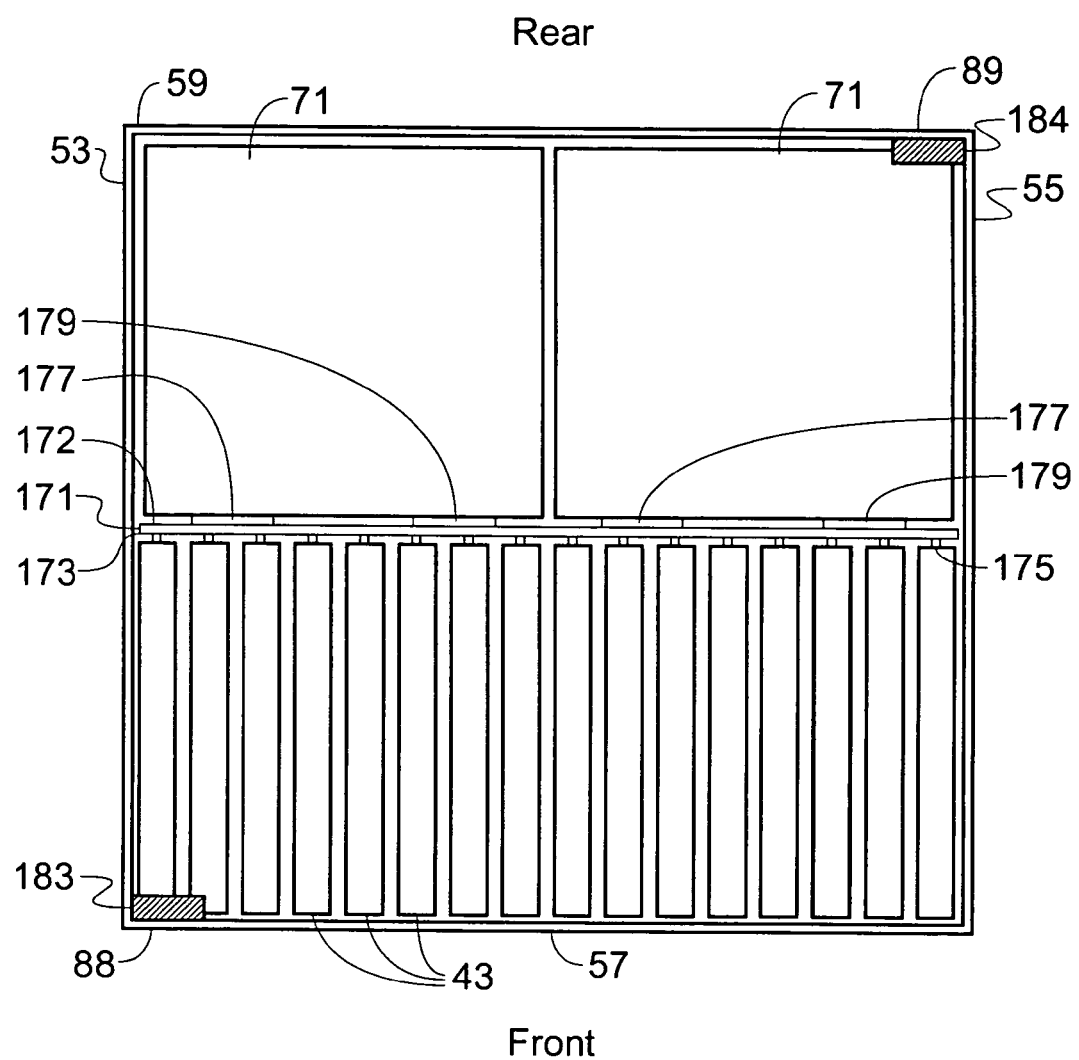
FIGS. 8A, 8B and 8C are a schematic plan view and schematic perspective views, respectively, of an example of the chassis and midplane of the shelf of FIG. 2.
Figure 8B:
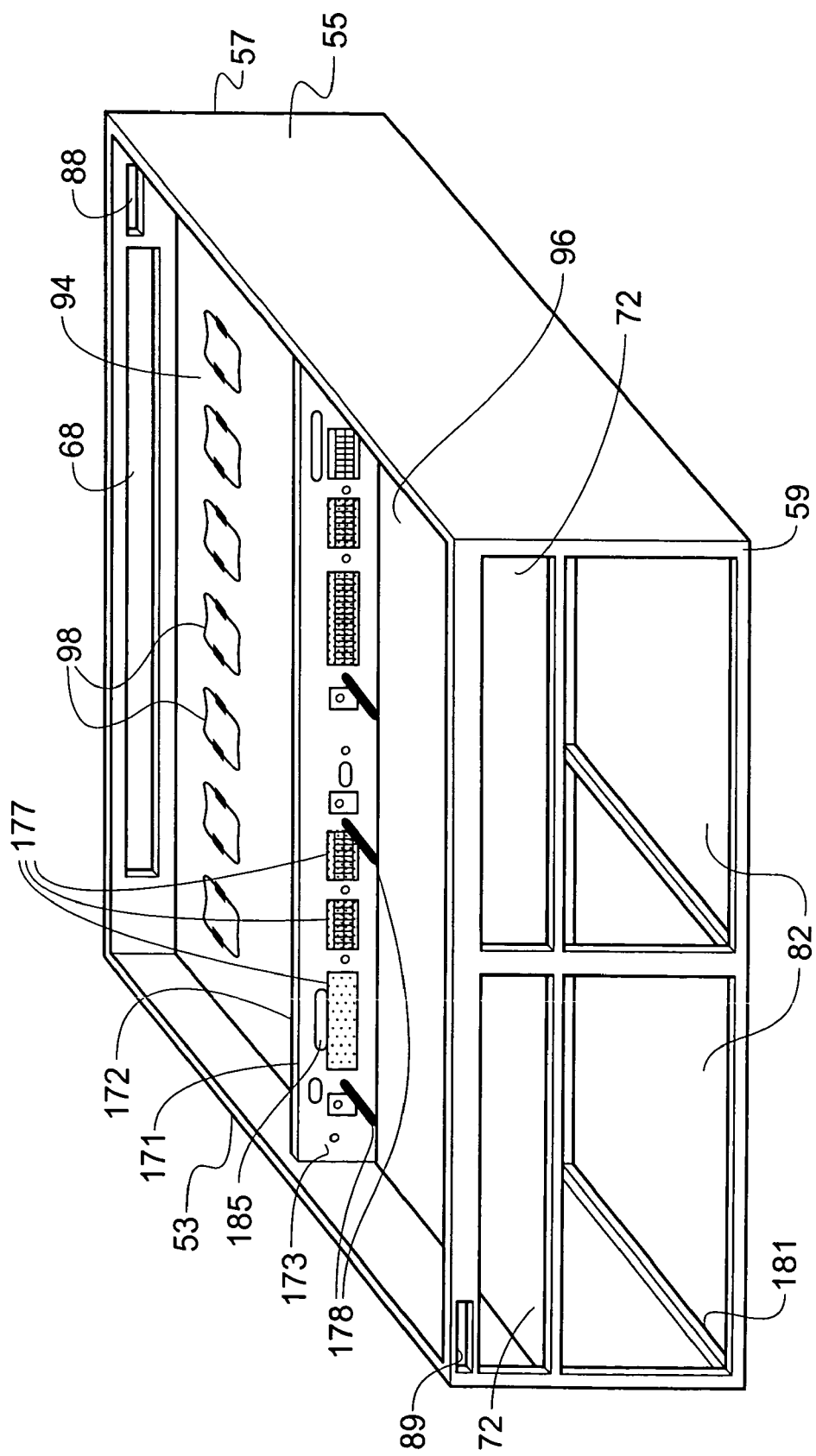
Figure 8C:
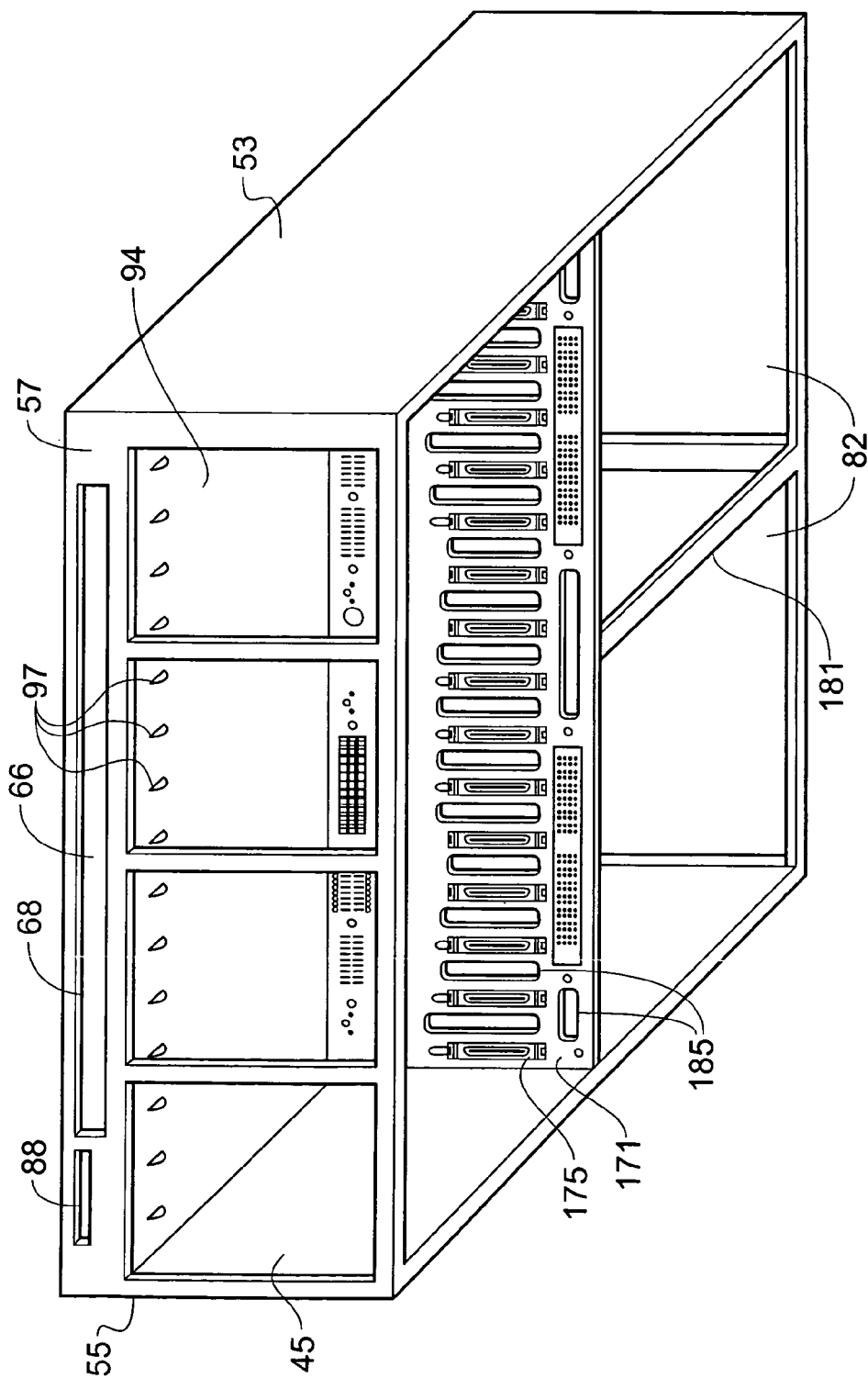
Figure 8D:
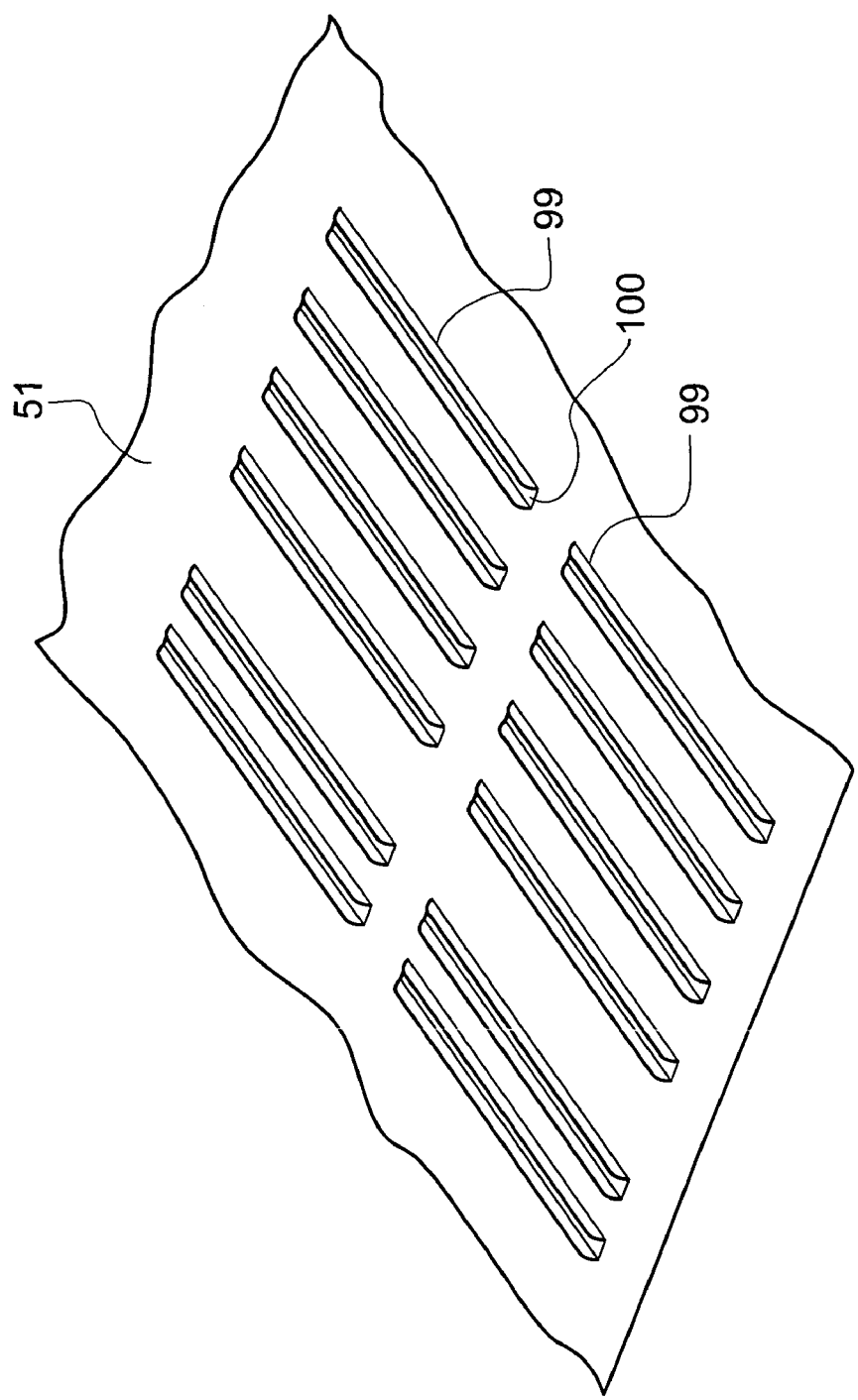
FIG. 8D is a schematic perspective view of a part of a base member of the shelf of FIG. 2.
Figures 9A, 9B, 9C:
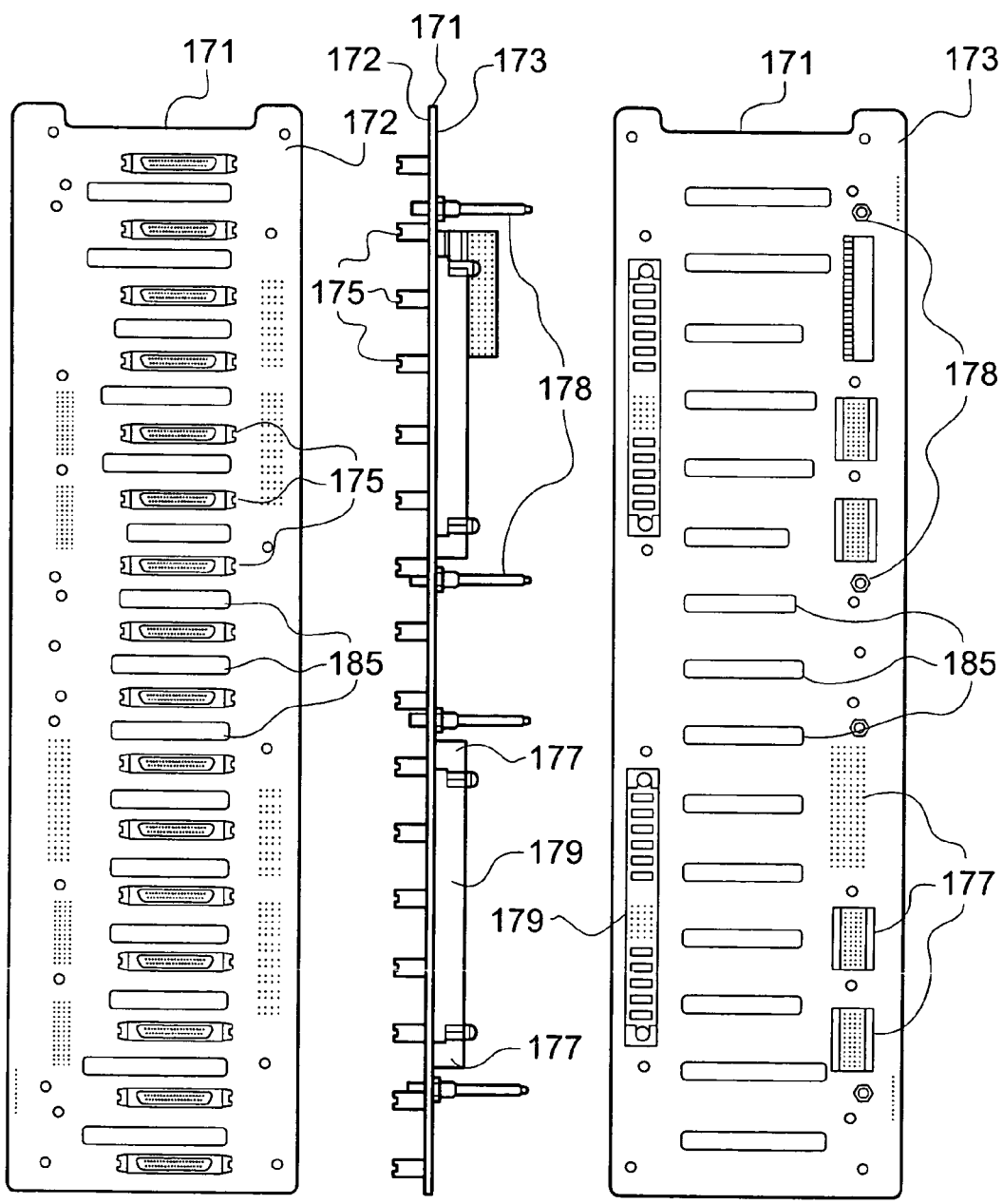
FIGS. 9A, 9B and 9C are schematic front, top and rear views, respectively, of an example of a midplane of the shelf of FIG. 2.

FIG. 8A is a schematic plan view showing the internal configuration of an example of a shelf 41 with the cover 61 removed. FIG. 8B is a schematic perspective view from above the rear of the chassis portion 47 of the shelf enclosure with the field replaceable units removed. FIG. 8C is a schematic perspective view from below the front of the chassis portion 47 of the shelf enclosure with the field replaceable units and the base 51 removed. FIG. 8D is a schematic perspective view from the front and above a part of the base 51 of the shelf 41. FIGS. 9A, 9B and 9C are, respectively, front top and rear views of the midplane 171. In this example, the midplane is, in use, mounted vertically within the shelf 41 extending across the width W of the shelf 41 at a position approximately half way between the front and the rear of the shelf 41.

The vertically mounted midplane 171 extends, in this example, across the shelf 41 and allows for the electrical interconnection of the FRUs. The various apertures in the front and rear faces 57 and 59 of the shelf 41, in combination with the midplane 171, can be provided with guides (e.g., rails 181) and keying e.g., offset connector positioning for the insertion of the FRUs into the enclosure and midplane 171. The midplane 171 can be a double-sided, or multi-layer printed circuit board (PCB) assembly that can be mounted vertically in a rigid manner within the enclosure. It can carry connectors 175 on a front surface 172 for making electrical connection with corresponding connectors 120 on the information processing cartridges 43. It can also carry connectors 177 and 179 on rear surface 173 for making electrical connection with corresponding connectors 141 and 163 on the CSSPs 71 and the PSUs 81, respectively. Conductive tracks (not shown) on and through the midplane 171 can be provided to interconnect the various connectors. In addition, the midplane can provide connectors for receiving corresponding connectors connected to first and second indicator boards 183 and 184 that each carry a respective set of LED indicators 69. In the present example, the midplane 171 is not configured as a FRU and is not hot swappable. It is perforated to facilitate airflow through the shelf 41. The midplane 171 can include openings 185, which cooperate with openings in the enclosures of the FRUs 43 and 81, to provide a path for cooling air to pass from the front to the rear of the shelf 41, the cooling air being driven by fans in one or more of the FRUs, for example in the PSUs 81, possibly also in the information processing cartridges 43.

A plenum chamber floor member 94 can extend horizontally from the front of the midplane 171 to the front face 57 of the shelf enclosure, or chassis 47. The member 94 provides a floor for a plenum chamber 66, which is supplied with air via the apertures 65 in the front bezel and, in the illustrated example, the slot shaped aperture 68 in the front face 57 of the shelf enclosure 47. Although, for reasons of ease of illustration a slot shaped aperture 68 is shown, a plurality of apertures 68 aligned with the blade receiving locations may be provided. The aperture or apertures 68 can serve both as air vents for a flow of air to the plenum chamber 66, and also as latching locations for latching portions at the top of the injector/ejector levers 111 for the blades shown in FIGS. 5B and 5C. The top and sides of the plenum chamber are provided by the top cover 61 and side faces 53 and 54 of the shelf enclosure 47.

A plurality of cartridge guides 97 can be provided at the underside of the plenum chamber floor member 94. In the present example, these guides comprise sprung wire members, e.g., of a resilient metal such as spring steel, that are attached to the top surface of the plenum chamber floor member 94 and extend through a plurality of apertures therethrough to result in a row of guides 97 at the underside of the plenum chamber floor member 94. This arrangement is shown in FIGS. 8B and 8C. In FIG. 8B, the sprung wire members 98 are shown attached to the top surface of the plenum chamber floor member 94. In the present example, the sprung wire members 98 are arranged in pairs, such that two guides 97 are provided by each spring clip 98. In FIG. 8C, the guides 97 formed by the protruding portions of the sprung wire members 98 are shown at the underside of the plenum chamber floor member 94. Each guide 97 is advantageously positioned so as to interface with the groove 108 in the plastics material in the upper face 104 of a processing cartridge 43 as shown in FIGS. 5A-5C to aid correct alignment and to facilitate insertion of the processing cartridge during insertion of the cartridge into the shelf 41. The use of the spring clip as a guide 97 also serves to urge the processing cartridge downwards to provide a secure mounting of the processing cartridge 43, to take account of manufacturing and operational tolerances and to assist in insertion of the processing cartridge where an operator does not align his absolutely correctly.

A further row of cartridge guides 99 can be provided at the upper surface of the base 51 of the shelf 41. In the present example, as shown in FIG. 8D, these guides 99 have a rail like form, which can be achieved by punching or stamping through the base 51 of the shelf 41. In this example each guide, or rail, 99 includes a pair of upstands separated by an aperture 100 through the base 51. The size of the aperture 100 can correspond to the width between the upstands. The separation of the upstands is selected so that the overall width of the resulting rails is slightly less than the width of a groove formed in the lower face of an information processing cartridge 43. Thus, each guide 97 is advantageously arranged so as to interface with the groove 1113 in the plastics material in the lower face 104 of a processing cartridge 43 as shown in FIGS. 5A–5C to aid correct alignment and to facilitate insertion of the processing cartridge during insertion of the cartridge into the shelf 41.

In the present example, where the guides 97 and 99 are formed from metal, the provision of the grooves 108 and 113 in plastics material at the upper and lower faces, respectively, of each information processing cartridge 43 (see FIGS. 5A–5B) results in a combination of metal and plastics materials that can provide a low friction interaction, facilitating insertion of the information processing cartridges.

If, for example, the information processing cartridge enclosure is made of a metal, it may be undesirable to provide metal guides to avoid a metal to metal interaction. In such a case, for example, it may be desirable to form the guides from a plastics material having a low coefficient of friction, such as polytetrafluoroethene (PTFE) or polythene. Plastics rails could be attached to the underside of the plenum chamber floor member 94 and/or on the upper surface of the base 51 of the shelf 41. In such an example, grooves on the upper and lower faces of the information processing cartridges 43 could then be formed of metal or plastics and still result in a low friction arrangement.

A CSSP/PSU divider 96 can be provided to the rear of the midplane 171 and can extend horizontally to the rear face 59 of the shelf enclosure 47. The CSSPs 71, when inserted, are supported by the divider 96. To aid the correct insertion of the CSSPs 71, CSSP guide pins 178 are provided on the midplane 171 at positions adjacent connectors 177 on the midplane 171 for connection to the CSSPs 71.

Respective positions 88 and 89 can be formed in the front face 57 and the rear face 59 at which first and second indicator boards 183 and 184 supporting the indicator LEDs 69 can be located. These positions 88, 89 therefore include an aperture through the respective face of the shelf enclosure 47 such that indicator LEDs 69 mounted onto a circuit board attached to the inside of the shelf enclosure 47 may be viewed from outside the shelf enclosure.

There now follows are more detailed description of the midplane 171.

As mentioned above, the midplane 171 connects all the elements of a shelf together, including, in the present example, up to sixteen information processing cartridges 43, up to two CSSPs 71, two PSUs 81 and the two indicator boards 183 and 184. In the present example, due to its location within the shelf enclosure, the midplane 171 is not configured to be swappable. Accordingly, to maximize the system reliability, the midplane is configured to provide as a high level of reliability as possible. To this end, the midplane is advantageously configured without active devices and to include the minimum number of decoupling capacitors consistent with good design practice (ideally zero).

The midplane supports a number of paths for various power and signal lines to interconnect the FRUs.

In the present example, each information processing cartridge 43 has a high speed information signal connection (e.g., a Gigabit (Gb) Ethernet SERializer/DESerializer (SERDES) connection) to each of the CSSPs 71, each connection consisting of two pairs of differential signals. In a conventional manner therefore, the tracking of the paths for these signals is arranged to keep the pairs well balanced and on a single signal layer (i.e. without vias) to support such differential signals at high frequency.

In addition, in the present example, each information processing cartridge 43 has a serial console connection to the CSSP cartridge 71. Each connection consists of two TTL (Transistor-Transistor Logic) level signals that make a transmit and return (TX and RX) pair.

Also, each PSU 81 has a management signal connection (e.g., a serial I2C (Inter-IC Bus) connection) to the CSSP cartridge 71 to control power and monitor environmental parameters. The I2C bus comprises of two signals SCL and SDL (serial clock line and serial data line). In addition, an I2C address programming pin is provided for the PSUs 81.

Each information processing cartridge 43 and PSU 81 can signal to the CSSP cartridge 71 that it is inserted by pulling to ground (GND) a respective Inserted_L signal (i.e., an active low signal). These signals are fed to the CSSP cartridge 71 via the midplane 171.

Each PSU 81 has five 12 Volt output rails. The routing from each PSU 81 is arranged so that a fault in any single FRU cannot completely interrupt the power to any other.

As mentioned above, the midplane 171 is provided with appropriate connector arrangements for receiving the connectors on the FRUs.

In the present example, the information processing cartridge 43 connects to the midplane 171 through a 40 pin Single Connector Attachment (SCA-2) connector as defined by the Small Computer Systems Interface (SCSI) standard. Accordingly, the midplane carries corresponding connectors 175.

In the present example, each CSSP cartridge 71 connects to the midplane 171 through a two right-angle 20 pair connector (e.g., 2 mm HM-Zd connectors available from Tyco Electronics). The corresponding connectors 177 on the midplane are straight male parts with a power connector. A guide pin arrangement is provided in addition to the connectors to prevent misaligned modules causing bent pins during insertion. The guide pin also provides a leading ground. The CSSP cartridge 71 also connects to the midplane 171 through a right-angled 125 way 5 row 2 mm connector. The connector 177 on the midplane 171 includes a straight male part. A guide pin arrangement is provided in addition to the connectors to prevent misaligned modules causing bent pins during insertion.

In the present example, as mentioned above, each PSU 81 connects to the midplane 171 through an SSI-MPS specification connector. The contacts are configured 5P/24S/6P with sequenced signal (S) and power (P) pins. Where the connector on the PSU is a 1450230-1 R/A male header, solder tails connector, the mating connector 179 on the midplane can be a 1450540-2 vertical receptacle, press-fit connector.

In the present implementation, indicator boards 183 and 184 (see FIG. 8A) are provided at the front and rear of the system and are configured as FRUs. In this example they hold three system-level indicator LEDs 69 and include a FRU identity (FRU-ID) programmable read-only memory (PROM) each. Three LEDs 69 are present on the indicator board. There can, for example, be a white locator LED that can be switched by the user for locating the system; a green power-on LED to indicate when the system is powered; and an amber service-required LED to indicate a fault or other condition requiring servicing. These LEDs can be driven by the CSSP 71.

In the present example, identification information (FRU ID) for the midplane 171 is held on an I2C electrically erasable programmable read only memory (EEPROM) in the front indicator board 183. In addition to the I2C signals necessary to access the FRU ID EEPROM, the CSSPs 71 provide a current limited supply to the indicator boards 183 and 184 via the midplane. The indicator boards 183 and 184 are also provided with an I2C address programming pin. Depending on the implementation, FRU ID information can be stored instead, or in addition, on the rear indicator board 184.

As the FRU-ID for the midplane 171 is held on one or both of the indicator boards 183 and 184, the midplane can be a totally passive unit. The FRU-ID PROMs communicate with the CSSPs 71 via an I2C bus. Each device on the bus has a separate I2C address. The lower three I2C address bits of the EEPROMs used are available as pins on the device, to allow programming with resistors. The least significant bit of this address (A0) is passed to the midplane via the corresponding connector. This allows the midplane 171 to program the address of the FRU-ID differently for the front and rear indicator boards 183 and 184, by pulling the address low for the front board and high for the rear indicator board 183. This ensures that both EEPROMs are available on the bus, at different addresses. The FRU-ID for the midplane can be stored on either front or rear EEPROM, but the present example the FRU-ID is stored in the EEPROM on the front indicator board 183. The EEPROM can be 8kByte or larger.

As mentioned above, the midplane 171 includes openings 185 to provide a ventilation path for cooling air passing through the shelf 41. The cooling air passing through the shelf 41 via the midplane 171 can be driven by means of fans provided in each of the information processing cartridges 43 and the power supply modules 81. The openings 185 shown in FIGS. 8B, 9A, 9B and 9C form schematic representations of openings in the midplane 171. In practice, the openings could have any form (i.e., a series of large openings, or a number of small perforations), arranged on the midplane to align with corresponding openings or ventilation apertures in the various field replaceable units 43, 71 and 81. In this way, the path of the airflow from the front of the shelf to the back of the shelf can be configured to be as efficient as possible, depending on the detail configuration of the fan units and the ventilation openings or apertures in the information processing, switch, service processor and power supply unit modules 43, 71 and 81. Providing the fan units in the field replaceable units 43, 71 and 81, contributes to the aim of maintaining the chassis 49 and the midplane 171 of the shelf 41 free of active components, thereby minimising cost, and facilitating maintenance. Also, by providing the fan units in each of the field replaceable units, merely inserting and removing field replaceable units automatically adapts the flow of cooling air to the number and type of field replaceable units inserted in the shelf 41.

As described above, in the present example each of the FRUs is designed to be a non-user serviceable unit. Thus each FRU presents the user with a "sealed" unit which may be inserted into and removed from the shelf 41 as desired or required. If a FRU ceases to be operable, then the user has a choice only of returning the FRU to a supplier or service company for repair or of discarding the non-operable unit. As the FRUs are non-user serviceable, there is no requirement for a skilled technician to be employed in inserting or removing the FRUs into or from a shelf 41. Thus each FRU is designed such that a non-skilled person should have difficulty in causing damage to the FRU during handling. Moreover, the configuration and construction of the FRUs (e.g. the injector/ejector levers, the grooves in the enclosures of the information processing units, etc), of the shelf enclosure and the midplane (e.g., the guide rails to guide insertion of the FRUs, the locating pins, etc) contribute to facilitating easy insertion and removal of the FRUs.

Figure 10:
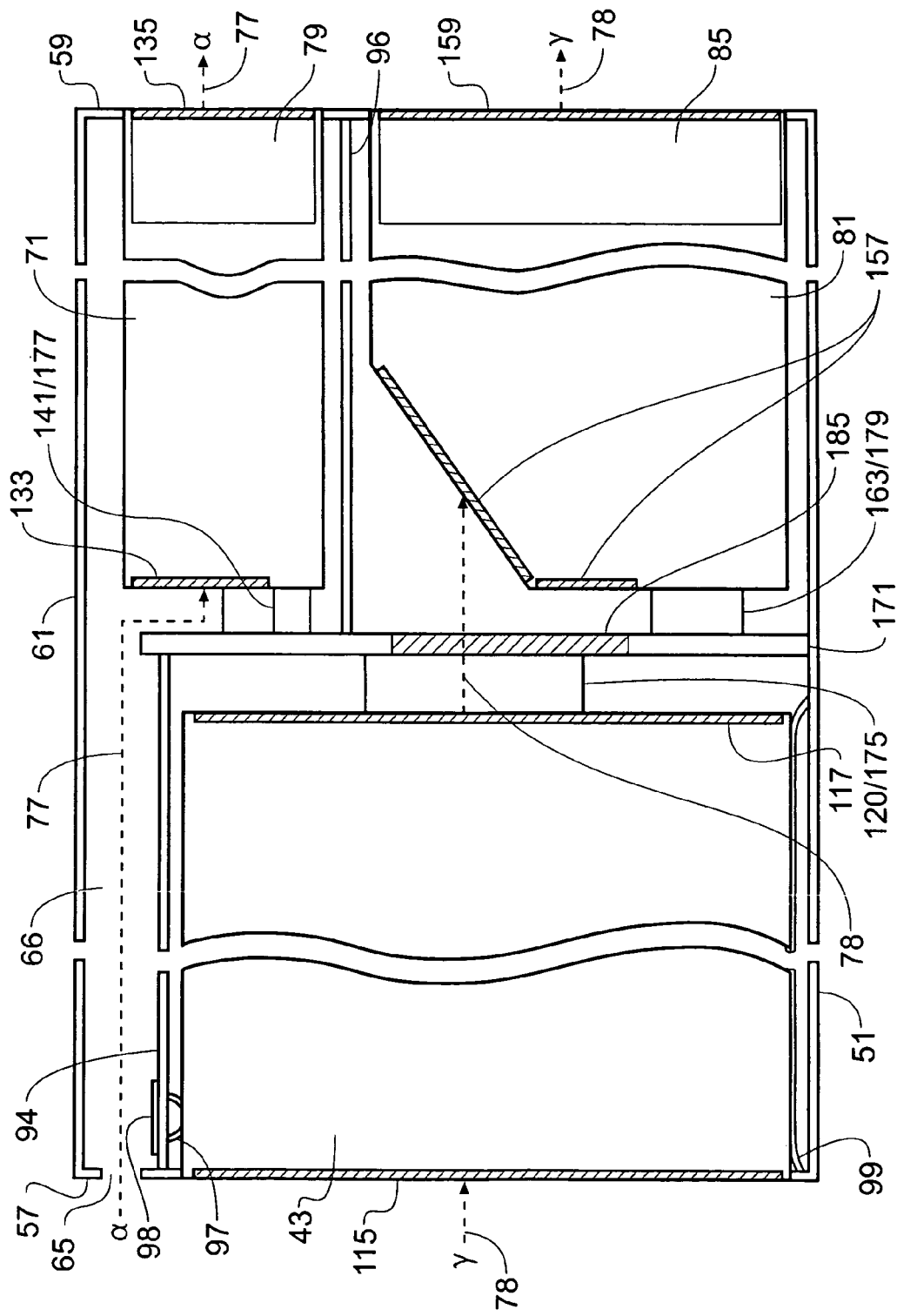
FIG. 10 is a schematic cross section view through the shelf of FIG. 2.

Shown in FIG. 10 is an example of the flow of cooling air through the shelf 41 and FRUs 43, 71, 81 mounted therein.

In this example, the cooling air passing through the shelf 41 is drawn generally in a front to rear direction through the shelf 41 by cooling fans mounted within the CSSPs 71 and the PSUs 81. Two separate flow paths for cooling air are provided in this example. The first, indicated as flow path $\alpha\alpha$ by dotted lines 77 provides cooling air to the CSSPs 71. The second path, indicated as flow path $\gamma\gamma$ by dotted lines 78 provides cooling air to the information processing cartridges 43 and PSUs 81.

The flow of cooling air along path $\alpha\alpha$ enters the shelf 41 through the aperture(s) 65 in the front face 57 of the shelf enclosure 47 into the plenum chamber 66. Further apertures (not shown) could also be provided in the side faces 53 and 55 of the shelf enclosure 47 to allow air to flow into the plenum chamber 66. This air then flows through the plenum chamber 66, and passes over the top edge of the midplane 171 to reach the perforations 133 of the front face of the CSSPs 71. The cooling air then passes through the CSSPs 71, providing cooling to the components thereof before passing out of the CSSPs 71 through the perforations 135 in the rear face of the CSSPs 71 thus being exhausted from the shelf 41. This flow of cooling air along flow path αα is driven by fans 79 mounted within the CSSPs 71. In the present example, a pair of fans 79 is provided within each CSSP 71 and is mounted against the rear face thereof.

Air flowing along path αα is impeded from flowing around the processing cartridges 43 by plenum chamber floor member 94 and is impeded from flowing to the PSUs 81 by CSSP/PSU divider 96. This flow path αα therefore ensures that air flowing to the CSSPs 71 is not warmed by passage though the processing cartridges 43 and therefore provides maximum efficiency cooling to the CSSPs 71.

The flow of cooling air along path γγ enters the shelf 41 through the perforations 115 in the front face of the information processing cartridges 43. The air thus enters the information processing cartridges 43 and provides cooling to the components thereof. Cooling fans (not shown) within the information processing cartridges 43 direct the cooling air to the processor (CPU) of the information processing cartridge and direct the flow of air in the cartridge thereby increasing cooling efficiency. The air then exits the information processing cartridges 43 through the perforations 117 in the rear face thereof. The air then passes through the apertures 185 through the midplane 171 to reach the PSUs 81. This cooling air then passes though the perforations 157 on the front and upper front faces of the PSUs 81 to enter the PSUs and provide cooling to components thereof. It will be appreciated from FIG. 10 that the sloping rear of the upper face of the PSUs 81 increases the area over which air can be drawn into the PSUs, thereby reducing the back pressure on the air flowing through the shelf unit and aiding the cooling efficiency. The flow of cooling air along path γγ is driven by fans 85 mounted within the PSUs 81. In the present example, a pair of fans 85 is provided within each PSU 81 and are mounted against the rear face thereof.

Air reaching the PSUs 81 via path γγ will already have passed through the processing cartridges 43. Such air will therefore be already warmed above the ambient temperature outside of the shelf 41 by its passage through the processing cartridges 43. However, as the cooling requirement of the PSUs 81 is typically less than that for the CSSPs 71, this does not cause any difficulty in the operation of the PSUs 81 which are adequately cooled by this flow of pre-warmed air. The pre-warmed air passing through the apertures 185 through the midplane 171 is impeded from flowing into path αα and entering the CSSPs 71 by the SCCP/PSU divider 96.

As will be appreciated by the skilled addressee, the arrangement shown in FIG. 10 is illustrative only and other arrangements whereby, for example, a mixture of cool air from the plenum chamber 66 and warmed air from the processing cartridges 43 is provided to each rear-mounted FRU can readily be constructed.

Figure 11:
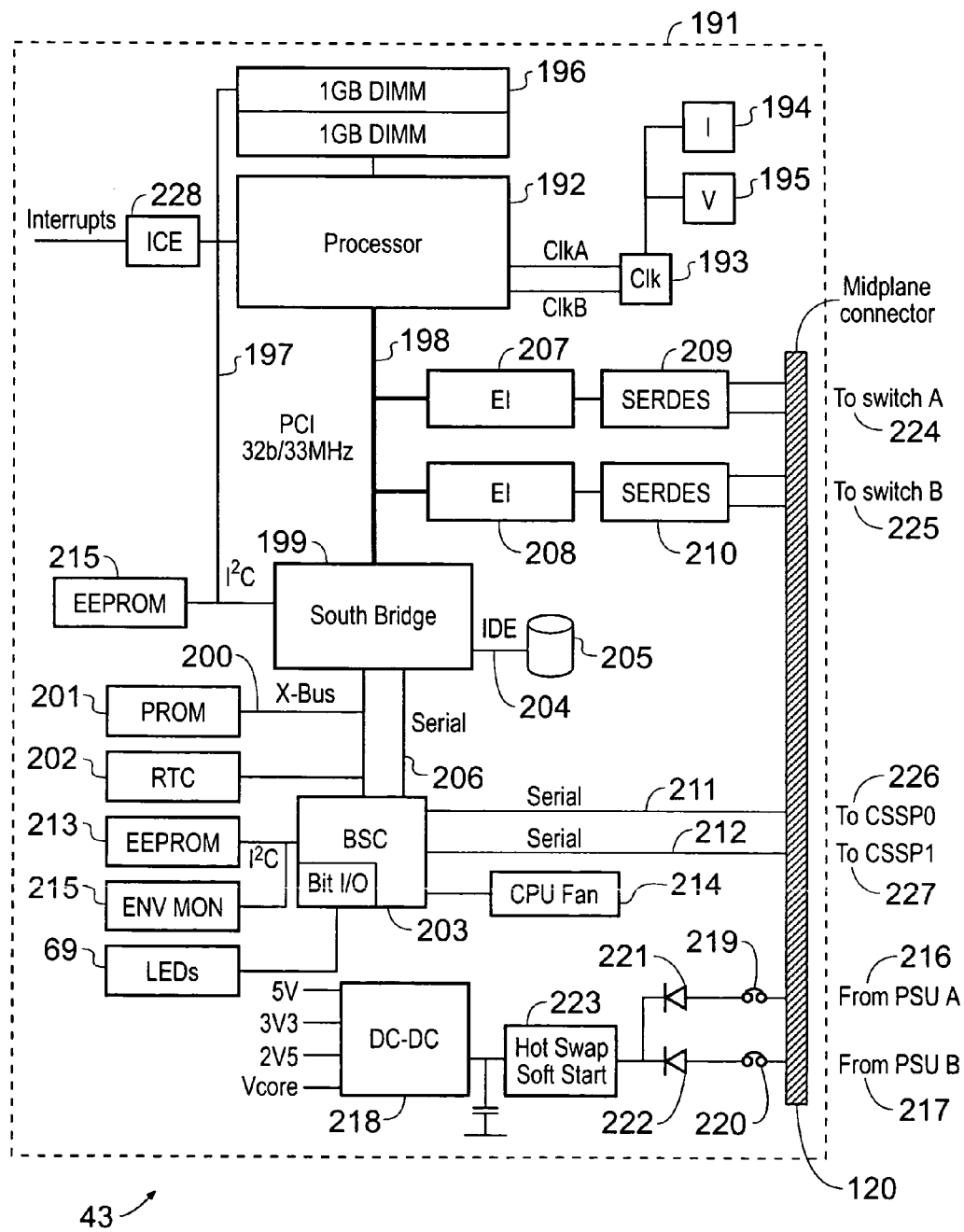
FIG. 11 is a functional block diagram of an example of an information processing subsystem for the information processing cartridge of FIG. 5.

With reference to FIG. 11, there now follows a description of functional elements of an information processing cartridge 43 as contained within the information processing cartridge enclosure 101.

The information processing cartridge 43 includes a microprocessor 192 (a non-limiting example of a microprocessor that can be utilised in the present example is an UltraS-PARC™ processor). The microprocessor is mounted on an information processing cartridge motherboard 191.

A configurable clock generator 193, configured as a programmable clock synthesizer employing a crystal, can be used to produce CPU clock signals, CLKA and CLKB. The clock frequency can be determined by jumper settings (not shown). A vectored interrupt controller (I-Chip) 194 and a configurable core voltage regulator module (VRM) 195 are provided.

In the present example, memory means for use by the processor 192 when executing instructions can be provided in the form of buffered dynamic random access memory (DRAM), for example configured as dual in line memory modules (DIMMs) 196 with a 72-bit data path with error correction codes (ECC), seated in two sockets on a riser card from the information processing cartridge motherboard 191. The memory capacity can be chosen to suit the processor addressable memory space. For example, in the present example, up to 4 Gigabytes (4 GB) of addressable memory can be provided. Serial Presence Detect (SPD) auto-configuration is provided via a Service Management Bus (SM-Bus) over an I2C bus 197.

In the present example, a PCI bus architecture can be employed with a so-called SouthBridge bus bridge 199 with SuperIO and two Gb Ethernet Media Access Control (MAC) devices. As described above, however, other bus protocols (e.g., Infiniband) can be used. A 32 bit PCI bus 198 can be provided from the microprocessor 192. The SouthBridge 199 is a standard form of bus bridge, in the present example packaged in a 352 pin PBGA (Plastic Ball Grid Array) package, that provides the following functions: an SM Bus interface over the I2C bus 197 for access to the SPD (Serial Presence Detect) feature of the DIMMs that allows initialization of the memory controller; an Xbus interface for access via an Xbus 200 (which is a packet switched multiprocessor bus) to a PROM 201, a real time clock (RTC) 202 and an information processing cartridge service controller (hereinafter termed a Blade Service Controller (BSC)) 203; an IDE (Integrated Drive Electronics) interface that provides an ATA-100 (AT Attachment) IDE connection 204 to an IDE disk drive 205; and a serial console interface on a service bus 206 to the BSC 203 that is used for operating system functions including a console function with this embodiment.

For IO to the midplane 171, two AC-coupled Ethernet interfaces 207 and 208 are provided in the present example, which are packaged in a 316 pin PBGA. These Ethernet interfaces can provide a PCI attached Ethernet MAC capable of operation up to Gigabit Ethernet performance. The physical layer can be implemented using SERializer/DESerializers (SERDESs) 209 and 210. An example of a SERDES device is the TLK2201 transceiver manufactured by Texas Instruments, Inc. The SERDES devices use differential PECL TX+/− and RX+/− (Positive Emitter Coupled Logic Transmit and Receive) pairs to communicate to the switch portions of the CSSPs 71 over the midplane 171. The RX+/− pairs can be AC coupled at the information processing cartridge 43, the TX+/− pairs can be AC coupled at each CSSP 71. This facilitates hot-swap of the information processing cartridges 43 and the CSSPs 71.

Asynchronous serial connections 211 and 212 for communication between the BSC 203 and the Service Processor parts of the CSSPs 71 can be provided.

Internal data storage can be provided in the present example by a hard disk 205 with a capacity of 30 GB or more rated for 24/7 continuous operation. The hard disk 205 is accessed using the primary IDE interface of the South- Bridge 199. The hard disk 205 can hold an operating system, for example a Solaris operating system, and other software and data for performing information processing using the main, or host, processor (CPU) within the information processing cartridge 43.

In the present implementation, the BSC 203 can be implemented as a microcontroller (e.g., a Hitachi H8 microcontroller). The BSC 203 can provide various functions, including for example: dual access (for the information processing cartridges and the CSSPs 71) to PROM 201 and EEPROM 213 for boot information and a FRU-ID for the information processing cartridge; channeling communication between an information processing cartridge 43 and the service processor part of the CSSPs 71; control of power on reset (POR), system reset and externally initiated reset (XIR) to the microprocessor 192; control of the power, service-required and ready-to-remove LEDs 69; upgrading of field-upgradable firmware, via the serial interface; a watchdog function for the operating system; monitoring the speed of a CPU fan 214; and communications with an EEPROM 215 and the operating system via the Xbus 200.

In the present example, the BSC 203 can be powered by a 5V service bus (SB) rail as soon as a CSSP 71 and a PSU 81 are fully inserted into the midplane 171, it then turns on other DC/DC converters to provide power to the remainder of the information processing cartridge 43. A BSC reset signal can be derived from a simple conventional power on reset (POR) generator that monitors a 5V supply rail.

In the present example a 1 MByte Flash PROM 201 can be provided for storing boot variables for OpenBoot™ PROM (OBP) and Power-On-Self-Test (POST). Further OBP variables can be stored in a second 16 kByte (16 kB) I2C PROM 215, accessible via the SouthBridge $^{SM}$ Bus port over the IC Bus 197. The PROM 215 can contain 8 kByte for OBP variables and 8 kByte of unused space. A 16 kByte I2C EEPROM 213 that is accessible via the BSC 203 can contain BSC variables and FRU-ID variables. The EEPROM is nominally divided into 8 kByte for FRU-ID and 8 kByte for the BSC variables. Write protection for the FRU-ID is implemented by BSC firmware. Such write protection may be carried out by, for example, acknowledging instructions to write to the protected area, but not to carry out those write instructions.

An environmental monitor sensor 215 can be provided to monitor the CPU and ambient temperatures. This sensor can be accessible via the onboard I2C bus from the BSC 203.

The information processing cartridge 43 can be powered from two, diode commoned, 9V power supply rails 216 and 217. DC/DC converters 218 can be used to provide the voltage levels required by the information processing cartridge 43. The DC/DC converters 218 are supplied by dual 9V inputs 216, 217, individually fused 219, 220 and then diode commoned 221, 222. A 5V DC/DC converter can be turned on as soon as the FRU is fully inserted, with the BSC 203 and required portions of the SouthBridge 199 being powered (the 5VSB rail). A field effect transistor (FET) can be used to gate off the main 5V supply to the rest of the information processing cartridge 43. The DC/DC converter outputs and the main 5V FET can be arranged not to turn on until the BSC 203 turns them on via a signal from the SouthBridge 199. The SouthBridge 199 can be used so that if the BSC 203 is reset (by a watchdog timeout or after a firmware download) the state of the DC/DC converters 218 is not affected. When the remaining outputs from the DC/DC converters 218 are within specification, a PWR_GOOD signal can be asserted low to the BSC 203.

A SouthBridge resume circuit can be operable to run from 3V3, and a simple Zener diode dropper circuit can be used to generate 3V3 from the 5VSB supply.

When the FRU is inserted the inrush current can be limited, for example to <1A, and the rate of rise can be configured not to exceed a predetermined value (e.g., 20 A/s) to provide a so-called soft start to facilitate hot-insertion. The intent is to prevent damage to the connectors and to avoid generating noise. A soft start controller 223, which controls a ramping-up of voltage levels, can be enabled when the predetermined signal (Inserted_L signal) is asserted low, this signal is on a short pin in the connector and is connected to ground (GND—not shown) through the midplane 171.

In the present example, a processor impingement fan (processor fan) 214 is configured to run at full speed to cool the information processing cartridge 43 and the fan. The speed of the processor fan and sink can be monitored by the BSC 203, using a tachometer sense pin on the microcontroller. In the event of the fan speed falling below a predetermined speed, or percentage of its nominal speed (e.g., 80%), the BSC 203 can be arranged to issue an alert. The nominal speed of the fan can be recorded as part of the BSC EEPROM contents.

The midplane connector 120 for the information processing cartridge 43 is used to establish the connection between the information processing cartridge 43 and the midplane. In the present example it supports up to 84 connections (pins) that will deliver SERDES outputs 224, 225, I2C signals 226, 227, and power 216, 217. Signal connections may be made through a right-angled connector. Power connections may be made through the information processing cartridge right-angled connector. The connector can be configured to facilitate hotswapping of the information processing cartridge, for example by having a low insertion force and/or guide pins to increase the ease of serviceability and prevent module misalignment during insertion.

Interrupts to the processor 192 can be encoded using an encoded interrupt vector mechanism. An I-Chip Emulator (ICE) 228 functions as an interrupt concentrator, receiving all system interrupts and encoding them as an interrupt vector according to an interrupt vector code utilisable by the processor 192. In the present example, where an UltraSPARC™ processor is used, the interrupt vector encoding may be based on a 6-bit interrupt vector code.

Figure 12:
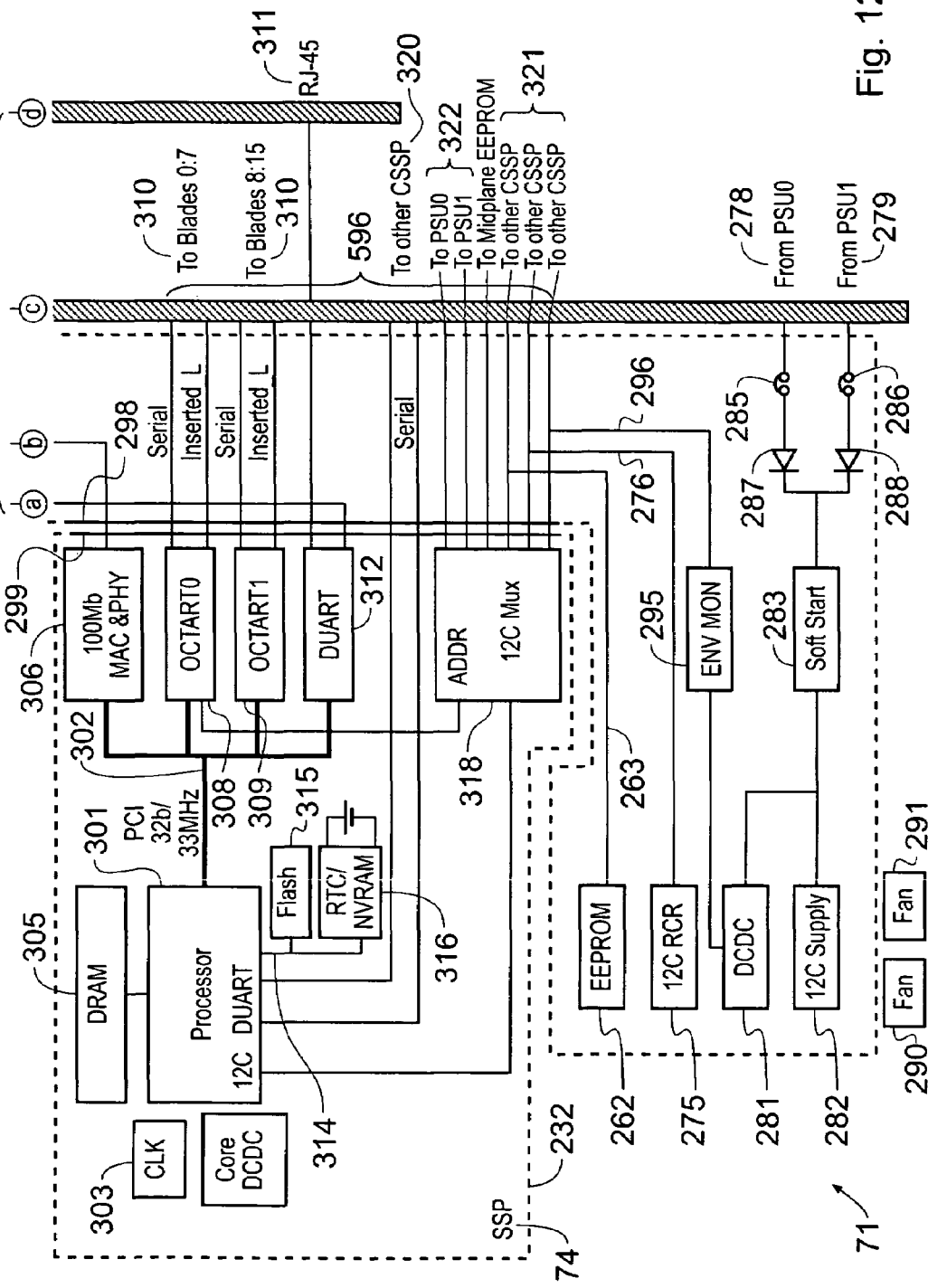
FIG. 12 is a functional block diagram of an example of an information processing subsystem for the combined switch and service processor module of FIG. 6.

With reference to FIG. 12, there now follows a description of an example of a combined switch and service processor (CSSP) 71. In the present example, each CSSP 71 provides the functionality of a Switch 73 and of a Shelf Service Processor, or Shelf Service Processor (SSP) 74.

FIG. 12 provides an overview of the functional components of the CSSP 71 including functional components of the Switch 73 and functional components of the SSP 74. In the present example, most of the components relating to the Switch 73 are mounted on a Switch PCB 231, and the components relating to the SSP 75 are provided on a SSP PCB 232. However, it should be noted that the components located in the lower portion of the switch PCB 321 (i.e., that portion below the SSP PCB 232 as illustrated in FIG. 12 logically belong to the SSP 74, rather than to the switch 73. It will be appreciated that such component arrangements are not compulsory for successful operation and that any other component arrangement over any number of component boards can be easily achieved using conventional component arrangement techniques.

Firstly, with reference to FIG. 12, there follows a description of functional elements of the Switch portions 73 of a CSSP 71 as contained within the CSSP enclosure 121.

The midplane connector 141 on the CSSP 71 establishes the connection between the CSSP 71 and the midplane 171. In the present example, it supports up to 84 connections (pins) that will deliver SERDES outputs 265–268, I2C signals 310, 320, 321 and 322, and power 278, 279. Signal connections may be made through two 20-pair right-angled connectors. Power connections may be made through a right-angled connector. The connector can be configured to facilitate hotswapping of the board, for example with a low insertion force. The connector also uses guide pins to increase the ease of serviceability and prevent module misalignment during insertion.

A switch microprocessor 240 is provided, in the present example the microprocessor used is a Power PC (MPC8245) packaged in a 352 pin Tape Ball Grid Array (TBGA) package. This microprocessor 240 supports between 1 MB and 2 GB of address space in the present example. It further includes an Embedded Programmable Interrupt Controller (EPIC) that provides 5 hardware interrupts (IRQs) or 16 serial interrupts. There are 4 programmable timers with cascade mode function. DRAM memory for the processor can provided in the present example by a commodity DIMM 242. The processor 240 can be connected to a 32 bit PCI bus 241, which operates at, for example, 33 MHz/66 MHz.

A clock input to the processor 240 can be provided by a clock generator (CLK) 243. The CLK 243 can include a configurable clock generator (not shown) implemented as a programmable clock synthesizer employing a crystal used to produce CPU clock signals. The clock frequency can be determined by jumper settings (not shown). A vectored interrupt controller (I-Chip) (not shown) and a configurable core voltage regulator module (VRM) (not shown) can be provided that operate substantially as described above with reference to the like components of FIG. 11.

In the present embodiment two switch ASICs (application specific integrated circuits) 244, 245 are provided (in the present example, BCM5632 Gigabit switch ASICs). Each ASIC can provide twelve GMII Interfaces (1 Gigabit Ethernet) (for uplinks and downlinks) and one 10 Gb XGMII interface for chip-to-chip communication (bridging) 246 between the ASICs 244 and 245. Sixteen GMII 1 Gb 'downlinks', in the form of serialized Gb Ethernet data, are provided through four quad SERDES 248–251 to allow each information processing cartridge 43 to communicate with the switch 73. Eight GMII 1 Gb 'uplinks' are provided for external communication through two quad PHYs 253 and 254 (in the present example BCM5404 ASICs) and RJ45 connectors on the rear panel 122. The ASICs 244 and 245 are configured via a PCI interface (32 bit/33 MHz) to the PCI bus 241.

A Flash PROM 256 can store a real time operating system, and management and configuration data for the microprocessor. The Flash PROM 256 in the present example can be operable to hold 8 MB–16 MB of data, depending on the software required. The flash PROM 256 can be operated via an on-chip XBus 258.

Also connected to communicate with the processor 240 via the XBus 258, a Real Time Clock (RTC) 259 can be provided for real-time functions with a back-up battery.

Also connected to the XBus 258 can be a UART (Universal Asynchronous Receiver Transmitter) 260 which in turn connects to a serial bus 261 for providing an asynchronous console connection from the switch 73 to the SSP 74 which can be accessed by the SSP.

An integrated MAC/PHY (Media Access Control/Physical) switch 271 can provides its own interface to the PCI bus 241. This MAC/PHY switch 271 can connects to a 10/100 Ethernet hub 272. The hub 272 can be operable to provide a management interface to the SSP 74 and a connection from an external management network to the switch 73 and SSP 74 of a given CSSP 71. The connection from the integrated MAC/PHY device 271 to the SSP 74 can be coupled capacitively. A loopback mode can be provided by the MAC/PHY device 271 for system diagnostics. The hub 272 can connect to an RJ45 connector 273 on the rear panel 122 of the CSSP enclosure 121.

An 8 kByte I2C EEPROM 262 can be used to store the FRU-ID and is accessible by the SSP portion 74 of each CSSP 71 via a serial bus 263 and the midplane 171. The upper 2 kByte of the EEPROM 262 can be configured to be write protected.

An I2C Redundant Control Register (RCR) 275 can be used to provide an alternate, redundant path for powering-down the CSSP 71 and Shelf Level Indicators 69 mounted on the front 57 and rear 59 panels of the shelf 41. The I2C RCR 275 can be accessible by both the SSP 74 of the CSSP 71 containing the RCR and the SSP 74 of a further CSSP 71 connected via the midplane 171 via an I2C bus 276. In the present example, a device suitable for use as the RCR 275 is a Phillips PCF8574 IC.

With continued reference to FIG. 12, there now follows a description of functional elements of the Shelf Service Processor (SSP) portion 74 of a CSSP 71 as contained within the CSSP enclosure 121 and provided on SSP PCB 232.

In the present example, communication between the Switch PCB 231 and the SSP PCB 232 is facilitated by an interboard connector pair 298 and 299. It supports connections (pins) for I2C signals, 10/100 MAC/PHY output, and power. As described above, the switch PCB 231 carries the components associated with the switch, and it also carries the power, FRU-ID and environmental monitoring components along with the connectors for connections to the midplane 171 and external connectors. Thus, in the present example, all SSP components requiring a connection to the midplane 171 or an external connection have signal paths routed through the connector pair 298, 299 and via the switch PCB 231 to the relevant midplane or external connectors.

In the present example, the SSP 74 includes a microprocessor 301 (e.g., a Power PC (MPC8245) processor) mounted on the SSP printed circuit board (PCB) 232. The processor 301 can be connected to a PCI bus 302, the present instance a 32 bit bus that operates, for example, at 33 MHz/66 MHz.

A clock input to the processor 301 can be provided by a clock generator (CLK) 303. The CLK 303 can comprise a configurable clock generator (not shown) implemented as a programmable clock synthesizer employing a crystal used to produce CPU clock signals. The clock frequency can be determined by jumper settings (not shown). A vectored interrupt controller (I-Chip) (not shown) and a configurable core voltage regulator module (VRM) (not shown) can be provided that operate substantially as described above with reference to the like components of FIG. 11.

The processor 301 can be provided with a DRAM memory 305. The memory capacity can be chosen to suit the processor addressable memory space. In the present example, 8 MB of DRAM memory is provided.

An integrated MAC/PHY switch 306 can provide its own interface to the PCI bus 302. The MAC/PHY switch 271 can be connected to 10/100 Ethernet hub 272 via the interboard connectors 298, 299. A loopback mode can be provided by the MAC/PHY switch 306 for system diagnostics.

Octal UARTs 308 and 309 can be connected between the PCI bus 302 and the interboard connector pair 298, 299. The signal path can be continued from the interboard connector pair 298, 299 to serial connections 310 on the midplane connector 141 on switch PCB 231. The Octal UARTs 308, 309 can facilitate serial communications between the SSP 74 and each of the processing cartridges 43.

Also connected to the PCI Bus 302 can be a dual UART (DUART) 312 that in turn can connect via the interboard connectors 298, 299 to serial bus 261 for providing an asynchronous console connection from the SSP 74 to the switch 73. The DUART 312 can also have an I2C connection to an external connector on the rear face 122 of the CSSP enclosure 121. The external connector can provide a common operating system/boot console and command port 311.

Connected to the processor 301 via an XBus 314 can be a Flash PROM 315. The Flash PROM 315 can store a real time operating system, and management and configuration data for the microprocessor 301. The Flash PROM 315 can be operable in the present example to hold up to 2 MB of data, depending on the software required.

Also connected to the processor 301 via the XBus 214 can be a real time clock (RTC) 316 for real-time functions with a backup battery. The RTC 316 can also provide 8 kByte of non-volatile random access memory (NVRAM), in the present instance implemented as an EEPROM. This can be used to contain information such as the FRU-ID, a serial number and other FRU information.

To facilitate I2C communications between the SSP 74 and the other CSSP 71, the midplane 171 and the PSUs 81, a multiplexer 318 can be provided. The multiplexer 318 can have a single I2C connection to the processor 301 and connections, via the interboard connector pair 298, 299 and the midplane connector 141 to both PSUs 81, the midplane 171 and the other CSSP 71.

The processor 301 can also comprise an embedded DUART to provide a redundant serial link to the SSP 74 of the other CSSP 71. Although it would be possible to implement this link using an external DUART, the advantage of using an embedded DUART is that the connection to the other CSSP is reliable and therefore likely to be functional. Where the embedded DUART link does not use the I2C Multiplexer for communications to the other CSSP, a common mode of failure for both the SSP-SSP I2C links can be avoided, it being assumed that the processor 301 is likely to be functional even if both embedded DUART channels are non-functional.

The CSSP 71 can powered from two, diode commoned, 9V power supply rails 278 and 279. DC/DC converters 281 can be used to provide the voltage levels required by the CSSP 71. The DC/DC converters 281 can be supplied by dual 9V inputs 278, 279, individually fused 285, 286 and then diode commoned 287, 288. A soft start controller 283 can be provided to facilitate hot-insertion. A 5V DC/DC converter (I2C power regulator) 282 can be turned on as soon as the CSSP 71 is fully inserted. A 3.3V DC/DC converter can be turned on when instructed, for example through SSP service software, by asserting low an appropriate signal (ON_L—not shown). The 3.3V converter can be arranged to turn on a converted for 2.5V, 1.2V, and a processor core voltage rail (Vcore) when the voltages are within an appropriate range.

When the CSSP 71 is inserted the inrush current can be limited, for example to <1 A, and the rate of rise can be configured not to exceed a predetermined value (e.g., 20 A/s) to provide a so called soft start to facilitate hot insertion. The intent is to prevent damage to the connectors and to avoid generating noise. A soft start controller 283, which controls a ramping-up of voltage levels, can be enabled when the predetermined signal (Inserted_L signal) is asserted low, this signal is on a short pin in the connector and is connected to ground (GND—not shown) through the midplane 171 until one of the supplies is removed. These circuits can be configured to withstand an overvoltage at their inputs whilst the input they are feeding is not powered, without any leakage to the unpowered circuit. A sense circuit can detect if the voltage has dropped below a threshold, for example 2.0V, as a result of a blown fuse, a power rail going down, etc. The DC/DC converters 281 can be protected against short circuit of their outputs so that no damage occurs.

The I2C regulator 282 can be powered as soon as the CSSP 71 is fully inserted into the midplane 171. This can be facilitated through short pins connected to the soft start controller 283, which controls a ramping-up of voltage levels. The other DC/DC regulators can be turned on, for example by SSP software.

A pair of fans 290, 291 can provide cooling to the CSSP 71. The fans 290, 291 can be configured to run at full speed to prevent overtemperature conditions by minimizing the temperature of the internal components and the fan. The speed of the fans 290, 291 can be monitored by the SSP 74 through an environmental monitor 295 on the switch board 231. The environmental monitor 295 can be alerted in the event of the fan speed falling below a predetermined value (e.g., 80% of its nominal speed). The fan can provide tachometer outputs to facilitate the measurement of fan speed.

LED indicators 137 can be provided, for example with a green power LED, an amber LED for indicating that service is required and a blue LED for indicating that the switch is ready to be removed. LED indicators integrated on 2×4 stacked RJ45 connectors on the rear face of the CSSP 71 can be arranged, for example, to show green continually when the link is present and flash green when the link is active.

The environmental monitor ENV MON 295 can be provided to maintain operational integrity of the CSSP 71. The ENV MON 295 can include limit values in limit registers and can monitor, for example, temperature within the CSSP enclosure 121, the CSSP power rails, including the 12V, 3V3, Switch Processor Core Voltage, CSSP Processor Core Voltage and the two 9V power feed rails 278, 279 from the midplane 171. The outputs of the DC/DC converters 281 can be fed in to A/D inputs of the ENV MON 295 for Watchdog comparisons to be made to the voltage limits set in the limit registers. As noted above, the ENV MON 295 can also monitor the operating speeds of the fans 290 and 291. The ENV MON 295 can communicate with the SSP 74 of both CSSPs via an I2C bus 296.

For IO to the midplane 171 shown in FIGS. 8A–10, the midplane connector 141 can include sixteen 1 Gb Ethernet connections 265–268 from four quad SERDES 248–251 and the I2C bus lines 596.

The SSP 74 can access the I2C devices (FRU-ID EEPROM, 8-bit I/O expansion chip, and the system hardware monitor) through the midplane 171.

For external IO, rear panel Gb Ethernet connections can be provided from the two quad PHYs 253, 254 to 2×4 stacked RJ45 connectors 139 (to give 8 uplinks). Each port can be an independent 10/100/1000 BASE-T (auto negotiating) port. The PHY devices 253, 254 can operate in GMII mode to receive signals from the 8-Gigabit interfaces on the ASICs 244, 245.

The Power Supply Units (PSUs) 81 can configured such that when two or more PSUs 81 are connected in parallel in the shelf 41, failure of any one of the paralleled units shall not affect system operation. Moreover, one of the PSUs can be installed or removed from a "live" system with or without input power applied. The outputs can have overcurrent protection.

The PSU can have an I2C interface to provide power supply status via the midplane 171. The PSU can have an internal temperature sensor that reports via the I2C interface. The PSU fan speed can also be monitored and errors are reported via the I2C interface. Overvoltage and overcurrent sensors can also report via the I2C interface.

Figure 13:
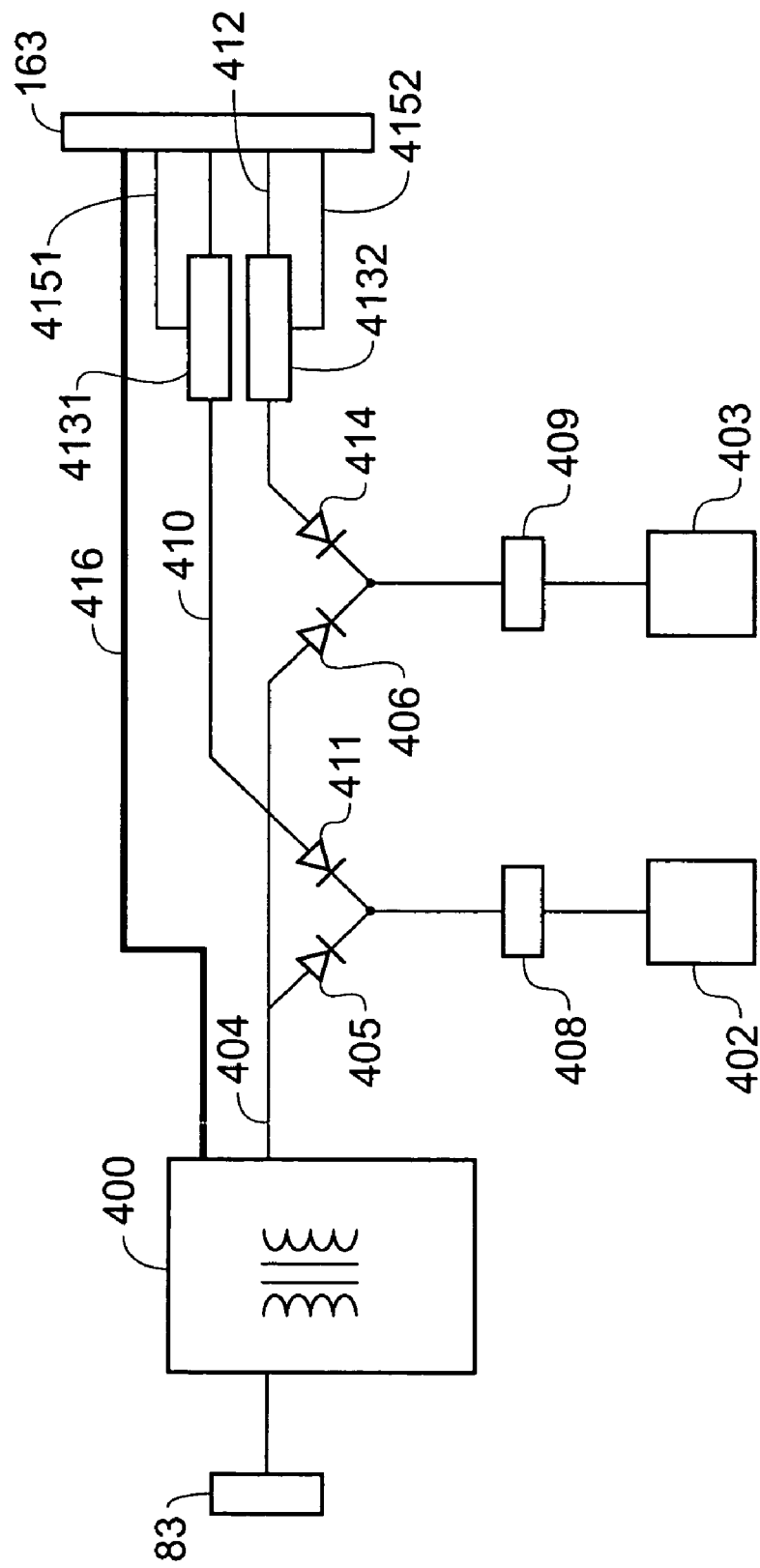
FIG. 13 is a functional block diagram of an example of a subsystem for the power supply unit of FIG. 7.

There now follows a description of aspects of an example of a power supply 81 with particular reference to FIG. 13.

When a power supply (e.g. mains power, or UPS type protected power) is connected to the cable connector 83, transformer, regulator and rectifier circuitry 400 can operate to generate a DC output (in the present example, 12V DC) from the input (in the present example 230/240V 50 Hz AC or 110V 60 Hz AC).

In order to ensure good cooling reliability within the shelf 41, each PSU 81 can have a pair of cooling fans 402, 403 located at the rear of the PSU enclosure as described above with reference to FIG. 7. As a failsafe measure against a failure of one PSU 81, the fans of each PSU 81 can be powered by both PSUs 81. Thus, in the event that one PSU 81 is non-operative to produce the DC supply for the shelf 41, as long as the other PSU 81 is operative, not only will all components of the shelf 41 be powered as normal, the fans of both PSUs 81 can continue to run.

As shown in FIG. 13, this dual powering of cooling fans 402, 403 can be effected by providing a power supply line 404 from the transformer, regulator and rectifier circuitry 400 to power both fans 402, 403. Also, first and second separate power lines 410, 412 from the other PSU 81 can provide duplicate power supply to the first and second fans 402, 403 respectively. The fan 402 can thus be powered by a diode commoned supply from line 404 and a diode commoned supply from line 410. Diode protection can be provided by diodes 405 and 411 respectively. The speed of the fan 402 can be controlled by a speed controller 408. Similarly the fan 403 can be powered by a diode commoned supply from line 404 and a diode commoned supply from line 412. Diode protection can be provided by diodes 406 and 414 respectively. The speed of the fan 403 can be controlled by a speed controller 409.

The two speed controllers 408, 409 can in turn be controlled by a data input from each CSSP 71 received via an I2C bus connection (not shown in FIG. 13). Power supply lines carrying DC power for the other FRUs of the shelf 41 are shown in FIG. 13 as power line 416. All power connections to and from the PSU 81 can connect to the midplane 171 when the PSU is inserted in the shelf 41 via the midplane connector 163. In the present example the PSU 81 connects to the shelf through a 5P/24S/6P configuration SSI-MPS compliant right angle connector 163 at the front face 147 of the PSU 81. Connectors for the I2C interface can also be provided.

The input power line 410 and 412 for each fan 402 and 403 can be provided with a softstart module 4131 and 4132 respectively, to allow for hot insertion of the PSU 81 into the shelf 41. The softstart modules 4131 and 4132 can be controlled, for example, by pulling a signal to ground (e.g., a "mated" input line 4151 and 4152).

Where the two input power lines 410 and 412 are separate lines having separate softstart provision, there is no common failure mode for the backup method of powering the fans 402, 403. Thus even if the PSU 81 ceases to be operable to generate the DC supply add a component (power line or softstart module for example) fails in the supply path from the second PSU 81 to the fans 402, 403, at least one of the fans 402, 403 can remain operational as the shelf 41 still receives the cooling effect of three PSU fans.

In the present example, the power supply has four rear panel LED indicators 137. A blue "Ready to Remove" LED can be driven by the I2C interface and indicate that the power supply may be removed from the system. An amber "Service Required" LED can be driven by the I2C interface and indicate that the power supply is in a fault condition: any output out of range, over-temperature or shutdown. A green "DC Output-OK" indicator can be driven by internal power supply circuits and show that the main 12 volt supply is functioning. The LEDs can remain lighted when individual outputs are in the current limited mode of operation. A green "AC Input-OK" indicator can be driven by internal power supply circuits and show that AC input power is within normal operating range.

Figure 14:
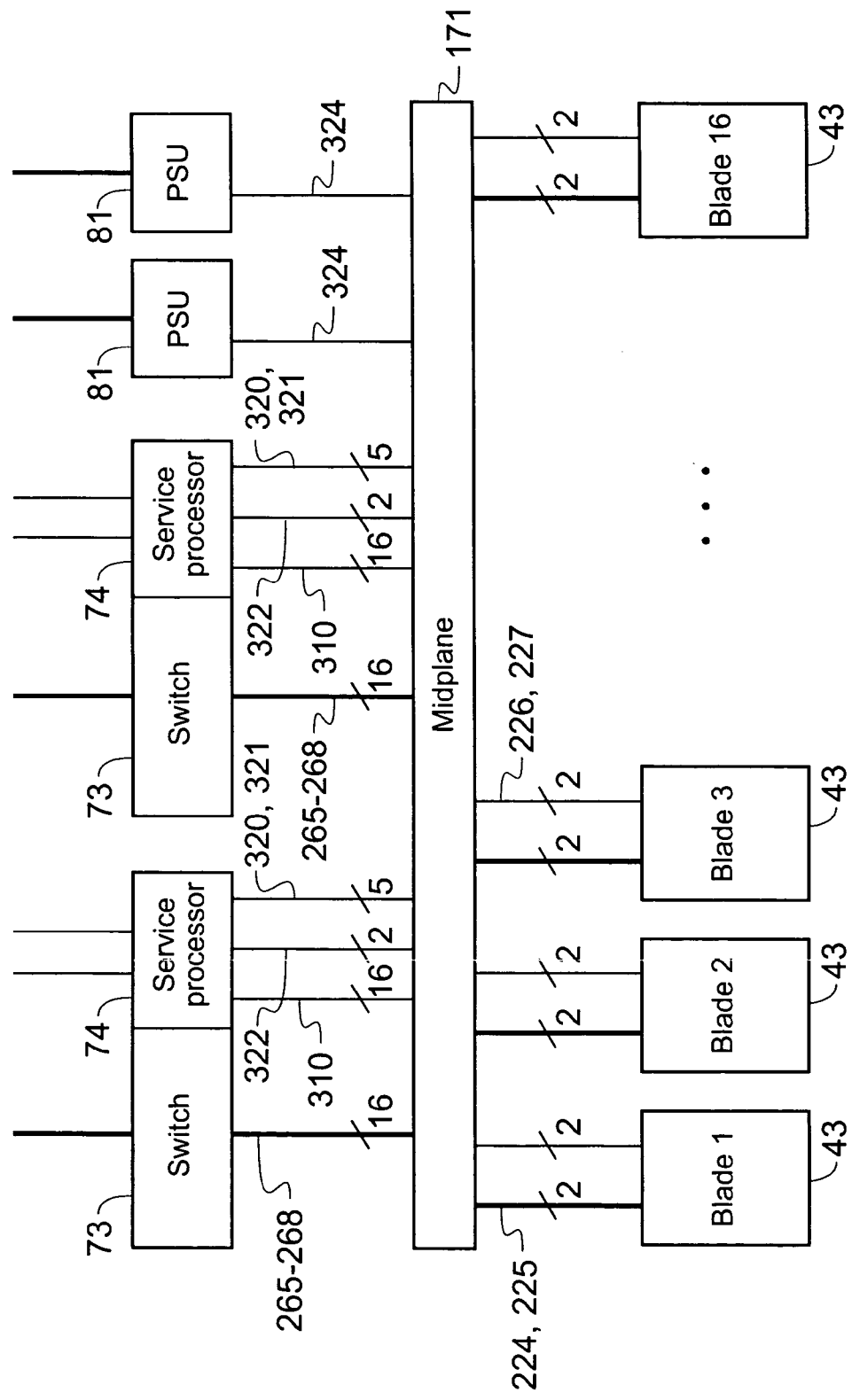
FIG. 14 is a functional block diagram showing the connectivity between the components of the shelf of FIG. 2.

With reference to FIG. 14, there will now be described an example of data connectivity between the FRUs and midplane of the shelf 41. Power transmission paths are not illustrated in FIG. 14. However, it will be appreciated that to facilitate the maximum component redundancy of the shelf 41, each PSU 81 can independently provide power to each FRU.

In the present example each of the processing cartridges (blades) 43 connects to the midplane 171 via a pair of information signal connections (e.g. Gb Ethernet links) 224, 225 and a pair of serial management signal connections 226, 227. Connections within the midplane 171 can ensure that each Ethernet link 224 is directed to a connection 265–268 from the midplane 171 to a first switch 73, and that each Ethernet link 225 is directed to a connection 265–268 from the midplane 171 to a second switch 73. Thus one Ethernet link can be established between each processing cartridge 43 and the switch 73 of each CSSP 71. Further connections within the midplane 171 can ensure that each serial connection 226 is directed to a connection 310 from the midplane 171 to the first SSP 74 and that each serial connection 227 is directed to the second SSP 74. Thus one serial link can be established between each processing cartridge 43 and the SSP 74 of each CSSP 71. As mentioned earlier, information signal connections other than Gb Ethernet connections (e.g. Infiniband connections) could be employed in other examples.

A plurality of serial connections can connect each SSP 74 to the other. Serial lines 320, 321 can connect each SSP 74 to the midplane 171 and connections within the midplane can connect the two sets of lines together. To provide a control interface from the SSPs 74 to the PSUs 81, serial lines 322 can connect each SSP 74 to the midplane 171 and connections within the midplane 171 can connect to serial lines 324 from the midplane 171 to each PSU 81.

Figure 15:
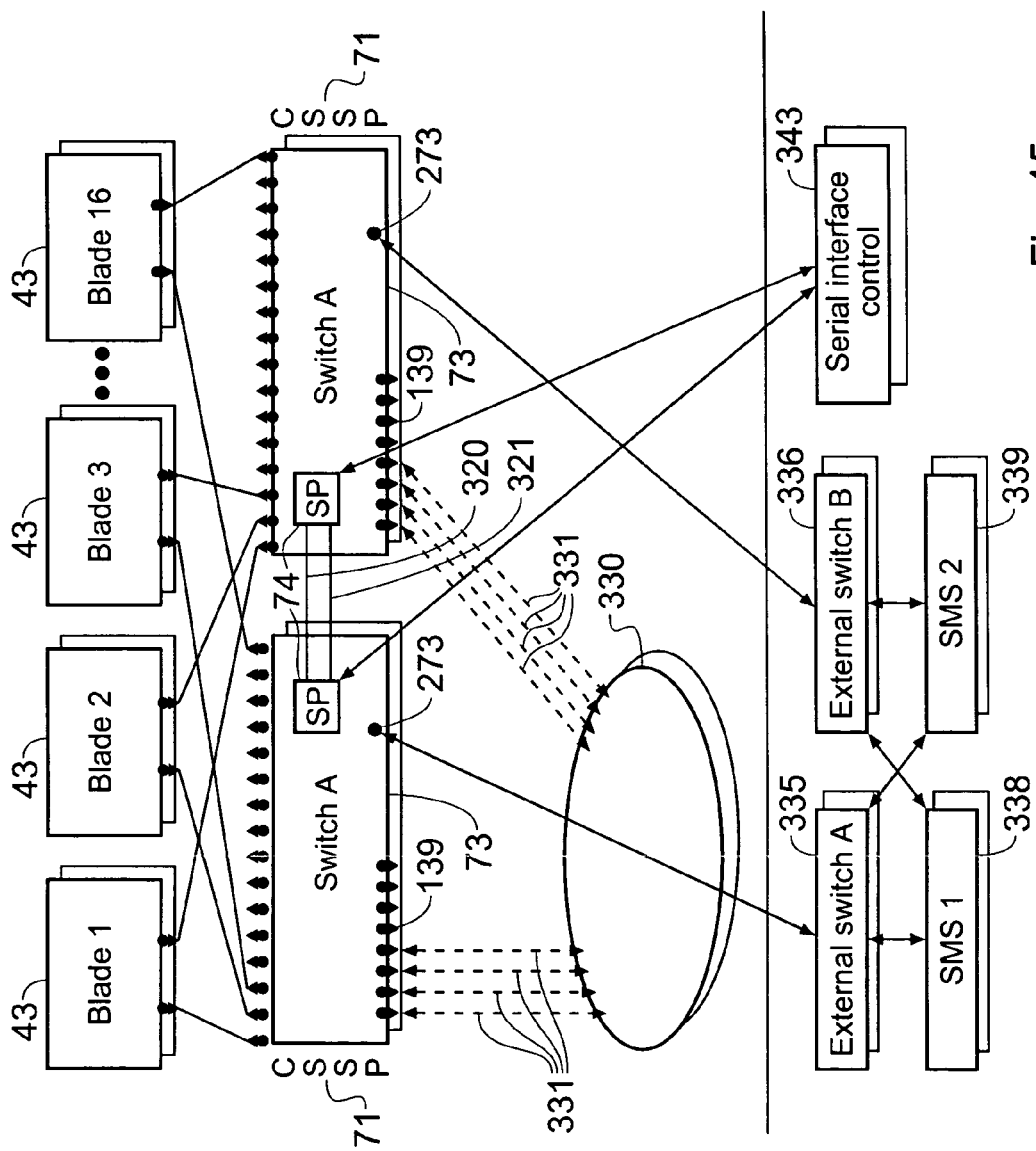
FIG. 15 is a functional block diagram showing the external connectivity of the shelf of FIG. 2.

An example of data and control connectivity of the shelf 41 to and from computer systems external to the shelf 41 when the shelf 41 is arranged for use within a multiprocessor server system such as that described above with reference to FIG. 1 will be described with reference to FIG. 15.

As summarised above with reference to FIG. 14, in the present example each processing cartridge, or blade, 43 is connected to the switch 73 of each CSSP 71 by an information signal connection (e.g. a 1 Gb Ethernet link) formed by a combination of links 224, 225 from the processing cartridge 43 to the midplane 171, connections within the midplane 171 and links 265–268 from the midplane 171 to each switch 73.

Further, in this example a set of serial management signal connections comprising links 320, 321 and connections within the midplane 171 connect the SSP 74 of each CSSP 71 to the SSP 74 of the other CSSP 71.

To provide external data connectivity between the shelf 41 and an external core data network 330, in association with which all information processing performed by the processing cartridges 43 of the shelf 41 is undertaken, connections 331 can be formed between the core data network 330 and the eight 1 Gb Ethernet ports 139 provided on the rear panel 122 of the CSSP enclosure 121.

In the present example, the connections by means of which control and configuration of the shelf 41 are performed are entirely separate to the connections to the core data network 330. Therefore, a first external switch 335 can connect to a management (I2C) port 273 of the first CSSP 71 and a second external switch 336 can connect to a management (I2C) port 273 of the second CSSP 72. As described above with reference to FIG. 12, the management port 273 can provide a management network interface to both the switch 73 and SSP 74 of each CSSP 71. The external switches 335, 336 can each be connected to each of a pair of System Management Server (SMSs) 338, 339. The SMS is not essential to the operation of the shelf 41, but use thereof aids optimal operation of the shelf 41. In a typical multiprocessor server system a plurality of shelves 41 may be connected together via the core data network 330 under the control of a single management network utilising one set of SMSs 338, 339. A set of SMSs 338, 339 may comprise a single SMS (as well as a plurality thereof). However use of at least two SMSs enables redundancy of components, therefore increasing overall system reliability.

A serial interface control 343 operable under telnet protocol control is also connected to the shelf 41 in the present example. This can provide a common operating system/boot console connection to the SSP 74 of both CSSPs 71 via the RJ45 connector 311 on the rear panel 122 of each CSSP enclosure 121.

It will be appreciated from the above that a flexible and scalable modular computer architecture has been described. In the described example up to 16 information processing cartridges, or blades 43, can be configured as sealed FRUs on a single shelf 41, the number of blades being chosen according to customer requirements. Each blade has its own processor and random access memory. If, for example, there is a maximum of 2 Gbytes of memory per information processing cartridge, and one processor per blade, 16 processors (16P) with 5.33 processors per unit height (1U) and a total of 32 GB of memory per shelf can be provided.

In the present example, the shelf 41 incorporates redundant combined switch and shelf service processor modules (CSSPs) 71 and redundant power supply units (PSUs) 81 separate from the blades 43. As the power supplies are carried by the shelf, the information processing cartridges can be kept compact and inexpensive. Also, as a result, they can be powered by DC power only, via the midplane 171.

Also, as mentioned earlier, the FRUs (e.g., the information processing cartridges, or blades, 43, the CSSPs 71 and the PSUs 81) can all be configured as sealed units that do not contain any internal FRUs themselves and do not contain user serviceable items. The enclosures of the FRUs can be arranged to enclose all of the functional components of the FRU with only electrical connectors being externally accessible and with indicator LEDs being externally visible as well.

These factors can all contribute to keeping the cost of the FRUs low, as well as that of the overall system. The modular approach with the use of sealed modular field replaceable units for providing system functionality and with non-field replaceable units designed with a minimum possible number of active components enhances reliability. Moreover, easy and rapid maintenance is facilitated in the event of a failure of a FRU by simple replacement of that FRU, further reducing the cost of ownership.

Thus, it will be appreciated from the above description that the provision of a rack mountable shelf, that includes power supplies, a shelf service processor and switches in modular units, for carrying a number of processing cartridges, wherein the number of processing cartridges can be chosen according to customer requirements, provides a flexible and scalable computer configuration. The balancing of the load between the processors of the processing cartridges can be effected by software using conventional principles.

A configuration as described provides an easily scalable processor architecture, whereby the processing power provided by a complete system based on the information processing cartridge/information processing cartridge carrier architecture can be scalable from moderate to very high capacity through the simple addition of further information processing cartridges.

Figure 16:
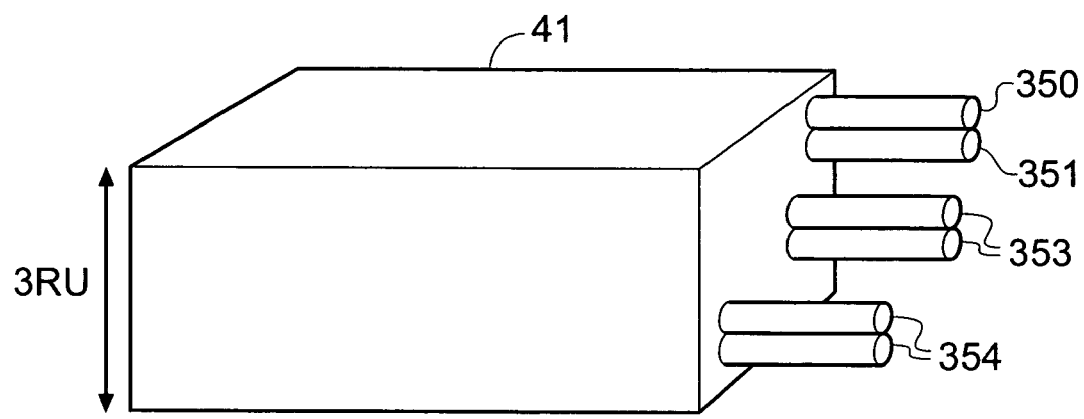
FIG. 16 is a schematic representation of a shelf showing the external connections from the shelf of FIG. 2.

As illustrated in FIG. 16, an example of the external connections from a shelf 41 can be in the form of two active information signal connections (e.g., Ethernet connections) 350 and 351, two active power connections 353 and an active/standby pair of management connections 354. With regard to the management connections, each connection comprises a serial connection and a network (e.g. Ethernet or Infiniband) connection. It is possible to connect to either the active or the standby connection, as the incoming signal will be internally routed to whichever management controller (CSSP) is the current master. It will be appreciated, therefore, that the connections to a shelf can be kept to a minimum. It will further be appreciated from the configuration shown in FIG. 16 that the system is scalable beyond a single shelf unit 41.

Figure 17:
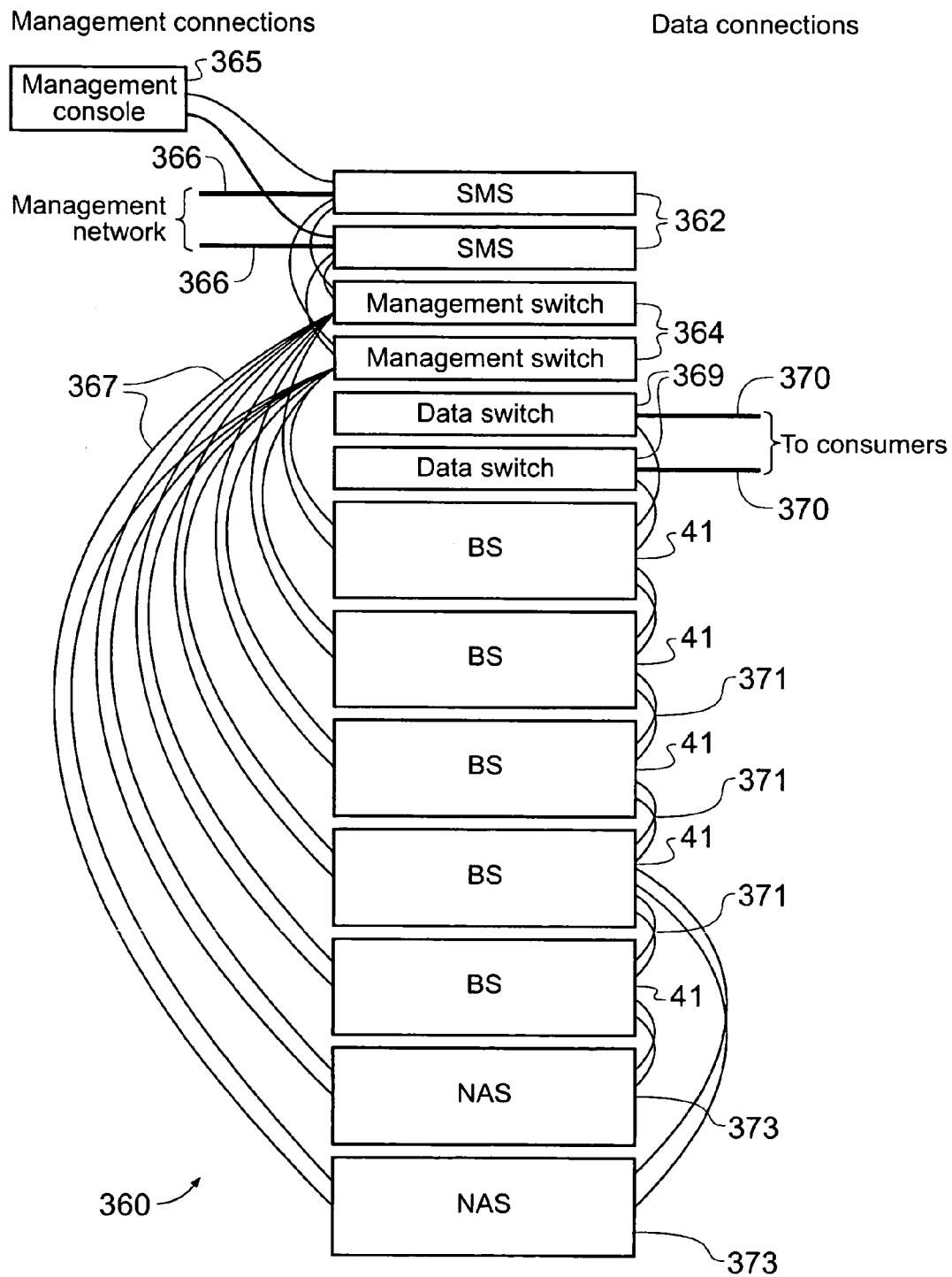
FIG. 17 is a schematic representation of a rack mounted system comprising a plurality of such shelves.

FIG. 17 illustrates how a plurality of shelves can be configured within one (or more) racks to provide even higher processing power. Such a constellation of shelves to provide a large grouping of servers is sometimes termed a "web farm" or "server farm" 360. As shown in FIG. 17, the web farm comprises a plurality of shelves 41 that each carry a plurality of blades 43. Also provided are a plurality of Network Attached Storage devices (NAS) 373 for providing storage for critical data, e.g. email data storage, for the web farm. The NASs 373 are not required if there is no critical data to be stored, e.g. if the web farm is operating solely to provide web caching services.

Management control of the web farm 360 can be provided through a pair of System Management Servers (SMSs) 362. Each SMS 362 can be connected to a management network via a link 366 and to a management console 365. The SMSs 362 can communicate with the individual shelves 41 via a pair of management switches 364. Each shelf 41 and NAS 373 can be connected to each management switch 364 via a connection 367. Thus dual redundant management connections can be provided to each shelf 41 and NAS 373.

Flow of data to and from the web farm 360 can be provided through a pair of data switches 369. Each data switch 369 can be connected to a consumer network via a link 370. It is to be understood that the consumer network can be a larger data network to which the web farm 360 is connected. This network can be an office or corporation intranet, a local area network (LAN), a wide area network (WAN), the Internet or any other network. Connections between the data switches and the shelves 41 can be facilitated by connections 371. It is to be noted that as each shelf has its own switching capability, there is no need for each shelf 41 to be directly connected to the data switches 369. Connections can also be provided to connect the NAS units 373 to the shelves 41. The topology used for interconnection of the data switches 369, shelves 41 and NASs 373 can be any topology providing at least one connection of any length between every possible pair of units. Complex topologies arranged to minimise the maximum connection length between any two given units in the web farm can be used.

The web farm 360 comprising a plurality of shelves 41 with or without a plurity of NASs 373 can suitably be used as any or all of the entry edge server group 9, web edge server group 15 and application servers 19 described above with reference to FIG. 1.

As an alternative to providing critical data storage within a NAS 373, such storage can be provided within one or more NAS cartridges fitted into one or more of the shelves 41 in place of processing cartridges 43. Another alternative is to provide a server shelf with local storage (such as a RAID array (Redundant Array of Inexpensive Disks) in place of the NAS 373.

Thus there has now been described an example of a filly configurable computing system based on a plurality of self contained field replaceable units (FRUs) and scalable from a single processing cartridge with power supply and switching capability to a multiply redundant multiprocessor server system with full system management capability extending over a number of co-operably connected server shelves. It will of course be readily apparent to the skilled reader that many of the specific features specified in the above description are in no way limiting and a variety of alternatives may be produced using only ordinary skill and common general knowledge. Non-limiting examples of example modifications which may be made to the above described system are discussed hereafter.

There is no limit placed on the processing cartridges as to what software they should run. Each module within a shelf or farm may run under the same operating system, or a plurality of different operating systems may be used. Examples of possible operating systems include Sun Microsystems' Solaris® OS or another UNIX™-Type OS such as Linux™, MINIX™, or Irix™, or UNIX™ or a Microsoft OS such as Windows NT™, Windows 2000™, Windows ME/98/95™, Windows XP™.

It is also not necessary that each processing cartridge within a shelf or farm be configured to run the same program software. For example, individual processing cartridges may be configured to execute, for example, fileserver software, mailserver software, webhosting software, database software, firewall software, or verification software.

Although it has been described above with reference to FIGS. 4, 8, 12, 13 and 14, that functionality of a switch and of a shelf service processor should be provided within a single combined switch and service processor unit, this is not essential and separate switch and shelf service processor field replaceable units may be used.

Although it has been described above that a pair of PSUs and a pair of CSSPs may be provided so as to enable dual-redundancy, further PSUs and CSSPs may be provided so as to increase FRU redundancy further, thus providing statistically higher reliability.

In the power supply circuitry in each of the blades and CSSPs, two voltage sense circuits may be provided after the fuses and before the diodes, to prevent a latent fault caused by a failed fuse going undetected until one of the PSUs is removed or taken offline. Such circuits may configured to withstand an overvoltage at their inputs whilst the input they are feeding is not powered, without any leakage to the unpowered circuit.

Figure 18:
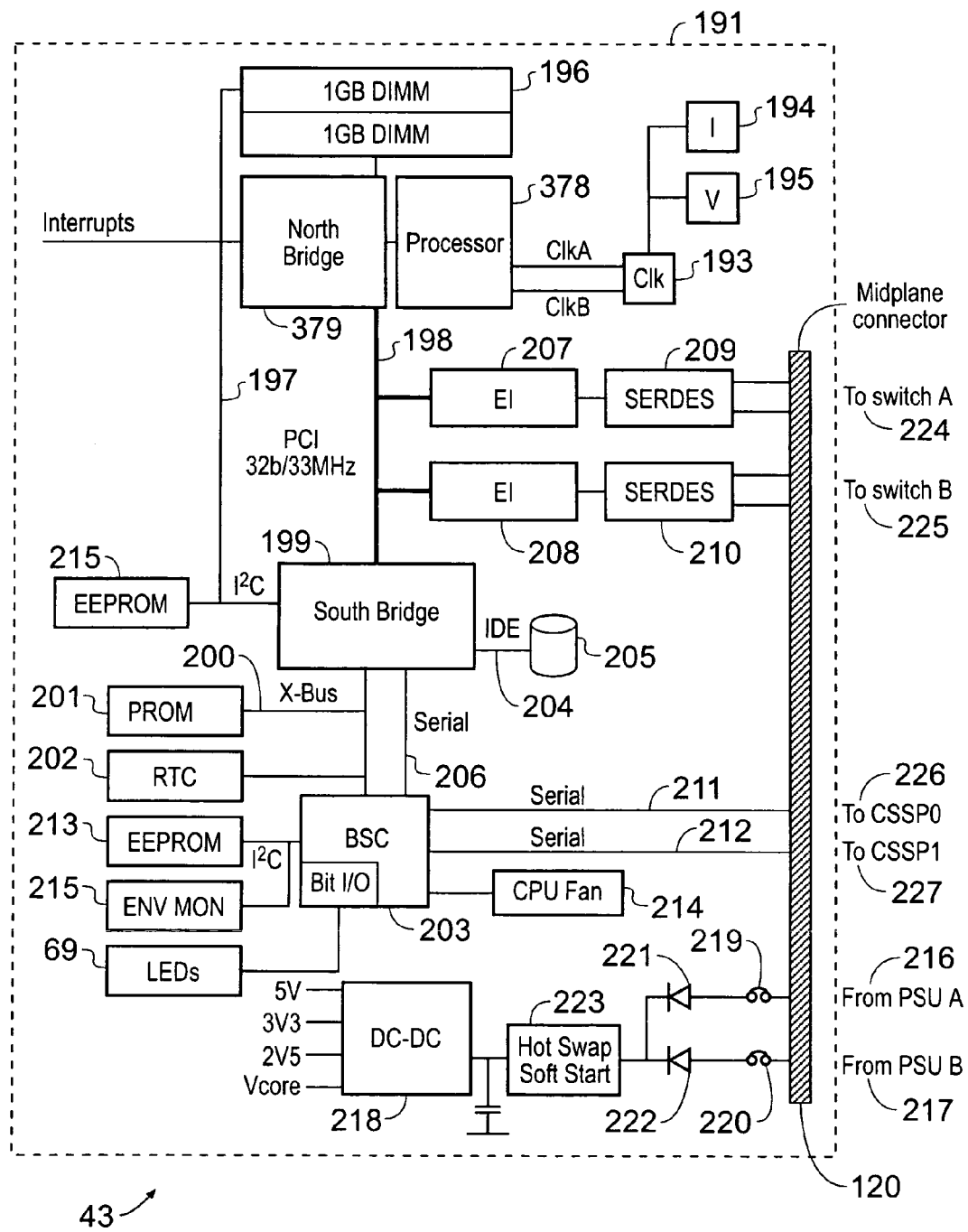
FIG. 18 is a functional block diagram of a further example of an information processing subsystem for the information processing cartridge of FIG. 5.

Although it has been described above with particular reference to FIG. 11 that the processing module may be based on an UltraSPARC™ processor, this is not limiting and any other processor having sufficient processing capacity to undertake the tasks required of a particular processing cartridge may be used. Alternative processors include, but are not limited to, Intel x86 series and compatible processors, AMD x86 compatible processors, Alpha processors and PowerPC processors. The particular example of an x86 compatible processor is described in more detail with reference to FIG. 18. In FIG. 18, the parts corresponding to those of the UltraSPARC™ based system of FIG. 11 have the same reference numerals and will not be described again here. In a system based on an x86 compatible processor, the processor 378 itself communicates with the other components, including the memory 196 and PCI bus 198 via a Northbridge 379. The Northbridge 379 also includes an interrupt controller, so no separate interrupt concentrator is required. The other components of the processing cartridge could be substantially the same as for the UltraSPARC™ based system described above.

Although it has been described above that each information processing cartridge comprises a single microprocessor, this is not a limiting case as each or any of the information processing cartridges may have more than one microprocessor arranged to share common storage resources to operate synchronously (in lockstep) or asynchronously. Also, it is not necessary that all information processing cartridges inserted into a shelf at a given time are identical, rather a variety of different blade architectures may be used simultaneously.

The provision of the functions of both Switch and Shelf Service Processor within a single FRU in the present example provides a facility within a single shelf 41 for dual redundancy in both functions in fewer different FRUs. As will be appreciated, there is no restriction that these two functions must be provided within a single FRU and division of the two functions into separate. FRUs would present no difficulty to the skilled addressee.

The backup power provision for the cooling fans of the PSUs is described above with reference to FIG. 13. Although it is described that the backup power supply to each fan should be independent of the other, if the risk of common mode failure of backup power supply is judged to be low, or is of low importance, then the backup supply to each fan may be provided in common with the backup supply to all other fans.

Also, an information processing module forming a field replaceable server blade can include a processor and memory can be configured by means of software, firmware or hardware to provide a special purpose function. By way of examples only, an information processing module can be configured to perform the function of one or more of a firewall, or a load balancer, encryption and/or decryption processing, an interface to a secure network, e.g. a virtual private network (VPN), a specialized switch with wide area network (WAN) connectability.

Also, a storage blade may be provided. The storage blade can be configured to be mountable in a server blade receiving location in a blade server carrier. The storage blade can comprise storage blade connectors configured for interconnecting with carrier connectors on the server blade carrier, whereby the storage blade is interchangeable with a server blade. A carrier, or shelf, for a server system can be arranged with a plurality of blade receiving locations for receiving blades, wherein the blades can be storage blades or information processing blades. The server system can be self configuring on receipt of the blades according to the type of blade received in each said location. To achieve the blade service controller in each blade can be operable to communicate with a shelf service processor to perform said configuring.

Figure 19:
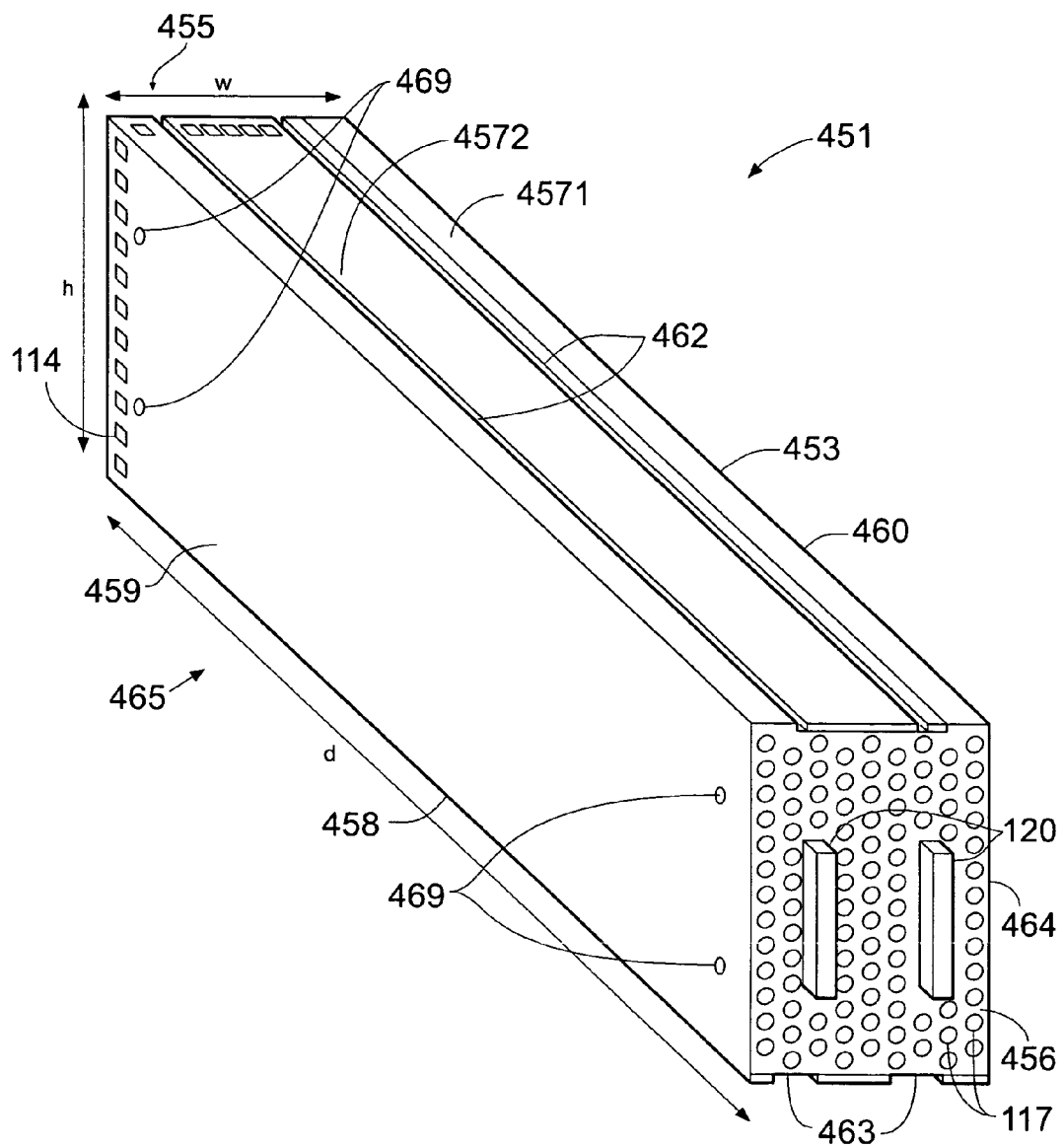
FIG. 19 is a schematic perspective view, partly from the rear, of an example of an information processing cartridge for mounting in the shelf of FIG. 2.

FIG. 19 is a schematic perspective view, partly from the rear, of an example of an information processing cartridge for mounting in the shelf of FIG. 2;

In order to provide a high density of processing cartridges, or blades, in the above described examples, the cartridges have a very narrow form factor. This provides for a very high processor density. However, there are situations where a "standard" information processing cartridge 43 is too compact, or otherwise inappropriate or unsuitable for a particular task or tasks. Accordingly, an example of the present invention can provide a non-standard unit that may be located in the standard shelf. A particular example of a non-standard information processing cartridge 451 is illustrated in FIG. 19. The non-standard processing cartridge 451 is constructed in a similar manner to the standard processing cartridge 43 described above with reference to FIG. 5.

The view shown in FIG. 5 is a perspective view partly from the rear of the non-standard processing cartridge 451. Here it is to be noted that the term "rear" is applied in the context of the position, when installed, of the information processing cartridge, with respect to the shelf 41 (i.e. in this case the "rear" of the information processing cartridge 451 is the innermost part of the information processing cartridge when it is inserted in the shelf 41).

With reference to FIG. 19, it will be noted that the information processing cartridge 451 is three-dimensional having a height (h) width (nw) and depth (d). If, as in the present example, the information processing cartridges are to be arranged in a one-dimensional array (a row) across the shelf 41, then efficient packing for the information processing cartridges 451 is achieved where one dimension (here the width, nw) is smaller than the other dimensions (here the depth, d and the height, h). In contrast to the standard cartridge described above with reference to FIG. 5, the present oversize cartridge therefore has a width n times the width of the standard cartridge.

It will be noted that an enclosure 453 of the present example of an information processing cartridge 451 has six, generally rectangular faces. For convenience only, the face that is visible from the front of the racking when an information processing cartridge 451 is mounted in the shelf 41, is known as the front face 455. The opposite face is known as the rear face 456. In the present example these two faces have the shape of rectangles. The top and bottom faces 457 and 458 and the side faces 459 and 460 are also rectangular and are generally elongate in shape.

The non-standard information processing cartridge 451 shown in FIG. 19 is, as will be recognised, generally similar to the standard information processing cartridge 43 described above with reference to FIG. 5. However, the present non-standard information processing cartridge 451 has a width (nw) which, in the present example, is double that of the standard information processing cartridge 43. Therefore, the present non-standard information processing cartridge 451 will take up the mounting space for two standard information processing cartridges 43 within the shelf 41. Thus the internal volume of the non-standard processing cartridge 451 is considerably increased over that of a standard information processing cartridge 43. In the present example, in order to occupy two slots within the shelf 41, the housing 453 is formed to have a pair of grooves 462 running therealong. Each groove 462 corresponds to the groove 108 of a standard size processing cartridge 43. Thus the guide rails 98 of the shelf 41 will interface with the grooves 462 of the cartridge 451 to aid insertion and removal of the cartridge 451 into and from the shelf 41. Therefore, the oversize cartridge 451 will in general have one groove for each standard processing cartridge receiving location it occupies.

In the present example, the non-standard processing cartridge 451 is constructed from a metal portion 464, which comprises one side face 460 the rear face 456 and a part 4571 of the top face 457 of the cartridge enclosure 453, and a plastic portion 465. The plastic portion 465 comprises the other side face 459, the bottom face 458, the front face 455 and the remaining part 4572 of the top face 457. The plastic and metal portions may be fastened to one another using screws 469. As will be recognised, this construction is substantially the same as the construction of the standard size processing cartridge 43 described above with reference to FIGS. 5A, 5B and 5C. Therefore, a detailed description of the construction will not be repeated here.

The grooves are in the present example are formed in the plastic portion 465 of the enclosure 453. Two top face grooves 462 are formed in the plastic portion 465 top face part 4571 and two bottom face grooves 463 are formed in the bottom face 458.

In alternative arrangements, the non-standard processing cartridge enclosure 453 may be constructed from a plurality of sheets of metal attached to an enclosure chassis to form the desired shape, or attached to one another to form the desired shape. Other alternative constructions include a plurality of metal chassis portions having the grooves formed at junctions therebetween and a metal chassis supporting a plastic enclosure. In the event that the grooves are formed from a metal portion, the grooves may be lined with a plastics material to provide a low friction contact to the guide members of the shelf.

The non-standard information processing cartridge 451 shown in FIG. 19 has two information processing cartridge midplane connectors 120. In general, a non-standard information processing cartridge may have as many midplane connectors 120 as it is standard processing cartridge widths wide, thus n connectors may be provided. Multiple midplane connectors 120 enable the cartridge to receive more power than a standard size cartridge and/or to communicate over two or more connections to the switch 73, thus providing increased data communication bandwidth. Thus two or more times the standard data bandwidth is available for communication into and out of the processing cartridge and two or more times the power input is available to run the components within the oversize cartridge 451.

Although multiple midplane connectors 120 may be provided, in an example of the invention the oversized module only contains a single service controller 203. Also, only one of the connectors includes management connections for the service controller to communicate with the service processor 74 in the CSSP 71. As a result, the CSSP service processor communicates with the oversized cartridge 451 via the management connections in that connector only, with the result that the CSSP service processor 74 recognizes one received module only, and recognizes that as being in the slot (or information processing module receiving location) for that connector. In this manner, even if information communications take place via other connectors, the oversized module is recognized as being in the slot in which the connector with the management connections is located.

Such an increased size cartridge may be utilised by a number of different functions or components. Three illustrative examples of circumstances which a non-standard size cartridge may be suitable are described below.

Firstly, a particular processing cartridge may be required to carry too many components to fit inside a standard processing cartridge. This situation may occur where a particular function is to be implemented which function is not easily distributable across a plurality of processing cartridges but also requires more processing power than a single standard processing cartridge can provide. Functions which are not easily distributable could include functions where high data bandwidth is required between logical components implementing the function but do not require such high bandwidth for communication into or out of the processing cartridge, for example, encryption/decryption engines. Another example might be SMP (symmetric multiprocessor) arrangements. Other examples might be where a particular processing cartridge is to contain a plurality of storage devices (hard disks) for example, or wherein a particularly hot-running processor is to be used, therefore requiring a large heatsink and/or cooling fan. It may be desired that the information processing cartridge be capable of not only causing a flow of cooling air through the housing of the cartridge by means of processor cooling fans but also where a more positive drive of cooling air through the cartridge enclosure is desired through the mounting of one or more fans at one or other end of the information processing cartridge.

Secondly, a function to be performed by a processing cartridge may require more data bandwidth into and out of the processing cartridge than is possible through a single midplane connector. This may occur together with one of the situations described above wherein additional component space is required or in another situation.

Thirdly, a single function may be distributable across a number of standard processing cartridges, but it may be cheaper to use a single more powerful oversize processing cartridge. This situation arises where all the components of more than one processing cartridge are required to carry out the distributable function. As a processing cartridge requires only one enclosure, only one blade service controller, only one set of serial interface drivers and ports and only one power management circuit, no matter how large or small the processing cartridge or how many components it contains, there may be a substantial cost saving in using a single oversize processing cartridge in place of two or more standard processing cartridges.

As shown in FIG. 19, the present non-standard information processing cartridge 451 has two connectors 120 for connecting to a midplane 171. However, while it may not be the case that the components within the information processing cartridge require additional power input or data bandwidth to communicate with the CSSP 71, it may be the case that the additional space provided by an increased width information processing cartridge is required. Therefore, a non-standard information processing cartridge 451 may be provided with a single midplane connector 120 positioned such that when the non-standard processing cartridge 451 is mounted into the two standard-width mounting slots of the shelf 41 the single information processing cartridge 451 is connected to the midplane 171 via just one midplane connector 120. Thus, although the information processing cartridge 451 takes up the mounting space for two standard information processing cartridges 43, only one information processing cartridge connector 175 of the midplane is occupied by the non-standard information processing cartridge.

The blade service controller of a non-standard size processing cartridge is configured, upon start-up to inform the service processor 74 of each CSSP 71 that it is an over-size blade. To effect this, the boot code for the blade service controller of the cartridge may store data describing the physical and logical size of the cartridge. This data is transmitted to each service processor 74 of a modular computer system shelf into which the cartridge is mounted during the boot sequence following powering-up of the cartridge. Upon receiving this data from the cartridge, the service processor 74 can configure the ports of the switch 73 according to the nature of the cartridge as described in the data. This enables the service processor 74 to manage the logical and physical space within the shelf 41 efficiently. If the oversize processing cartridge has more than one midplane connector 120, then the service processor 74 can instruct the switch 73 of each CSSP 71 that two or more of the switch's processing cartridge bound network ports 265, 266, 267, 268 can communicate with the single processing cartridge. In addition, if the processing cartridge takes up the space of two or more standard processing cartridges, but connects through fewer midplane connectors 120 than spaces occupied, the service processor can instruct the switch that one or more of its cartridge bound network ports should be ignored.

In the examples of processing modules described above, a single microprocessor is employed to provide information processing. However, in an embodiment of the present invention provision is made for a plurality of microprocessors.

Figure 20:
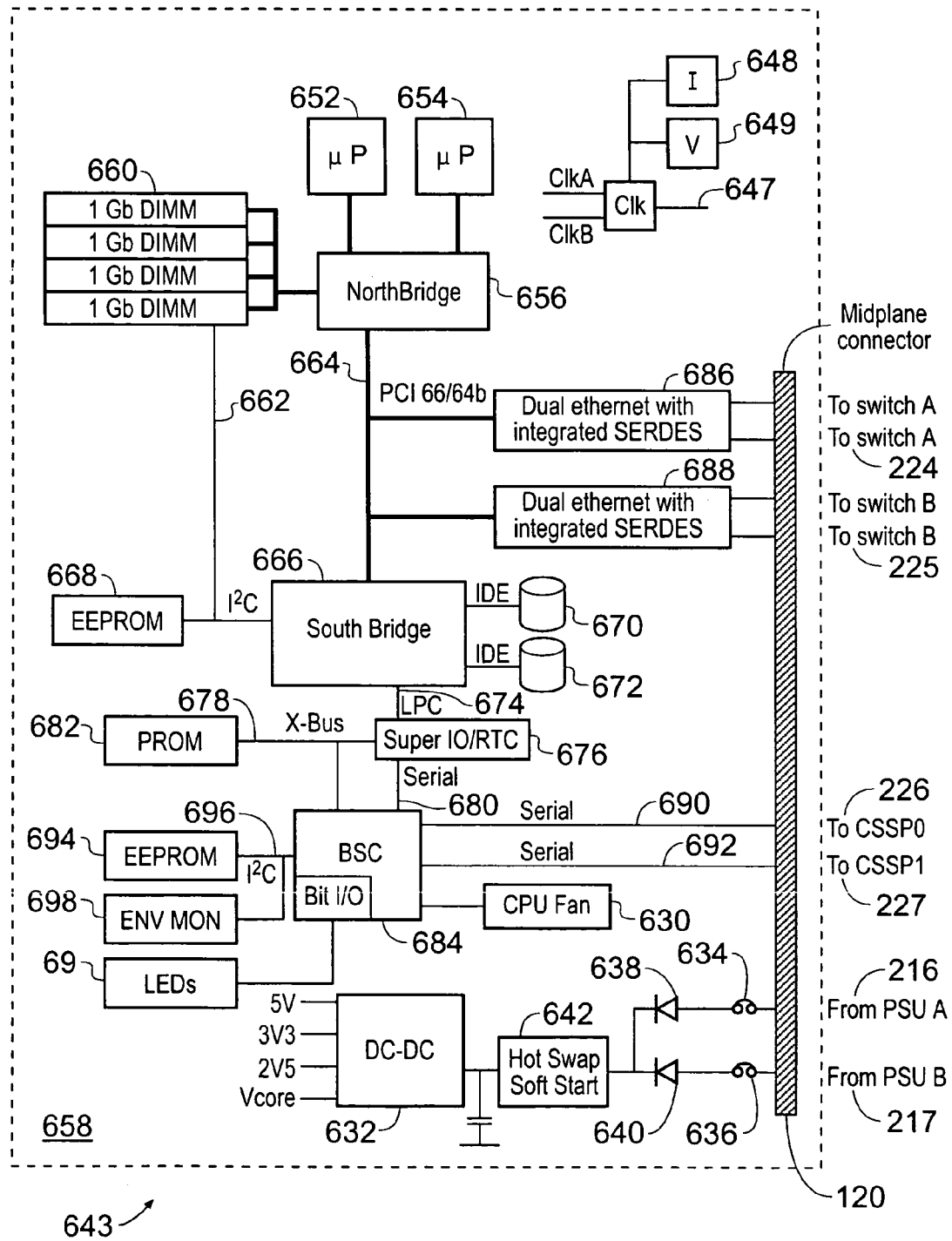
FIG. 20 is a functional block diagram of an example of an information processing subsystem in accordance with the present invention.

FIG. 20 is a description of functional elements of an information processing cartridge 643 provided with two microprocessors within the information processing cartridge enclosure 101 as an example of an information processing module including a plurality of microprocessors for performing information processing within an information processing cartridge.

The example illustrated in FIG. 20 is based on two x86 compatible processors 652 and 654 that are connected to one another via a system controller, or Northbridge bus bridge 656. An example of a Northbridge 656 is an AMD 762 system controller that is available from Advanced Micro Devices, Inc. The Northbridge can provide a bridging function between the high speed processor buses directly from the processors to memory and to a lower speed system bus (e.g., a PCI bus as described below).

Both microprocessors 652 and 654 can be mounted in respective processor sockets, for example on a single information processing cartridge motherboard 658. Alternatively, the processor sockets could be mounted on, for example, respective daughter boards.

A configurable clock generator 647, configured as a programmable clock synthesizer employing a crystal, can be used to produce CPU clock signals, CLKA and CLKB. The clock frequency can be determined by jumper settings (not shown). A vectored interrupt controller (I-Chip) 648 and a configurable core voltage regulator module (VRM) 648 can be provided.

In the present example, memory can be provided in the form of buffered dynamic random access memory (DRAM), for example configured as dual in line memory modules (DIMMs) 660 with a 72-bit data path with error correction codes (ECC), seated in sockets (in the present example four sockets) on a riser card from the information processing cartridge motherboard 658. The memory capacity can be chosen to suit the processor addressable memory space. For example, in the present example, up to 8 Gigabytes (8 GB) of addressable memory can be provided. Serial Presence Detect (SPD) auto-configuration can be provided via a Service Management Bus (SMBus) over an I2C bus 662. The memory is accessible by the processors via the Northbridge 656.

A PCI bus 664 (e.g., a 32 or 64 bit PCI bus) can be employed between the Northbridge and a peripheral bus controller, or Southbridge, 666. An example of a Southbridge is an AMD 762 peripheral bus controller. The Southbridge 666 provides functions such as those described with reference to FIG. 11. In the present example it acts as a secondary bus bridge and as an IO hub. It can provide an system management (SM) Bus interface over the I2C bus 662 for access to the SPD (Serial Presence Detect) feature of the DIMMs that allows initialization of the memory controller and also provides access to an EEPROM 668. It further provides an IDE (Integrated Drive Electronics) interface to first and second IDE hard disks 670 and 672 of an appropriate size for a given application (e.g., 30 GB each). The hard disks 670 and 672 can hold an operating system, for example a Solaris operating system, and other software and data for performing information processing using the information processing processors 652 and 654. The Southbridge further provides an interface to an LPC bus 674 that connects a SuperIO/Real time Clock (RTC) chip 676. The SuperIO/RTC chip 676 provides a further bridging function to an Xbus 678 and to a serial connection 680. The Xbus 678 connects to BIOS chip 682. The BIOS chip 682 call be implemented as a PROM (e.g., 1 MByte Flash PROM) and can hold boot variables and Power-On-Self-Test functionality. The Xbus 678 also connects to an information processing module service controller (BSC) 684. The serial connection 680 also connects to the BSC 684, for providing a serial console interface.

For the transfer of information signals to and from the midplane, two information signal interfaces 686 and 688 are provided in the present example. These can be implemented in any appropriate manner. An information signal interface 686, 688 can be implemented using a dual Ethernet interface with integrated SERializer/DESerializer (SERDES) as described with reference to FIG. 11. As described above, other bus protocols (e.g., Infiniband) can be used. Also, an information signal interface 686, 688 can alternatively be implemented by a suitable integrated device as illustrated in FIG. 20, for example as a Broadcom 5704S dual gigabit Ethernet with integrated SERDES device.

For the transfer of management signals between the BSC 684 and the Service Processor part 74 of the CSSPs 71, serial connections 690 and 692 can be provided.

In the present implementation, the BSC 684 can be implemented as a microcontroller (e.g., a Hitachi H8 microcontroller). As described with reference to FIG. 11, the BSC 684 can provide various functions.

For example it can provide dual access (for the information processing cartridge and the CSSPs 71) to an EEPROM 694 that is accessible over an I2C bus 696 and contains further boot information and a FRU-ID for the information processing cartridge. The EEPROM 694 can be nominally divided into 8 kByte for FRU-ID and 8 kByte for the BSC variables. Write protection for the FRU-ID can be implemented by BSC firmware. Such write protection may be carried out by, for example, acknowledging instructions to write to the protected area, but not to carry out those write instructions.

The BSC 684 can further channel communication between an information processing cartridge 43 and the service processor part of the CSSPs 71. The BSC 684 can further provide; control of power on reset (POR), system reset and externally initiated reset (XIR) to the microprocessors 652 and 654; control of the power, service-required and ready-to-remove LEDs 69 for the information processing cartridge 43; upgrading of field-upgradable firmware, via the serial interface; a watchdog function for the operating system; monitoring the speed of a CPU fan 630, and communications with the EEPROM 668 and the operating system via the Xbus 678.

An environmental monitor sensor 698 can be accessible via the I2C bus 696 from the BSC 684 and can be operable to monitor the CPU and ambient temperatures.

In the present example, the BSC 684 can be powered by a 5V service bus (SB) rail as soon as a CSSP 71 and a PSU 81 are fully inserted into the midplane 171, it then turns on other DC/DC converters 632 to provide power to the remainder of the information processing cartridge 43. A BSC reset signal can be derived from a simple conventional power on reset (POR) generator that monitors a 5V supply rail.

As described with reference to FIG. 11, the information processing cartridge 43 can be powered from two, diode commoned, 9V power supply rails. DC/DC converters 632 can be used to provide the voltage levels required by the information processing cartridge 43. The DC/DC converters 632 are supplied by dual 9V inputs 216, 217, individually fused 634, 636 and then diode commoned 638, 640. A 5V DC/DC converter can be turned on as soon as the FRU is fully inserted, with the BSC 684 and required portions of the Southbridge 666 being powered (the 5VSB rail). A field effect transistor (FET) can be used to gate off the main 5V supply to the rest of the information processing cartridge 43. The DC/DC converter outputs and the main 5V FET can be arranged not to turn on until the BSC 684 turns them on via signal from the Southbridge 666. The Southbridge 666 can be used so that if the BSC 684 is reset (by a watchdog timeout or after a firmware download) the state of the DC/DC converters 632 is not affected. When the remaining outputs from the DC/DC converters 632 are within specification, a PWR_GOOD signal can be asserted low to the BSC 684.

A Southbridge resume circuit can be operable to run from 3V3, and a simple Zener diode dropper circuit can be used to generate 3V3 from the 5VSB supply.

When the FRU is inserted the inrush current can be limited, for example to <1A, and the rate of rise can be configured not to exceed a predetermined value (e.g., 20 A/s) to provide a so-called soft start to facilitate hot-insertion. The intent is to prevent damage to the connectors and to avoid generating noise. A soft start controller 642, which controls a ramping-up of voltage levels, can be enabled when the predetermined signal (Inserted_L signal) is asserted low, this signal is on a short pin in the connector and is connected to ground (GND—not shown) through the midplane 171.

In the present example, one or more fans 630 (e.g., one or more processor fans) can be configured to run at full speed to cool the information processing cartridge 43 and the processors. A separate fan may be provided for each processor, depending on the cooling requirements of the processors. The speed of the fan(s) can be monitored by the BSC 684, using a tachometer sense pin on the microcontroller. In the event of a fan speed falling below a predetermined speed, or percentage of its nominal speed (e.g., 80%), the BSC 684 can be arranged to issue an alert. The nominal speed of the fan(s) can be recorded as part of the BSC EEPROM contents.

The midplane connector 120 for the information processing cartridge 43 is used to establish the connection between the information processing cartridge 43 and the midplane. In the present example it supports up to 84 connections (pins) that will deliver SERDES outputs 224, 225, serial signals 226, 227, and power 216, 217. Signal connections may be made through a right-angled connector. Power connections may be made through the information processing cartridge right-angled connector. The connector can be configured to facilitate hotswapping of the information processing cartridge, for example by having a low insertion force and/or guide pins to increase the ease of serviceability and prevent module misalignment during insertion.

The physical configuration of the components shown in FIG. 20 can be achieved in any appropriate manner. For example, all of the components can be mounted on or with respect to a single motherboard, for example using one or more daughter boards or riser boards (e.g., for processors and the memory chips). Alternatively more than one motherboard could be provided. Indeed, it will be appreciated that many different physical configurations are possible.

A plurality of processor sockets could be provided (i.e. two or more) with the server blade being operable to perform information processing when at least one processor is received in a socket. The BSC can be operable to determine how many processors have been inserted in a respective processing socket by looking at the output from a processor presence output from the processors. An example of a suitable processor presence output is the VID (Voltage Identifier) output provided on many processors which is active when the processor is provided with standby power and identifies the voltage levels which should be supplied to the processor for operation, this output will not have any value if no processor is present. The BSC may be further operable to configure the information processing cartridge according to the number of inserted processors.

Although in the present example a dual processor arrangement has been shown, it will be appreciated that in other examples more than two processors may be provided in an information processing cartridge. Indeed, it will be appreciated that the multiprocessor blade server described with reference to FIG. 20 is but one example of a possible configuration and that many changes and alternative configurations are possible.

Figure 21:
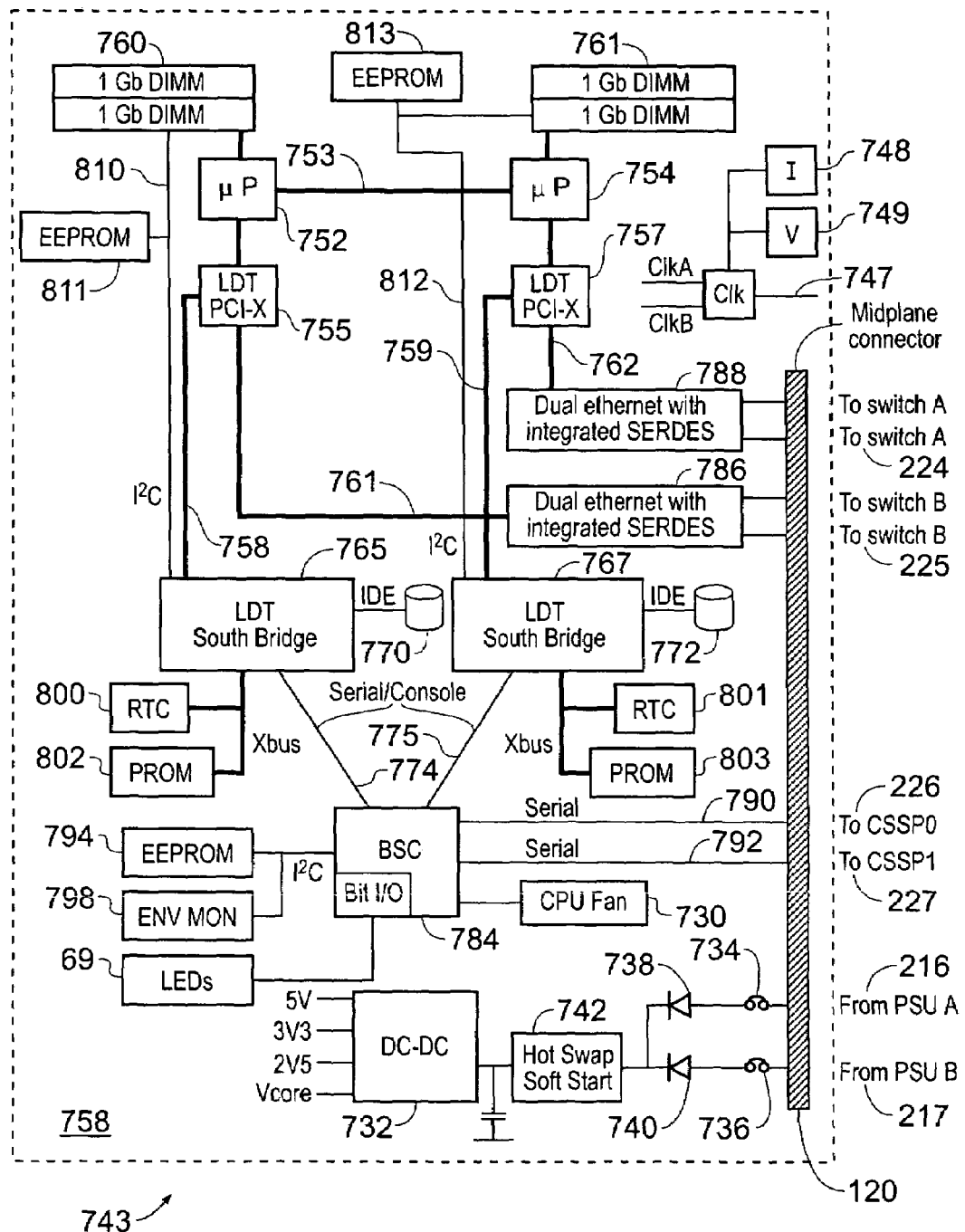
FIG. 21 is a functional block diagram of a further example of an information processing subsystem in accordance with the present invention.

Indeed, FIG. 21 illustrates functional elements of a further example of an information processing cartridge 743. The example shown in FIG. 21 includes a plurality of processors configured as a symmetric multiprocessor, with each processor having its own memory. By way of example only, two microprocessors are provided in an information processing cartridge enclosure.

The example illustrated in FIG. 21 is based on two processors 752 and 754 that are provided with a high speed inter-processor bus 753 interconnecting the processors. Each of the processors is provided with direct access to its own respective working memory. Thus processor 752 can be provided with access to memory 760 and processor 754 can be provided with access to memory 761. In the present example, memory can be provided in the form of buffered dynamic random access memory (DRAM), for example configured as dual in line memory modules (DIMMs) 760 and 761 with a 72-bit data path with error correction codes (ECC), seated in sockets (in the present example four sockets) on riser cards from the information processing cartridge motherboard 758. The memory capacity can be chosen to suit the processor addressable memory space. For example, in the present example, up to 4 Gigabytes (4 GB) of addressable memory can be provided for each processor 760 and 761.

Each of the processors 752 and 753 are connected to a respective bus bridge 755 and 757, respectively. An example of a suitable bus bridge is an LDT/PCI-X bus bridge that can provide a bridging function between the high speed processor bus to the respective processor to a Lightning Data Transport (LDT) IO bus and a PCI-X bus. For example bus bridge 755 can provide a bridging function between the high speed processor bus connected to the processor 752 and an LDT bus 758 and a PCI-X bus 761 and bus bridge 757 can provide a bridging function between the high speed processor bus connected to the processor 754 and an LDT bus 759 and a PCI-X bus 762.

A common configurable clock generator 747, configured as a programmable clock synthesizer employing a crystal, can be used to produce CPU clock signals, CLKA and CLKB. The clock frequency can be determined by jumper settings (not shown). A vectored interrupt controller (I-Chip) 748 and a configurable core voltage regulator module (VRM) 748 can be provided. Alternatively, each processor 752 and 754 could be provided with respective clock generation circuitry.

In the present example the bus bridge 755 is connected via an LDT bus 758 to a peripheral bus controller 765. An example of a peripheral controller is an LDT Southbridge. The LDT Southbridge 765 provides functions such as those described with reference to FIG. 11. In the present example it acts as a secondary bus bridge and as an IO hub.

It can provide a system management (SM) Bus interface over an I2C bus 810 for access to an SPD (Serial Presence Detect) feature of the DIMMs that allows initialization of the memory controller and also provides access to an EEPROM 811. It further provides an IDE (Integrated Drive Electronics) interface to an IDE hard disks 770 of an appropriate size for a given application (e.g., 30 GB). The hard disk 770 can hold an operating system, for example a Solaris operating system, and other software and data for performing information processing, using the information processing processor 752. The Southbridge 765 further provides an interface via a bus 774 to an information processing cartridge service controller (BSC) 784.

The SouthBridge 765 further masters an Xbus to which are connected to a real time clock 800 and a PROM 802 for storing boot configuration information for the southbridge 765, the LDT/PCI-X bus bridge 755 and the processor 752. The SouthBridge 765 also has an I2C 810 connection to the memory 760 and EEPROM 811.

For the transfer of information signals to and from the midplane, the bus bridge 755 provides a PCI-X 761 interconnection to an information signal interface 786. This can be implemented in any appropriate manner. For example, the information signal interface 786 can be implemented using a dual Ethernet interface with integrated SERializer/DESerializer (SERDES) as described with reference to FIG. 11.

As described above, other bus protocols (e.g., Infiniband) can be used. An information signal interface can alternatively be implemented by a suitable integrated device as illustrated in FIG. 21, for example as a Broadcom 5704S dual gigabit Ethernet with integrated SERDES device.

Similarly, in the present example the bus bridge 757 is connected via an LDT bus 759 to a peripheral bus controller 767. The LDT Southbridge 767 provides functions such as those described with reference to FIG. 11. In the present example it acts as a secondary bus bridge and as an IO hub.

It can provide a system management (SM) Bus interface over an I2C bus 812 for access to an SPD (Serial Presence Detect) feature of the DIMMs that allows initialization of the memory controller and also provides access to an EEPROM 813. It further provides an IDE (Integrated Drive Electronics) interface to an IDE hard disks 772 of an appropriate size for a given application (e g., 30 GB). The hard disk 772 can hold an operating system for example a Solaris operating system, and other software and data for performing information processing using the information processing processor 754. The Southbridge 767 further provides an interface via a bus 775 to the information processing cartridge service controller (BSC) 784.

The SouthBridge 767 further masters an Xbus to which are connected a real time clock 801 and a PROM 803 for storing boot configuration information for the southbridge 767, the LDT/PCI-X bus bridge 757 and the processor 754. The SouthBridge 767 also has an I2C 812 connection to the memory 761 and EEPROM 813.

For the transfer of information signals to and from the midplane, the bus bridge 757 provides a PCI-X 762 interconnection to an information signal interface 788. This can be implemented in any appropriate manner. For example, the information signal interface 788 can be implemented using dual Ethernet interface with integrated SERializer/DESerializer (SERDES) as described with reference to FIG. 11. As described above, other bus protocols (e.g., Infiniband) can be used. Also, an information signal interface can alternatively be implemented by a suitable integrated device as illustrated in FIG. 21, for example as a Broadcom 5704S dual gigabit Ethernet with integrated SERDES device.

For the transfer of management signals between the BSC 784 and the Service Processor part 74 of the CSSPs 71, serial connections 790 and 792 can be provided.

In the present implementation, the BSC 784 can be implemented as a microcontroller (e.g., a Hitachi H8 microcontroller). As described with reference to FIG. 11, the BSC 784 can provide various functions.

For example it can provide dual access (for tie information processing cartridge and the CSSPs 71) to an EEPROM 794 that is accessible over an I2C bus 796 and contains further boot information and a FRU-ID for the information processing cartridge. The EEPROM 794 can be nominally divided into 8 kByte for FRU-ID and 8 kByte for the BSC variables. Write protection for the FRU-ID can be implemented by BSC firmware. Such write protection may be carried out by, for example, acknowledging instructions to write to the protected area, but not to carry out those write instructions.

The BSC 784 can further channel communication between an information processing cartridge 43 and the service processor part of the CSSPs 71. The BSC 784 can further provide: control of power on reset (POR), system reset and externally initiated reset (XIR) to the microprocessors 752 and 754; control of the power, service-required and ready-to-remove LEDs 69 for the information processing cartridge 43; upgrading of field-upgradable firmware, via the serial interface; a watchdog function for the operating system; monitoring the speed of one or more CPU fans 730, and communications with the EEPROM 794 and the operating system(s) via the serial lines 774, 775.

An environmental monitor sensor 798 can be accessible via the I2C bus 796 from the BSC 784 and can be operable to monitor the CPU and ambient temperatures.

In the present example, the BSC 784 can be powered by a 5V service bus (SB) rail as soon as a CSSP 71 and a PSU 81 are fully inserted into the midplane 171, it then turns on other DC/DC converters 732 to provide power to the remainder of the information processing cartridge 43. A BSC reset signal can be derived from a simple conventional power on reset (POR) generator that monitors a 5V supply rail.

As described with reference to FIG. 11, the information processing cartridge 43 can be powered from two, diode commoned, 9V power supply rails DC/DC converters 732 can be used to provide the voltage levels required by the information processing cartridge 43. The DC/DC converters 732 are supplied by dual 9V inputs 216, 217, individually fused 734, 736 and then diode commoned 738, 740. A 5V DC/DC converter can be turned on as soon as the FRU is fully inserted, with the BSC 784 and required portions of the Southbridge 666 being powered (the 5VSB rail). A field effect transistor (FET) can be used to gate off the main 5V supply to the rest of the information processing cartridge 43. The DC/DC converter outputs and the main 5V FET can be arranged not to turn on until the BSC 784 turns them on via a signal from the both Southbridges 765 and 767. The Southbridges 765 and 767 can be used so that if the BSC 784 is reset (by a watchdog timeout or after a firmware download) the state of the DC/DC converters 732 is not affected. When the remaining outputs from the DC/DC converters 732 are within specification, a PWR_GOOD signal can be asserted low to the BSC 784.

A Southbridge resume circuit can be operable to run from 3V3, and a simple Zener diode dropper circuit can be used to generate 3V3 from the 5VSB supply.

When the FRU is inserted the inrush current can be limited, for example to <1A, and the rate of rise can be configured not to exceed a predetermined value (e.g., 20 A/s) to provide a so-called soft start to facilitate hot-insertion. The intent is to prevent damage to the connectors and to avoid generating noise. A soft start controller 742, which controls a ramping-up of voltage levels, can be enabled when the predetermined signal (Inserted_L signal) is asserted low, this signal is on a short pin in the connector and is connected to ground (GND—not shown) through the midplane 171.

In the present example, one or more fans 730 (e.g., processor fans) can be configured to run at full speed to cool the information processing cartridge 43 and the processors. A separate fan may be provided for each processor, depending on the cooling requirements of the processors. The speed of the fan(s) can be monitored by the BSC 784, using a tachometer sense pin on the microcontroller. In the event of a fan speed falling below a predetermined speed, or percentage of its nominal speed (e.g., 80%), the BSC 784 can be arranged to issue an alert. The nominal speed of the fans can be recorded as part of the BSC EEPROM contents.

The midplane connector 120 for the information processing cartridge 43 is used to establish the connection between the information processing cartridge 43 and the midplane. In the present example it supports up to 84 connections (pins) that will deliver SERDES outputs 224, 225, serial signals 226, 227, and power 216, 217. Signal connections may be made through a right-angled connector. Power connections may be made through the information processing cartridge right-angled connector. The connector can be configured to facilitate hotswapping of the information processing cartridge, for example by having a low insertion force and/or guide pins to increase the ease of serviceability and prevent module misalignment during insertion.

In the example shown in FIG. 21, each of the processors 752 and 754 can operate as separate processor domains, so that the processors 752 and 754 can be configured as a cluster with a high speed interconnection via the high speed inter-processor bus 753. As a result, the server blade comprises two separate compute domains having a high speed link therebetween.

One application of such an arrangement is as a fault tolerant cluster, where each processor performs and the same tasks and also monitors to the operation of the other processor so that in the event of one of the processors failing, the other processor can recognise this and continue processing, while reporting the fault in the other processor. The processors can be controlled by their operating software to check each other's operation at specific processing points or timings. Such a fault tolerant operation could possibly be performed under lockstep, that is where the processors are controlled by a common clock and, during normal fault free operation, they operate in parallel. The arrangement of the present example is particularly suited to a clustering application as the high speed link between the two compute domains allows very fast failover. An example omitting the high speed link may also be operated as a cluster provided that a communications channel exists between the domains, however such an arrangement may not be capable of performing failover as quickly as the arrangement of the present example. Thus a computer system requiring high availability may be provided which has a high tolerance to failures affecting only one processor at a time, particularly software errors.

Another application is where the processors perform related but different operations, particularly where there is a need for the exchange of information between those processes. In such a configuration the benefit can be gained from the high speed inter-processor connection 753.

In such a configuration, as each of the processors 752 and 754 operates as a respective processor domain, the BSC 784 is operable to act as a console router to route console data to and from the processors over the serial connections 790 and 792. Accordingly, it can provide console multiplexing/demultiplexing functions for routing packets of console information on the basis of addresses contained in those packets.

A "console" is a conventional feature provided by an operating system for a processor domain. A console provides a serial "command line" interface where system error messages can be reported. The console can also be used for system configuration tasks such as, for example, resolving system boot problems and providing operating system installations and/or upgrades. An access to the consoles will typically be required by a system operator located remotely for example at the management console 365 shown in FIG. 17, and the console path to the operating systems of the respective processors 752 and 754.

The processors can be selectively configurable as separate domains or as a single domain. This is controllable by the blade service controller, in response for example to commands received remotely via the serial management connections 790/792. In response to the configuration, the routing of the console commands will be changed appropriately. This applies equally to the example of FIG. 20 described above. A decision as to whether a plurality of processor are to be configured as multiple separate compute domains or a single multiprocessor compute domain may be made by a higher management entity, such as the SSP 74 or the SMS shown in FIG. 17 above. It may be desirable to configure a multiprocessor server blade as separate compute domains if the server blade is to be used for applications optimised for single processor operation, for example many web caching applications. Similarly it may be desirable to configure a multiprocessor server blade as a single compute domain if the server blade is to be used for applications optimised for multiple processor operations, for example many database applications.

The configuration of the server blade into one or more compute domains may be effected at initialisation of the server blade, and thus the configuration may be altered at any re-initialisation of the blade. The initialisation procedure may be implemented as follows. At boot, each processor domain boots separately using the configuration information stored in its respective boot PROM 802, 803. Once the boot process reaches a predetermined stage, each processor domain asks the BSC 784 what mode to operate in. If the BSC 784 informs the processor domains that they are to operate as separate compute domains, each processor domain continues to boot independently. On the other hand, if the BSC 784 informs the processor that they are to operate as a single compute domain, then one processor domain becomes the master and the other becomes the slave with the master controlling the remainder of the boot process and subsequent operation The BSC 784 is programmed with the instruction to boot independently or symmetrically by a higher management entity such as the SSP 74 or the SMS described with reference to FIG. 17 above.

Also, the information processing cartridge can be operable with only one processor present, whereby the BSC 684, 784 is able to detect the number of processor present using a processor presence output as described above and to report this via the serial management connections to the shelf service processor(s) 74. The routing of console commands is also controlled appropriately accordingly to the number of processors 652, 752 and 654, 754 present.

The physical configuration of the components shown in FIG. 21 can be achieved in any appropriate manner. For example, all of the components can be mounted on or with respect to a single motherboard, for example using one or more daughter boards or riser boards (e.g., for processors, possibly with associated bus bridges, and/or the memory chips). Alternatively separate motherboards could be provided for each processor, with secondary board for the common components. Indeed, it will be appreciated that many different physical configurations are possible.

Although in the example two processors are provided, other examples could include more processors. Also, a plurality of sockets and processor subsystems (processor and memory) could be provided (i.e. two or more) with the server blade being operable to perform information processing when at least one processor is received in a socket of a processor subsystem. The BSC can be operable to determine how many processors have been inserted using a processor presence output as described above and to configure the information processing cartridge according to the number of inserted processors.

The sizing of the information processing cartridge will depend on the size and cooling requirements of the processor and the associated circuitry and components. In some cases it may be possible to package the dual processor arrangements in a standard size information processing cartridge enclosure. However, in other cases, it may be necessary to employ an oversized enclosure, for example as described with reference to FIG. 19, in order to accommodate the components and/or to provide adequate cooling. In this regard, it will also be appreciated that an appropriate number of fans can be provided to provide appropriate cooling in a known manner based on the thermal characteristics of the components used in a particular embodiment and the environmental considerations for an application of that embodiment.

There has been described an information processing module such as a server blade provided with an enclosure. The module can be provided with a plurality of processors in the enclosure. The module can be configured as a field replaceable unit removably receivable in a carrier of a modular computer system, for example a high density blade server system. The enclosure for such a multiprocessor server blade module can be larger that a standard enclosure for a single processor server blade. The carrier can be configured to receive such an oversized server blade enclosure as well as a standard enclosure.

There has also been described an information processing module such as a server blade provided with an enclosure. The module can be provided with a plurality of processors in the enclosure. The module can be configured as a field replaceable unit removably receivable in a carrier of a modular computer system, for example a high density blade server system. The enclosure for such a multiprocessor server blade module can be larger that a standard enclosure for a single processor server blade. The carrier can be configured to receive such an oversized server blade enclosure as well as a standard enclosure.

There has further been described an information processing module such as a server blade provided with an enclosure. The module can be provided with a plurality of processors in the enclosure. The module can be configured as a field replaceable unit removably receivable in a carrier of a modular computer system, for example a high density blade server system. The enclosure for such a multiprocessor server blade module can be larger that a standard enclosure for a single processor server blade. The carrier can be configured to receive such an oversized server blade enclosure as well as a standard enclosure.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A server blade including an enclosure, wherein the server blade comprises:
   a plurality of processors operable to perform information processing in the server blade; and
   a service controller in the enclosure configured to provide system management functions for the server blade, wherein the service controller is coupled to at least one management signal connection accessible externally to the processors, wherein the service controller is operable to configure the processors as separate domains or as a single domain depending upon commands received remotely via the management signal connection, wherein the service controller is further configured to provide a signal indicative of at least physical dimensions of the server blade to a management system remote from the server blade.

2. The server blade of claim 1, wherein each processor is connected, in the enclosure, to a common memory via a bus bridge.

3. The server blade of claim 1, wherein each processor is connected, in the enclosure, to a common blade bus via a bus bridge.

4. The server blade of claim 3, comprising at least one common information signal interface in the enclosure that is connected to the common blade bus and provides an interface to an information signal connection accessible externally to the enclosure.

5. The server blade of claim 3, comprising a respective storage device for each processor connected to the common blade bus via a bus bridge.

6. The server blade of claim 1, wherein the service controller is operable, when the server blade is received in the carrier, to communicate, via said at least one management signal connection, at least information indicative that it is provided with a plurality of processors.

7. The server blade of claim 1, wherein the enclosure is configured as an oversized unit to span a plurality of standard information processing module receiving locations in the carrier.

8. The server blade of claim 1, wherein a width dimension of the server blade enclosure is greater than a corresponding width dimension of a standard information processing module receiving location in the carrier.

9. The server blade of claim 1, wherein the enclosure provides electromagnetic shielding for components contained therein.

10. The server blade of claim 1, configured to be hot swappable.

11. A server blade comprising:
    a plurality of processors operable to perform information processing in the server blade, wherein the processors being provided with an inter-processor interconnect, wherein each processor is configurable to operate as an independent domain, and wherein the inter-processor interconnect is operable to directly interconnect the processor; and
    a service controller configured to provide system management functions for the server blade, wherein the service controller is further configured to provide a signal indicative of at least physical dimensions of the server blade to a management system remote from the server blade;
    wherein the server blade is configured as a field replaceable unit removably receivable in a carrier of a modular computer system.

12. The server blade of claim 11, wherein the processors are operable to send information directly from one processor to the other via the inter-processor interconnect.

13. The server blade of claim 11, wherein the inter-processor interconnect is configurable to provide at least one of a synchronisation function and a failover function between the processors.

14. The server blade of claim 13, wherein each processor is configured to perform the same tasks as the other processor and to monitor an operation of the other processor via the inter-processor interconnect, wherein in response to a first processor detecting a fault in the second processor the first processor is configured to continue the operations and to report the fault.

15. The server blade of claim 11, wherein each processor is associated with respective IO.

16. The server blade of claim 11, wherein each processor is connected to a respective bus bridge.

17. The server blade of claim 16, wherein each bus bridge is connected via a respective bus to a respective information signal interface and provides an interface to an information signal connection accessible externally to the enclosure.

18. The server blade of claim 11, wherein each processor is associated with a respective storage device.

19. The server blade of claim 11, wherein the service controller being connected to at least one management signal connection accessible externally to the processor.

20. The server blade of claim 19, wherein the service controller is operable to provide console routing for console packets to respective processor domains.

21. The server blade of claim 19, wherein the service controller is operable to configure the processors as separate domains or as a single domain depending upon commands received remotely via the management signal connection.

22. A server blade configured as a field replaceable unit removably receivable in a carrier of a modular computer system, the server blade being selectively configurable to provide a number of information processing domains selected from at least one and two information processing domains, wherein the server blade includes a service controller configured to provide system management functions for the server blade, wherein the service controller is configured to provide a signal indicative of at least physical dimensions of the server blade to a management system remote from the server blade.

23. The server blade of claim 22, wherein each information processing domain includes a processor subsystem including at least one processor and memory.

24. The server blade of claim 23, wherein each information processing domain further includes an IO subsystem.

25. The server blade of claim 24, wherein each IO subsystem includes at least one bus bridge and at least one storage device.

26. The server blade of claim 24, wherein each IO subsystem includes a respective information signal interface to provide an interface to an information signal connection accessible externally to the server blade.

27. The server blade of claim 22, comprising a plurality of processor sockets, that can selectively be populated.

28. The server blade of claim 22, wherein each processor subsystem is provided on a respective circuit board.

29. The server blade of claim 22, wherein the service controller is operable to provide console routing for console packets to respective processor domains.

30. The server blade of claim 22, comprising a plurality of processors configurable as symmetric multiprocessors and the service controller is operable to cause the processors to be configured as symmetric multiprocessors.

31. The server blade of claim 22, comprising an enclosure.

32. An information processing cartridge comprising an enclosure that encloses a processor subsystem including a plurality of processors operable to provide information processing in the information processing cartridge, the information processing cartridge being configured as a field replaceable unit removably receivable a carrier operable to receive a plurality of information processing cartridges, wherein the information processing cartridge further comprises a service controller in the enclosure configured to provide system management functions for the information processing cartridge, wherein the service controller being connected to at least one management signal connection accessible externally to the processors, wherein the service controller is operable to configure the processors as separate domains or as a single domain depending upon commands received remotely via the management signal connection, and wherein the service controller is operable to provide a signal indicative of at least physical dimensions of the information processing cartridge to a management system remote from the information processing cartridge.

33. An information processing module configured as a field replaceable unit removably receivable in a carrier of a modular computer system, the information processing module comprising:
    a plurality of processors operable to perform information processing in the module, the processors being configurable as a processor cluster within the module, wherein the processors being provided with an inter-processor interconnect, wherein each processor is configurable to operate as an independent domain, and wherein the inter-processor interconnect is operable to directly interconnect the processors; and
    a service controller configured to provide system management functions for the information processing module, wherein the service controller is configured to provide a signal indicative of at least physical dimensions of the information processing module to a management system remote from the information processing module.

34. The information processing module of claim 33, wherein each processor is configured to perform the same tasks as the other processor and to monitor an operation of the other processor via the inter-processor interconnect, wherein in response to a first processor detecting a fault in the second processor the first processor is configured to continue the operations and to report the fault.

35. A server blade comprising:
    a processor subsystem including a plurality of processor sockets, the server blade being operable to perform information processing when at least one processor is received in a said socket; and
    a service controller operable to determine a number processors inserted in a respective processing socket and operable to configure the server blade according to the number of inserted processors, wherein the service controller is further configured to provide system management functions for the server blade, wherein the service controller is configured to provide a signal indicative of at least physical dimensions of the server blade to a management system remote from the server blade.

36. The server blade as claimed in claim 35, wherein the service controller is coupled to at least one management signal connection accessible externally to the processors, and wherein the service controller is operable to configure the processors as separate domains or as a single domain depending upon commands received remotely via the management signal connection.

* * * * *